US009947467B2

(12) United States Patent
Goodson

(10) Patent No.: US 9,947,467 B2
(45) Date of Patent: *Apr. 17, 2018

(54) PROTECTED CAPACITOR SYSTEM AND METHOD

(71) Applicant: MJG INNOVATIONS, LLC, Fort Worth, TX (US)

(72) Inventor: Mark Eugene Goodson, Corinth, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 15/495,811

(22) Filed: Apr. 24, 2017

(65) Prior Publication Data

US 2017/0229241 A1 Aug. 10, 2017

Related U.S. Application Data

(63) Continuation-in-part of application No. 14/789,270, filed on Jul. 1, 2015, now Pat. No. 9,634,474, which
(Continued)

(51) Int. Cl.
*H01G 2/14* (2006.01)
*H02H 9/04* (2006.01)
(Continued)

(52) U.S. Cl.
CPC .............. *H01G 2/14* (2013.01); *H01G 2/06* (2013.01); *H01G 2/10* (2013.01); *H02H 9/005* (2013.01);
(Continued)

(58) Field of Classification Search
CPC ............. H02H 7/05; H02H 7/06; H01G 2/106
(Continued)

(56) References Cited

U.S. PATENT DOCUMENTS 2,864,036 A 12/1958 Steiner
4,106,068 A * 8/1978 Flanagan ............... H01G 2/14
361/15
(Continued)

OTHER PUBLICATIONS

Jameco Electronics, www.Jameco.com; Silicon Power Rectifier, 1N1183-1N1190, 1N3765-1N3768, Jameco Part No. 35924 (1N1188); Colorado Microsemi, www.microsemi.com; Jan. 25, 2001 Rev. IR; 3 pages.
(Continued)

*Primary Examiner* — Rexford Barnie
*Assistant Examiner* — Elim Ortiz

(57) ABSTRACT

A protected capacitor system/method implementing enhanced transient over-voltage suppression is disclosed. The system/method incorporates one or more surge suppression devices (SSDs) proximally located and in parallel with a capacitor structure to produce an overall protected capacitor structure having enhanced reliability and simultaneous ability to resist transient overvoltage conditions. The SSDs are formed from series combinations of transient voltage surge suppressors (TVSs) (metal oxide varistor (MOV), diode for alternating current (DIAC), and/or silicon diode for alternating current (SIDAC)) and corresponding shunt diode rectifiers (SDRs) and placed in parallel across a capacitor structure to locally suppress voltage transients across the capacitor structure in excess of the voltage rating of the capacitor structure. The parallel shunting TVS/SDR pairs may be integrated into a printed circuit board (PCB) assembly that is externally attached to the capacitor structure or encapsulated in an enclosure incorporating the capacitor structure.

20 Claims, 64 Drawing Sheets

Related U.S. Application Data is a continuation of application No. 14/619,619, filed on Feb. 11, 2015, now Pat. No. 9,093,831, which is a continuation-in-part of application No. 14/619,755, filed on Feb. 11, 2015, now Pat. No. 9,093,832, which is a continuation-in-part of application No. 13/455,686, filed on Apr. 25, 2012, now abandoned.

(51) Int. Cl.

| | | |
|---|---|---|
| H05K 1/18 | (2006.01) | |
| H01G 2/10 | (2006.01) | |
| H01G 2/06 | (2006.01) | |
| H05K 3/32 | (2006.01) | |
| H02H 9/00 | (2006.01) | |
| H01L 29/872 | (2006.01) | |
| H02H 3/16 | (2006.01) | |

(52) U.S. Cl.
CPC ............ *H02H 9/04* (2013.01); *H02H 9/041* (2013.01); *H02H 9/044* (2013.01); *H05K 1/181* (2013.01); *H05K 3/32* (2013.01); *H01L 29/872* (2013.01); *H02H 3/165* (2013.01); *H02H 9/043* (2013.01); *H05K 2201/10015* (2013.01); *H05K 2201/10174* (2013.01); *H05K 2201/10196* (2013.01)

(58) Field of Classification Search
USPC .......................................................... 361/272
See application file for complete search history.

(56) References Cited

U.S. PATENT DOCUMENTS

| | | | |
|---|---|---|---|
| 4,577,257 A * | 3/1986 | Erhardt .................... | H01G 2/14 361/272 |
| 4,698,725 A * | 10/1987 | MacDougall ............ | H01G 2/14 361/272 |
| 4,751,603 A | 6/1988 | Kwan | |
| 4,788,624 A * | 11/1988 | Strange .................... | H01G 2/14 361/272 |
| 5,329,065 A | 7/1994 | Marney et al. | |
| 5,418,332 A | 5/1995 | Moncrieff | |
| 6,292,337 B1 | 9/2001 | Legatti et al. | |
| 6,819,545 B1 * | 11/2004 | Lobo ........................ | H01G 9/12 361/15 |
| 7,307,211 B1 | 12/2007 | Caccia | |
| 7,417,841 B2 | 8/2008 | Hotchkiss et al. | |
| 7,518,063 B2 | 4/2009 | Zhang et al. | |
| 7,808,364 B2 | 10/2010 | Chou et al. | |
| 8,390,977 B2 | 3/2013 | Fife | |
| 8,658,900 B2 | 2/2014 | Picard et al. | |
| 2002/0098132 A1 | 7/2002 | Vidalin | |
| 2002/0114118 A1 | 8/2002 | Lowenstein | |
| 2003/0151874 A1 | 8/2003 | Shipp | |
| 2006/0062029 A1 | 3/2006 | Arnold | |
| 2006/0170428 A1 | 8/2006 | Richter et al. | |
| 2008/0047735 A1 | 2/2008 | Sexton et al. | |
| 2011/0134584 A1 * | 6/2011 | Stockman ................ | H01G 5/38 361/328 |
| 2013/0284490 A1 | 10/2013 | Goodson | |
| 2015/0022932 A1 | 1/2015 | Hasenoehri et al. | |

OTHER PUBLICATIONS

Jim Lepkowski, ON Semiconductor, An Introduction to Transient Voltage Suppression Devices; Semiconductor Components Industries, LLC, 2005; Jul. 2005—Rev. 0; Publication Order No. AND8229/D; 8 pages.

Thinking Electronic Industrial Co., Ltd., www.thinking.com.tw; Metal Oxide Varistor; Sep. 2007; 4 pages.

J. D. Hamden Jr. and F. D. Martzloff, Corporate Research and Development, General Electric Co. and W. G. Morris and F. B. Golden, Semiconductor Products Department, General Electric Co.; Metal-oxide varistor: a new way to suppress transients; reprint from "Electronics", Oct. 9, 1972 (distributed by GE); 6 pages.

Semiconductor Components Industries, LLC, 2008, ON Semiconductor, Transient Overvoltage Protection; Apr. 2008—Rev. 0; Publication Order No. TND335/D; 41 pages.

Vishay Bccomponents; Varistors Introduction; www.vishay.com; Revision: Sep. 4, 2013; document No. 29079; 12 pages.

Token; www.token.com.tw; Power Resistors, Aluminum Housed Power Resistor—AH Series; 6 pages.

* cited by examiner

*Prior Art*

*Prior Art*

*Prior Art*

*FIG. 6*
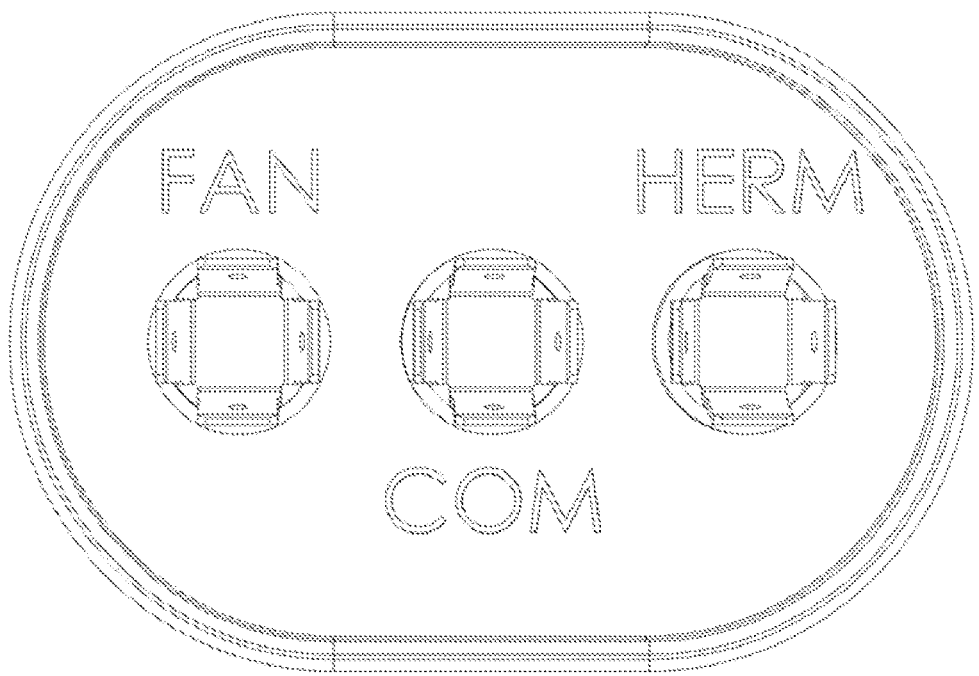
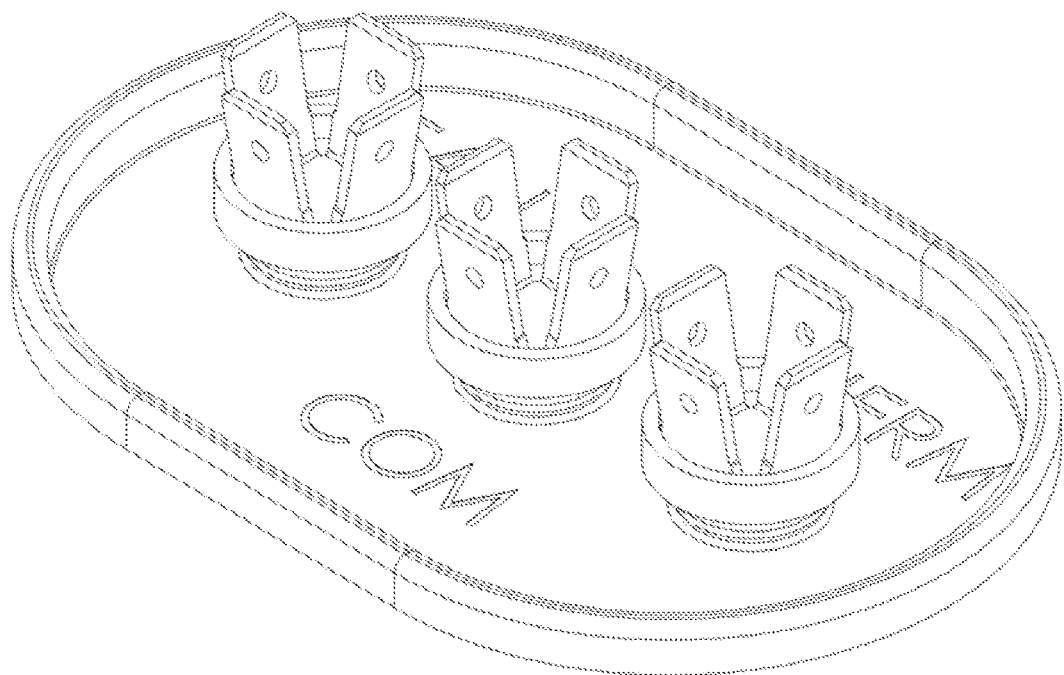
*Prior Art*

*Prior Art*

*Prior Art*

*Prior Art*

*Prior Art*

*Prior Art*

FIG. 12
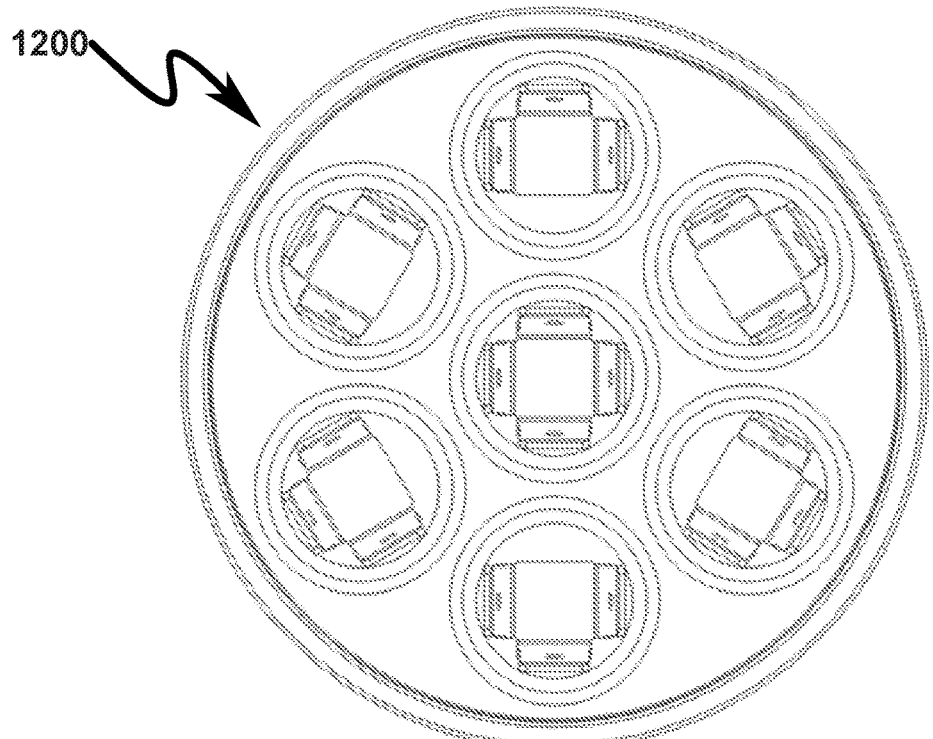
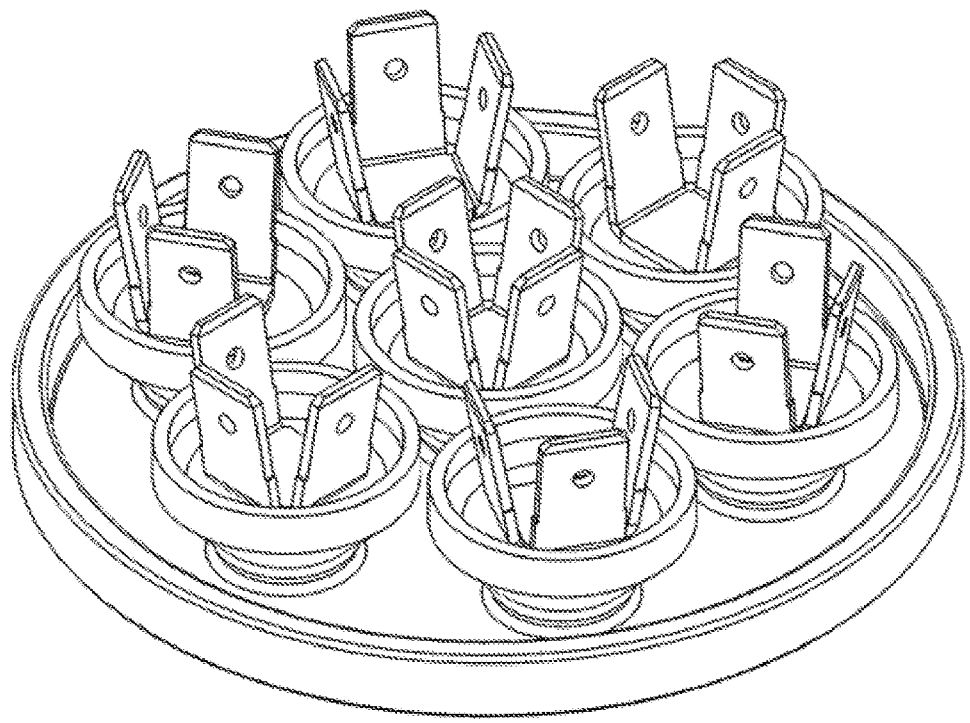
*Prior Art*

FIG. 39
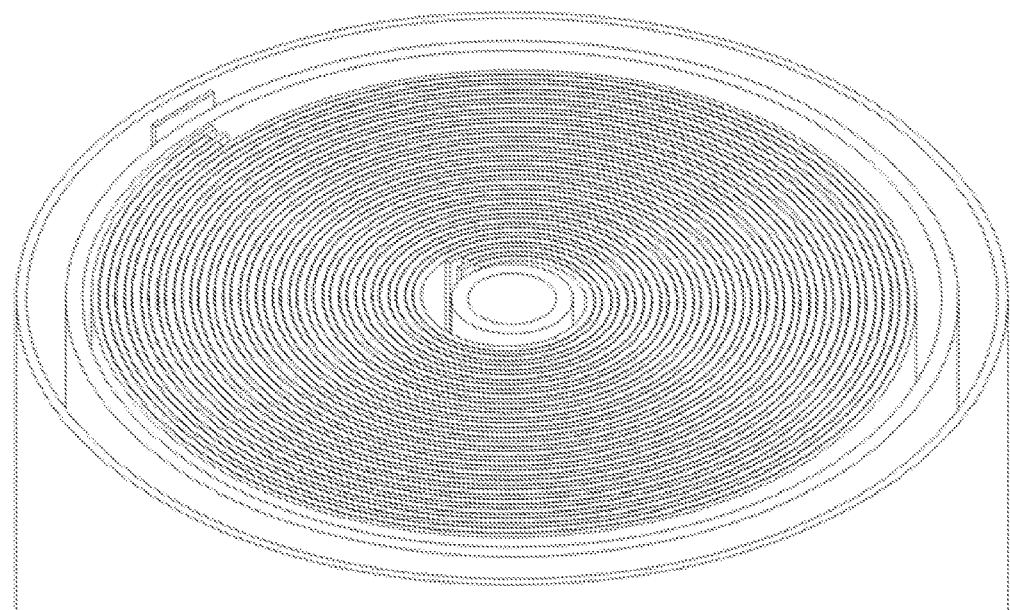

5100

FIG. 53
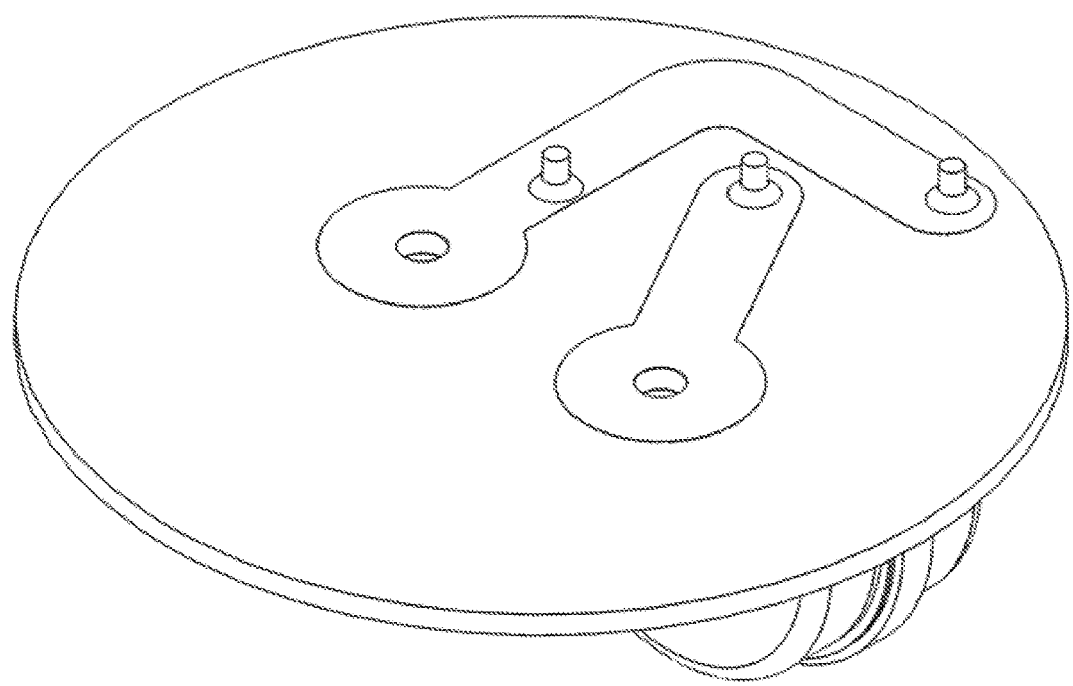

FIG. 57
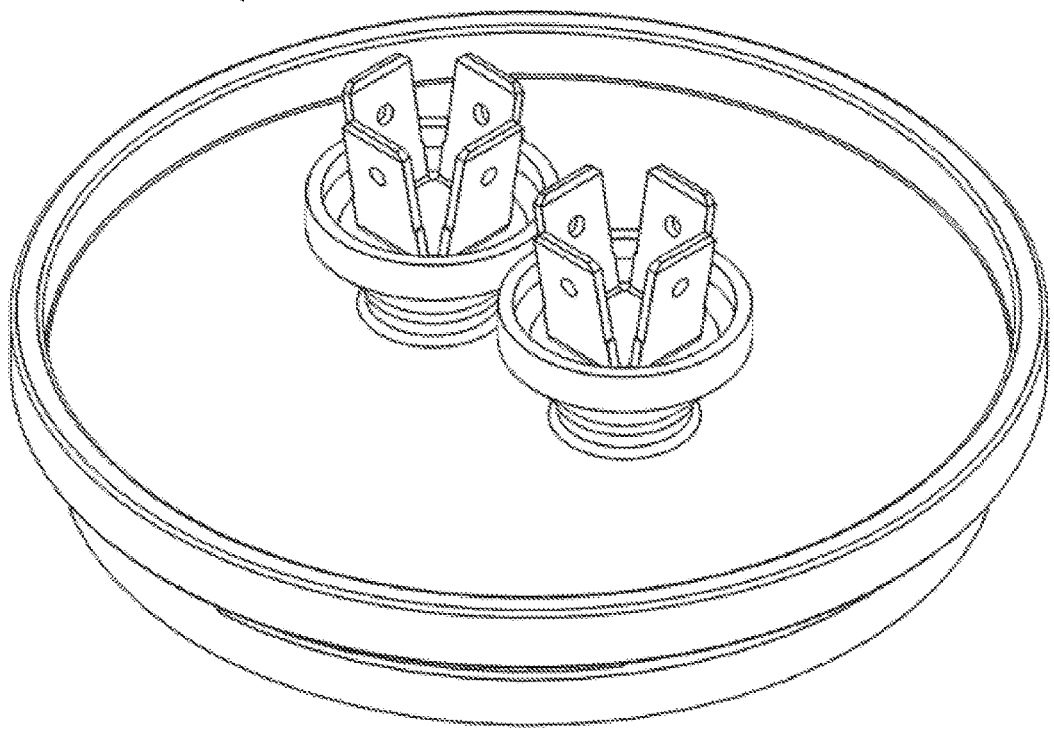
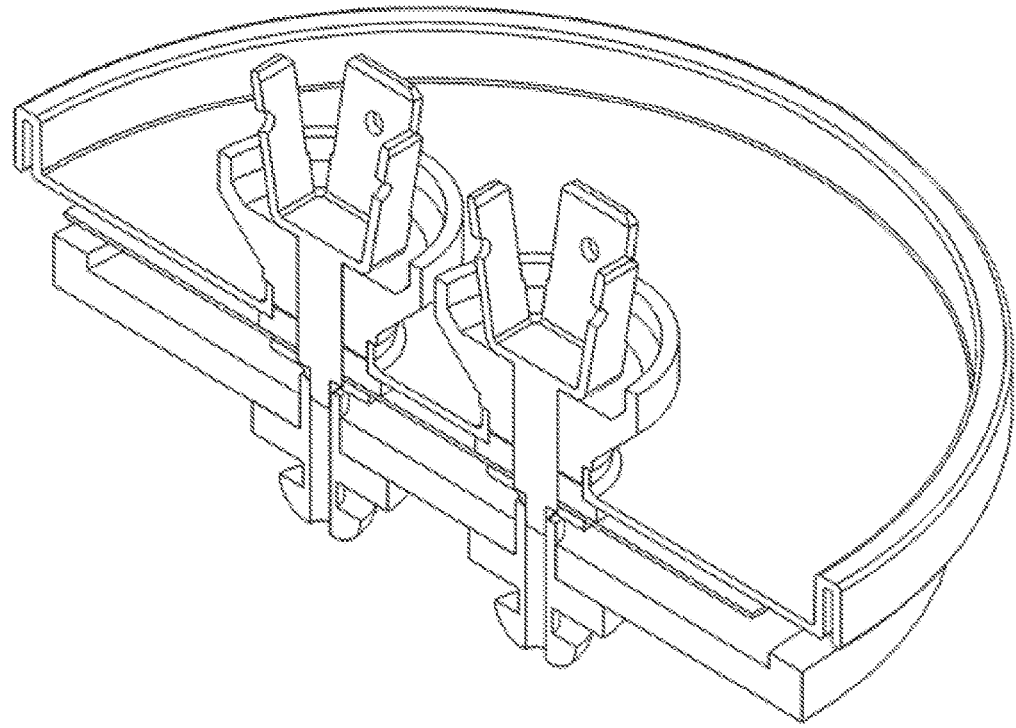

FIG. 58
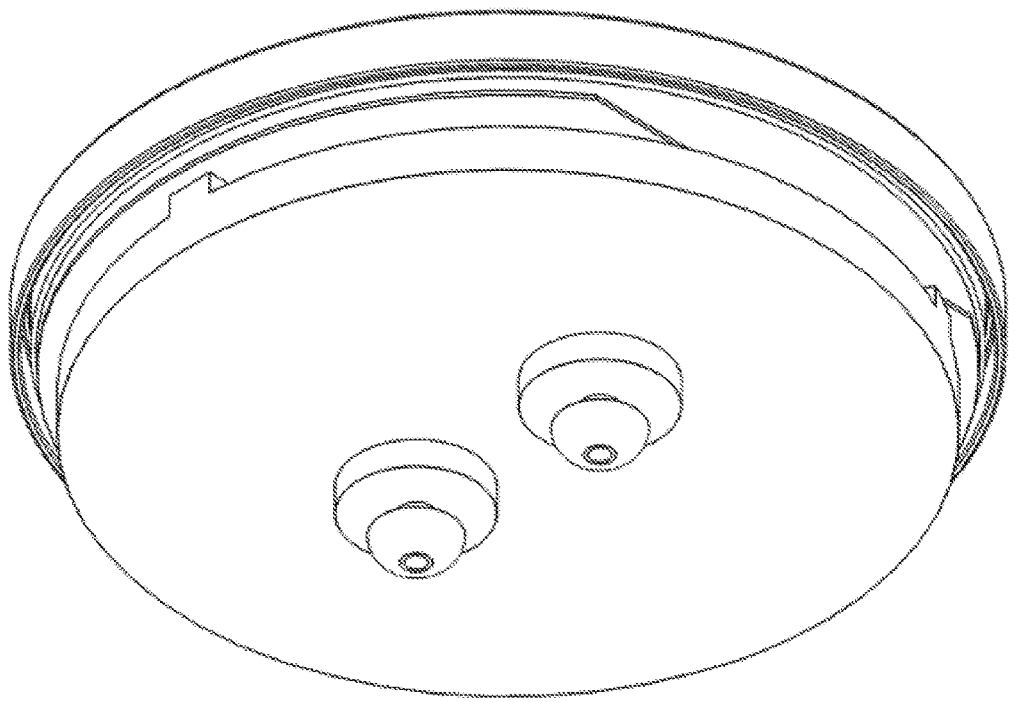
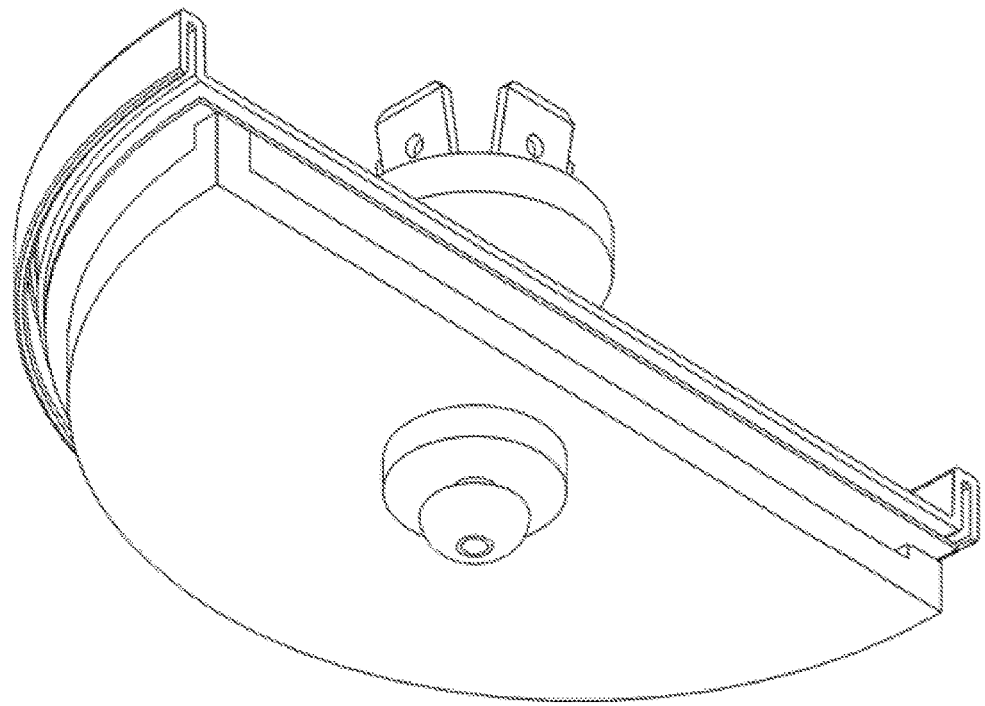

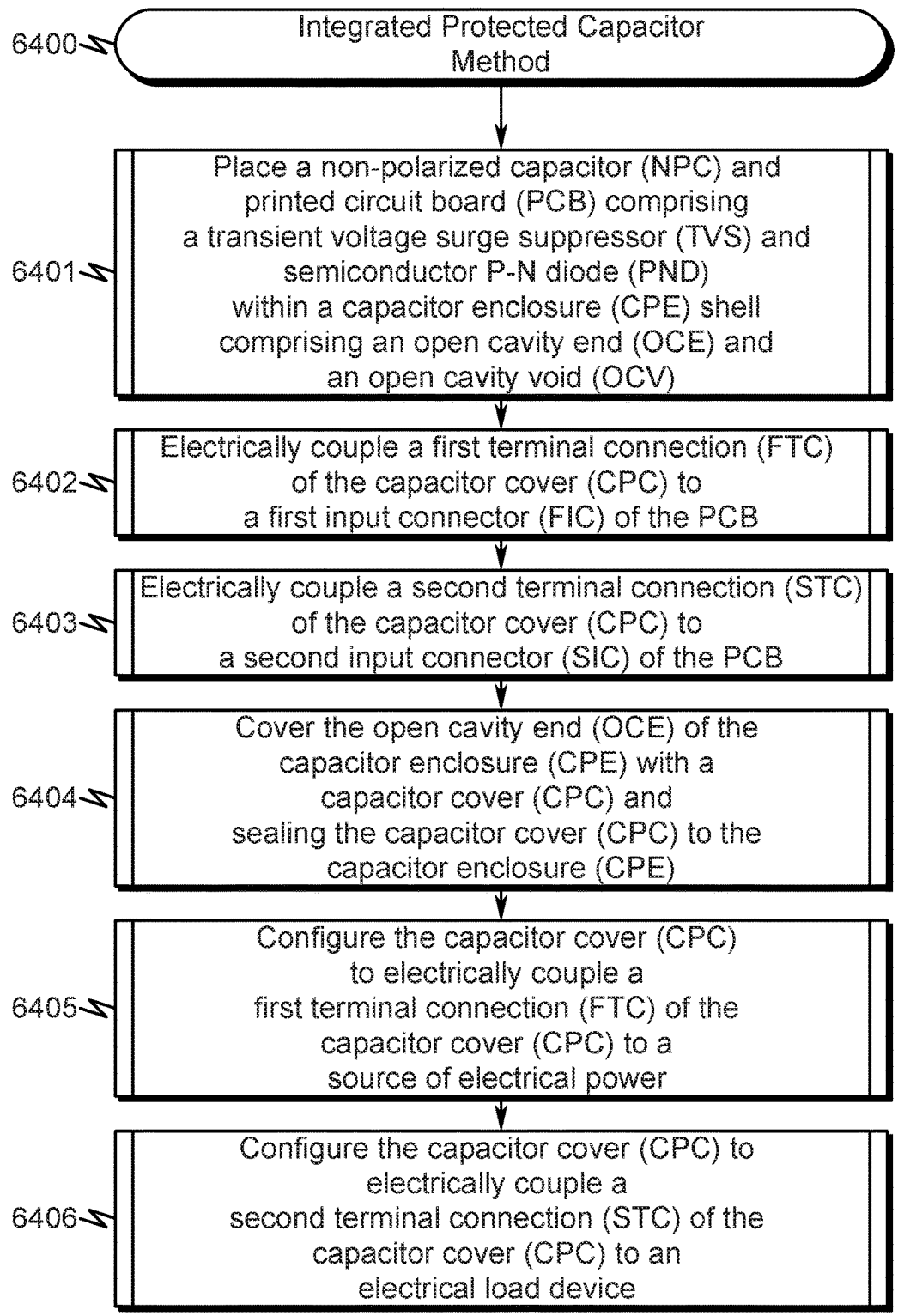

PROTECTED CAPACITOR SYSTEM AND METHOD

CROSS REFERENCE TO RELATED APPLICATIONS

Parent Application

This is a Continuation-in-part Patent Application (CIP) of U.S. Utility patent application for ELECTRICAL WIRING SYSTEM AND METHOD by inventor Mark E, Goodson, filed electronically with the USPTO on Jul. 1, 2015, with Ser. No. 14/789,270, EFS ID 22802725, confirmation number 7696, issued as U.S. Pat. No. 9,634,474 on Apr. 25, 2017.

U.S. Utility Patent Applications

This application claims benefit under 35 U.S.C. § 120 and incorporates by reference U.S. Utility Patent Application for ELECTRICAL WIRING SYSTEM AND METHOD by inventor Mark E. Goodson, filed electronically with the USPTO on Jul. 1, 2015, with Ser. No. 14/789,270, EFS ID 22802725, confirmation number 7696, issued as U.S. Pat. No. 9,634,474 on Apr. 25, 2017.

U.S. Utility patent application for ELECTRICAL WIRING SYSTEM AND METHOD by inventor Mark E. Goodson, filed electronically with the USPTO on Jul. 1, 2015, with Ser. No. 14/789,270, EFS ID 22802725, confirmation number 7696, issued as U.S. Pat. No. 9,634,474 on Apr. 25, 2017 claims benefit under 35 U.S.C. § 120 and incorporates by reference U.S. Utility patent application for ELECTRICAL WIRING SYSTEM AND METHOD by inventor Mark E. Goodson, filed electronically with the USPTO on Feb. 11, 2015, with Ser. No. 14/619,619, EFS ID 21468808, confirmation number 6788, issued as U.S. Pat. No. 9,093,831 on Jul. 28, 2015.

U.S. Utility patent application for ELECTRICAL WIRING SYSTEM AND METHOD by inventor Mark E. Goodson, filed electronically with the USPTO on Feb. 11, 2015, with Ser. No. 14/619,619, EFS ID 21468808, confirmation number 6788, issued as U.S. Pat. No. 9,093,831 on Jul. 28, 2015 claims benefit under 35 U.S.C. § 120 and incorporates by reference U.S. Utility Patent Application for ELECTRICAL WIRING SYSTEM AND METHOD by inventor Hark E, Goodson, filed electronically with the USPTO on Feb. 11, 2015, with Ser. No. 14/619,755, EFS ID 21470782, confirmation number 1057, issued as U.S. Pat. No. 9,093,832 on Jul. 28, 2015.

U.S. Utility Patent Application for ELECTRICAL WIRING SYSTEM AND METHOD by inventor Mark E. Goodson, filed electronically with the USPTO on Feb. 11, 2015, with Ser. No. 14/619,755, EFS ID 21470782, confirmation number 1057, issued as U.S. Pat. No. 9,093,832 on Jul. 28, 2015 claims benefit under 35 U.S.C. § 120 and incorporates by reference U.S. Utility patent application for ELECTRICAL WIRING SYSTEM by inventor Mark E. Goodson, filed electronically with the USPTO on Apr. 25, 2012, with Ser. No. 13/455,686, EFS ID 12628238, confirmation number 5731, now abandoned.

PARTIAL WAIVER OF COPYRIGHT

All of the material in this patent application is subject to copyright protection under the copyright laws of the United States and of other countries. As of the first effective filing elate of the present application, this material is protected as unpublished material.

However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

STATEMENT REGARDING FEDERALLY SPONSORED RESEARCH OR DEVELOPMENT

Not Applicable

REFERENCE TO A MICROFICHE APPENDIX

Not Applicable

FIELD OF THE INVENTION

The present invention relates generally to providing a transient voltage surge suppressor protection mechanism for RUN and/or START capacitors that are used with AC motors in order to improve the overall performance and reliability of these capacitors and prevent AC motor damage caused by failure of these capacitors in the field.

PRIOR ART AND BACKGROUND OF THE INVENTION

Overview (0100)

As generally depicted in FIG. 1 (0100), modern AC motors (0110) that are used in a variety of applications (including but not limited to HVAC air conditioning/heat pump compressors) are supplied AC power (0101) that is typically controlled by a switch or power contactor (0102). As power is applied to the electric motor (0110), the motor rotor (0111) is driven directly by a MAIN winding (0112) but also a START/AUX winding (0113). Under normal operating conditions a RUM capacitor (0119) supplies current to the START/AUX winding (0113) to enable the motor rotor (0111) to rotate at its rated rotational speed,

START Capacitor Configuration (0200)

As generally depicted in FIG. 2 (0200), another common motor configuration is encountered wherein the START/AUX winding (0213) may be activated by an optional startup circuit (0214) comprising a centrifugal switch (0215) that is mechanically tied to the motor rotor (0211) that switches in a START capacitor (0216) to supply current, to the START/AUX winding (0213) until the motor rotor (0211) rotational speed reaches a set value and then the START capacitor (0216) is disconnected from the circuit by the centrifugal switch (0215). The optional startup circuit (0214) comprising the centrifugal switch (0215) and START capacitor (0216) may be omitted as depicted in FIG. 1 (0100) depending on the electric motor (0210) application context.

Run Capacitor Configurations (0300)-(1000)

The RUN capacitor used as described in FIG. 1 (0100) and FIG. 2 (0200) may take a variety of physical forms, capacitance values, and working voltages. As generally depicted in FIG. 3 (0300)-FIG. 4 (0400), a common configuration is illustrated in which the capacitor enclosure forms a stadium oval. As the stadium width of this configuration is reduced the structure becomes circular in form. In some configurations this physical form may incorporate multiple capacitors as depicted in FIG. 5 (0500)-FIG. 6 (0600) wherein multiple capacitors may be encased in the same enclosure with a common (COM) electrical connection, wherein a stadium-form enclosure supports two capacitors internally connected to support a dual capacitance structure having COMMON (C), FAN (F), and HERMETICALLY SEALED COMPRESSOR (HERM) connections. In this common multi-capacitance configuration example the FAN (F) and HERMETICALLY SEALED COMPRESSOR (HERM) connections support separate electric motors in a RVAC air conditioning/heat pump system that are used respectively with the HVAC condenser fan motor and the HVAC compressor motor.

FIG. 7 (0700)-FIG. 8 (0800) depicts another commonly occurring enclosure in the form of a cylinder. While this configuration comprise a single two-terminal capacitor structure, multiple terminals may be utilized to incorporate additional capacitors as depicted in FIG. 9 (0000)-FIG. 10 (1000). In some cases multiple capacitors may be encased in the same enclosure with a common (COM) electrical connection, as depicted in FIG. 9 (0900)-FIG. 10 (1000) wherein a cylindrical-form enclosure supports two capacitors internally connected to support a dual capacitance structure having COMMON (C), FAN (F), and HERMETICALLY SEALED COMPRESSOR (HERM) connections. In this common multi-capacitance configuration example the FAN (F) and HERMETICALLY SEALED COMPRESSOR (HERM) connections support separate electric motors in a HVAC air conditioning/heat, pump system that are used respectively with the HVAC condenser fan motor and the HVAC compressor motor.

An extension of the configurations depicted FIG. 5 (0500)-FIG. 6 (0600) and FIG. 9 (0900)-FIG. 10 (1000) exists in which some capacitor configurations have more than two internal capacitor connections as generally depicted in FIG. 11 (1100)-FIG. 12 (1200). In some of these configurations the internal capacitor connections are utilized to enable a single capacitor physical form to be field-configured as to the operational capacitance value by selecting two or three taps internally on the capacitor for connection to the electric motor based on the desired capacitance value required by the electric motor. This is multi-cap capacitor structure is described in U.S. Pat. Nos. 3,921,041; 4,028,595; 4,263,638; 4,312,027; 4,352,145; 5,313,360; 6,014,308 7,203,053; 7,423,861; 7,474,519; 7,835,133; 8,891,224 and is typically commercially implemented with capacitor tap values of 2.5, 5, 5, 10, 20, and 25 microfarads. One skilled in the art will be able to apply the teachings of the present invention to any of the physical capacitor structures depicted in FIG. 3 (0300)-FIG. 12 (1200).

Typical Functional Parameters

RUN capacitors may take a variety of physical forms, but are generally have a cylindrical diameter of from 1.5-3.0 inches and a cylinder length of from 2.0-6.0 inches for cylindrically formed enclosures and stadium-formed capacitors typically have a thickness from 1.0-3.0 inches, a width of 1.5-4.0 inches, and a length of 2.0-6.0 inches. Typical RUN capacitors have a capacitance in the range of 1 microfarad to 100 microfarads and a working voltage of 270 VAC or 440 VAC. In all of these configurations, the conventional connection mechanism for these capacitors takes the form of a 0.25-inch wide male spade lug, although in some circumstances direct wiring to the capacitor is available.

The electrical connections to these capacitors are insulated from the capacitor enclosure which is normally constructed of 0.062-inch or thinner metal (typically aluminum or steel). Electrical insulators in this common configuration are sealed to the top cap of the metal enclosure as the enclosure itself is filled with dielectric oil that insulates the internal capacitor plates, isolates these conductors from the metal capacitor enclosure, and provides for heat transfer from the internal capacitor components to the metal capacitor enclosure as an aid in dissipating internal capacitor losses that are manifested as heat within the internal capacitor structure.

Failure Mechanisms

The focus of the present invention is protection of the RUN capacitor (0119, 0219). This capacitor sources current continuously to the START/AUX winding (0113, 0213) and as such is subject to a variety of transient voltage spikes caused by the quality of the AC power input (0101, 0201) and/or make/break electrical connections caused by mechanical operation of the power switch/contactor (0102, 0202). While the RUN capacitor (0119, 0219) typically has a working voltage of 370-440 VAC in operating environments where the AC power input (0101, 0201) is 240-330 VAC, this overvoltage margin has proven to be insufficient to prevent transient overvoltages from occurring across the RUN capacitor (0119, 0219) which generate partial discharges within the capacitor dielectric and eventually cause the capacitor to lose effective capacitance, incur excessive internal series resistance, and/or fail due to a puncture shorting of the capacitor plates through the insulating dielectric of the capacitor.

Field reliability studies have shown that the RUN capacitor (0119, 0219) has a high probability of failure in any electric motor (0110, 0210) system, and this failure probability is especially high in harsh environment applications that are normally associated with HVAC air conditioner/heat pump compressor motors and the like. The additional parasitic lead inductance (0117, 0118, 0217, 0218) caused by wiring that connects the RUN capacitor (0119, 0219) to the electric motor (0110, 0210) can also cause voltage ringing in the RUN capacitor (0119, 0219) (in conjunction with the parasitic inductors (0117, 0217) and (0118, 0218) associated with wiring of the RUN capacitor (0119, 0219) to the remaining components in the electric motor system) that can induce overvoltages in the RUN capacitor (0119, 0219) leading to device failure. The environmental temperature extremes in which the RUN capacitor (0119) operates and external system mechanical vibration can cause internal mechanical movement in the capacitor also causing overvoltage transients to degrade the capacitor operation. Internal series resistance losses in the RUN capacitor (0119, 0219) can also cause similar temperature-related overvoltage failure mechanisms to occur.

Cost of Failure

In a typical application context the RUN capacitor is purchased from a number of manufacturers and it is difficult to predict the mean time between failure (MTBF) for a given capacitor purchased and installed on an electric motor system. However, field studies have indicated that in general the quality of RUN capacitors has deteriorated in recent years due in part to quality control issues with foreign manufacturing plants. As a result the incidents of RUN capacitor replacement have increased over time as domestic manufacturers have become a smaller part of the capacitor supplier market. For this reason the overall maintenance cost of many electric motor systems has increased over time due to the increased number of service calls due to capacitor failure. This increased capacitor failure rate has also resulted in increased electric motor damage and a resulting higher overall maintenance cost for electric motor systems employing RUN and/or START capacitors.

Since the sources for RUN capacitors are limited, any solution to overcoming the MTBF problem with current RUN capacitors must address scenarios in which existing RUN capacitors with poor reliability/manufacturing processes can be protected from premature failure in the field.

Objectives of the Invention

Accordingly, the objectives of the present invention are (among others) to circumvent the deficiencies in the prior art and affect the following objectives:
  (1) Provide for a protected capacitor system and method that reduces voltage transients across RUN and/or START capacitors used in conjunction with an AC motor,
  (2) Provide for a protected capacitor system and method that can be retrofit to existing RUN and/or START capacitors used in corn unction with an AC motor.
  (3) Provide for a protected capacitor system and method, that can be integrated within RUN and/or START capacitors used in conjunction with an AC motor.
  (4) Provide for a protected capacitor system and method that provides for improved reliability over existing RUN and/or START capacitors used in conjunction with an AC motor.

While these objectives should not be understood to limit the teachings of the present invention, in general these objectives are achieved in part or in whole by the disclosed invention that is discussed in the following sections. One skilled in the art will no doubt be able to select aspects of the present invention as disclosed to affect any combination of the objectives described above.

BRIEF SUMMARY OF THE INVENTION

System Overview

The present invention overcomes the disadvantages of currently available RUN/START capacitor systems by shunting the capacitor with a series combination of one or more surge suppression devices (SSDs) proximally located and in parallel with the capacitor structure to produce an overall protected capacitor structure having enhanced reliability and simultaneous ability to resist transient overvoltage conditions.

The SSDs are formed from series combinations of transient voltage surge suppressors (TVSs) (metal oxide varistor (MOV), diode for alternating current (DIAC), and/or silicon diode for alternating current (SIDAC)) and corresponding shunt diode rectifiers (SDRs) and placed in parallel across the capacitor structure to locally suppress voltage transients across the capacitor structure in excess of the voltage rating of the capacitor structure.

The parallel shunting TVS/SDR pairs may be integrated into a printed circuit board (PCB) assembly that is externally attached to the capacitor structure or encapsulated in an enclosure incorporating the capacitor structure. The parallel shunting TVS/SDR pairs may be integrated into unified structures in some situations to improve space efficiency and economic performance of the overall transient protection system.

Method Overview

The present invention system may be utilized in the context of an overall protected capacitor method, wherein the TVS/SDR pair is incorporated within the context of a printed circuit board (PCB) that mechanically connects to the electrical contacts of an existing capacitor structure to provide proximal transient voltage protection for the capacitor. In these situations an existing capacitor may be retrofit to incorporate improved transient protection via the use of a piggy-back PCB that provides for mating to electrical contacts of an existing capacitor structure on one side of the PCB and provides replacement contacts mimicking the original capacitor on the other side of the PCB. In these circumstances wiring from the original capacitor can be removed, the piggy-back PCB installed on the capacitor, and the original wiring connected to the piggy-back PCB to complete the performance reliability upgrade to the existing capacitor.

BRIEF DESCRIPTION OF THE DRAWINGS

For a fuller understanding of the advantages provided by the invention, reference should be made to the following detailed description together with the accompanying drawings wherein:

FIG. 6 illustrates top and top perspective detail views of a prior art stadium-form FAN+COMPRESSOR capacitor;

FIG. 12 illustrates top detail views of a prior art cylindrical-form multi-tap capacitor;

FIG. 39 illustrates a top right front perspective top section view of a preferred exemplary invention system embodiment implemented as an integrated cylindrical-form capacitor structure incorporating integral transient protection;

FIG. 53 illustrates a top right front perspective view of a preferred exemplary invention system embodiment implemented as an integrated protective structure on a printed circuit board (PCB) incorporating an integrated MOV+PN+PN+MOV device;

FIG. 57 illustrates a top right front perspective view and a top right front perspective front section view of a preferred exemplary invention integrated capacitor system embodiment implemented detailing the capacitor cover, terminal posts, insulating spacers, and conductive connectors;

FIG. 58 illustrates a bottom right front perspective view and a bottom right front perspective right section view of a preferred exemplary invention integrated capacitor system embodiment implemented detailing the capacitor cover, terminal posts, insulating spacers, and conductive connectors;

FIG. 64 illustrates a flowchart depicting a preferred exemplary invention method supporting integrating capacitor protection within the enclosure of a capacitor.

DESCRIPTION OF THE PRESENTLY PREFERRED EXEMPLARY EMBODIMENTS

Figure 1:
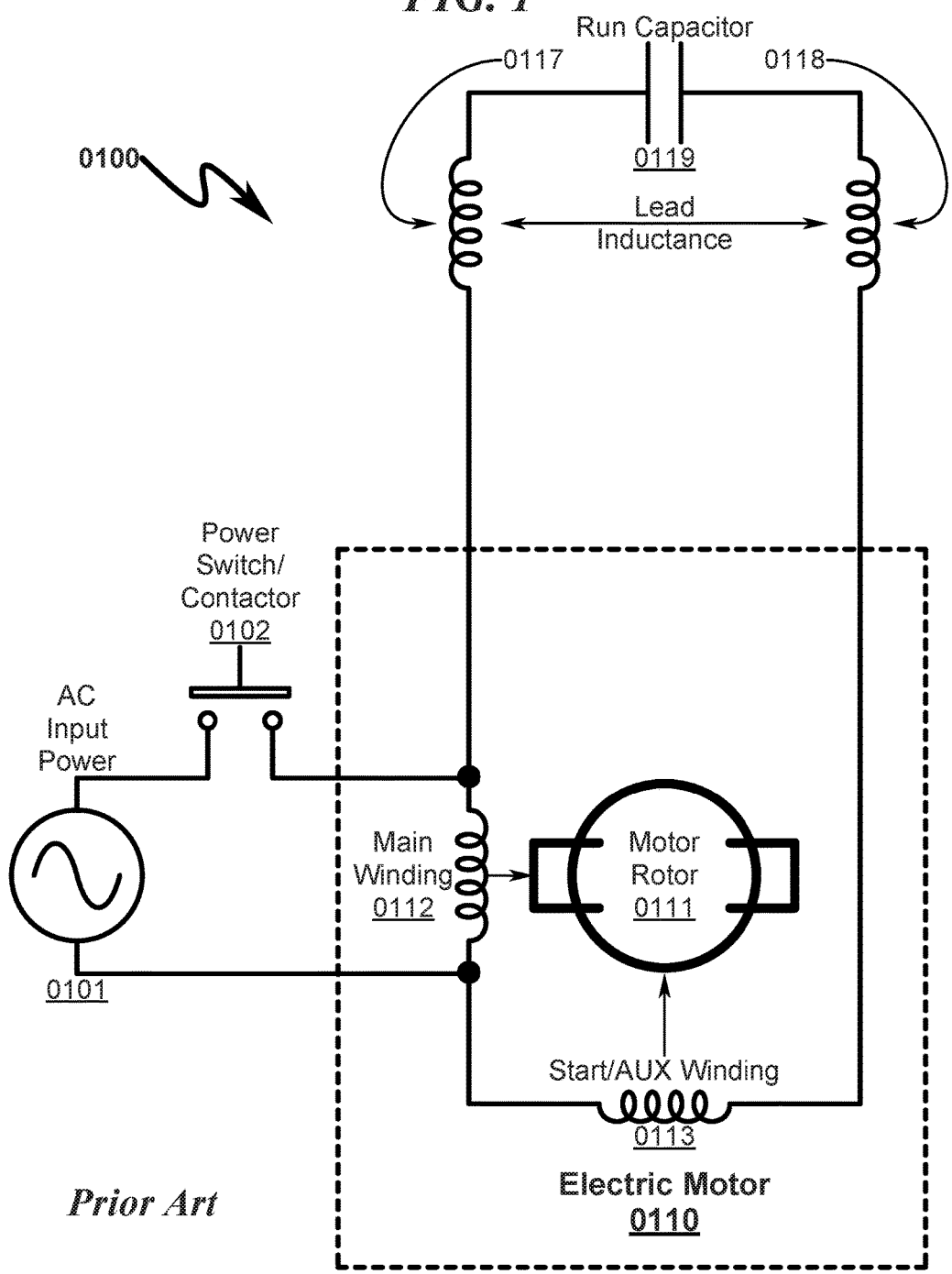
FIG. 1 illustrates a system block diagram of a typical prior art electric motor incorporating a RUN capacitor.
Figure 2:
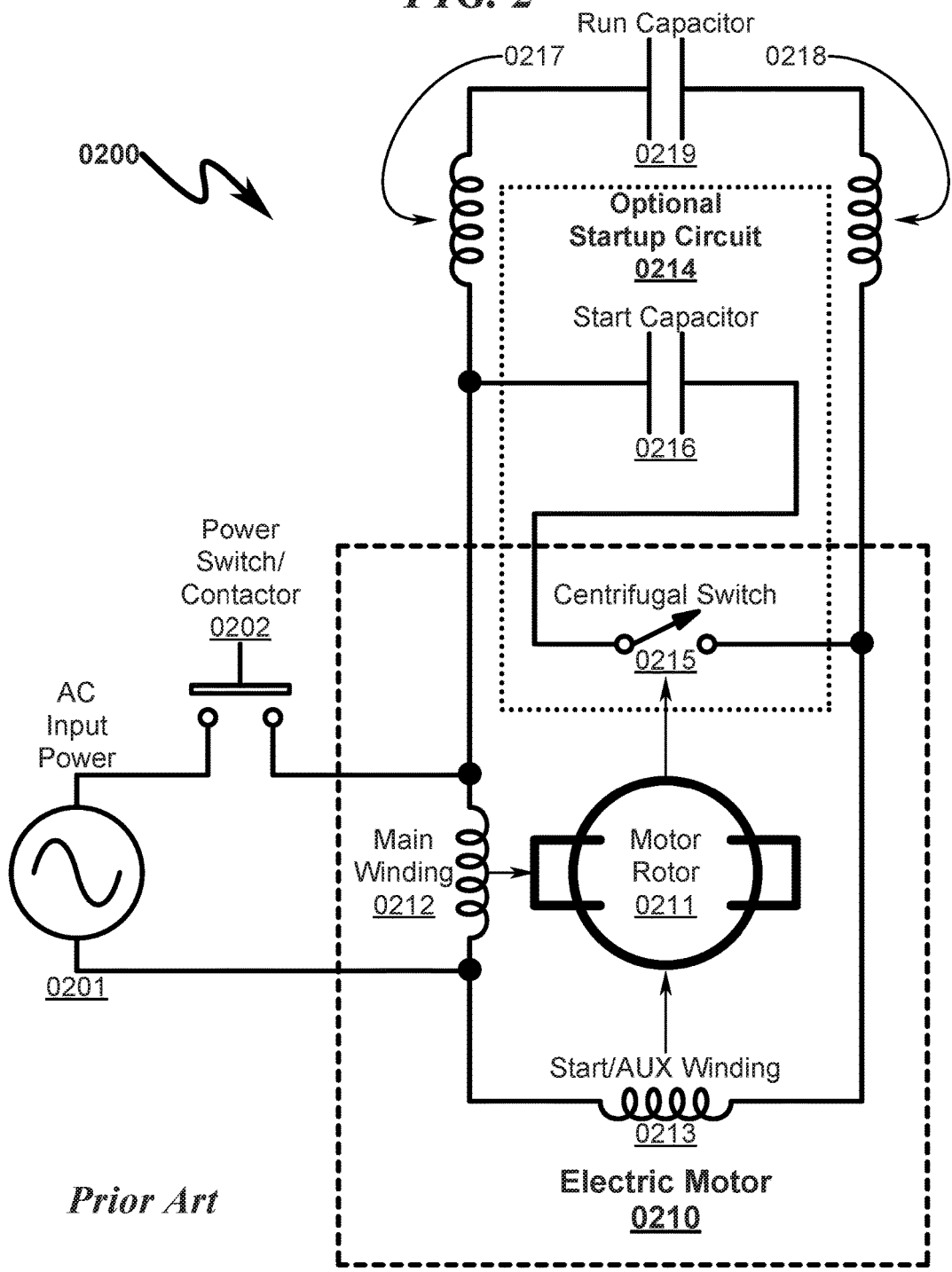
FIG. 2 illustrates a system block diagram of a typical prior art electric motor incorporating a RUN capacitor and a START capacitor.
Figure 3:
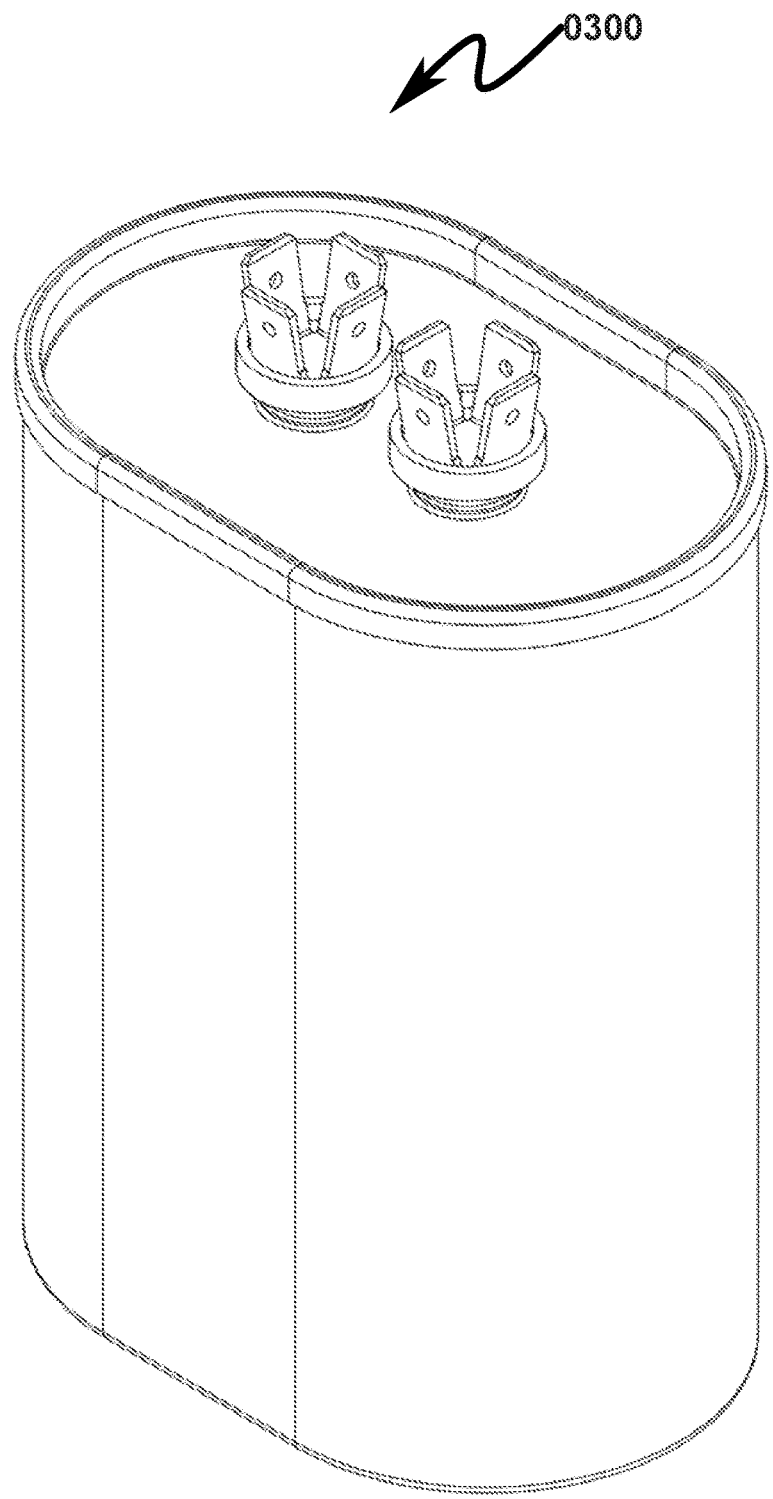
FIG. 3 illustrates a top right front perspective view of a prior art stadium-form RUN capacitor.
Figure 4:
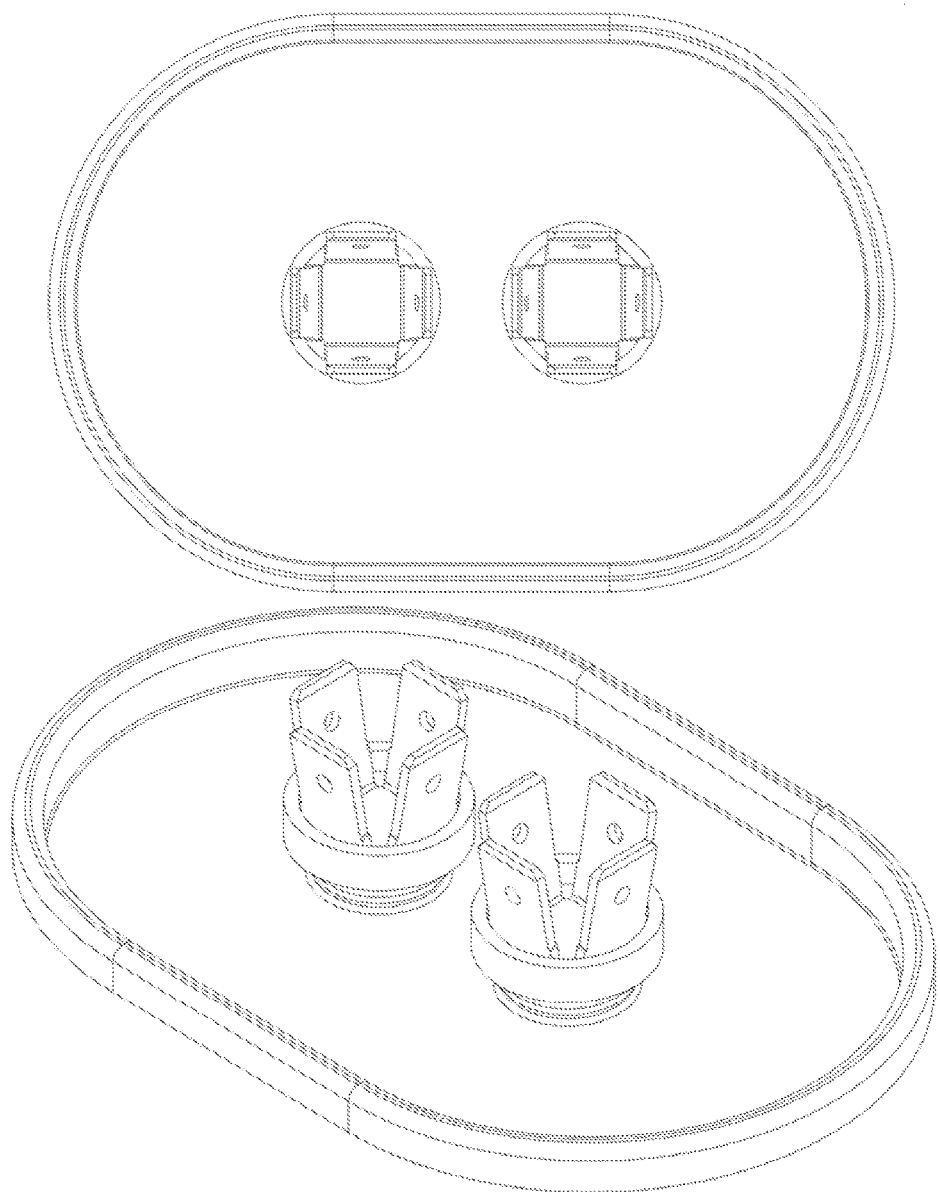
FIG. 4 illustrates top and top perspective detail views of a prior art stadium.-form RUN capacitor.
Figure 5:
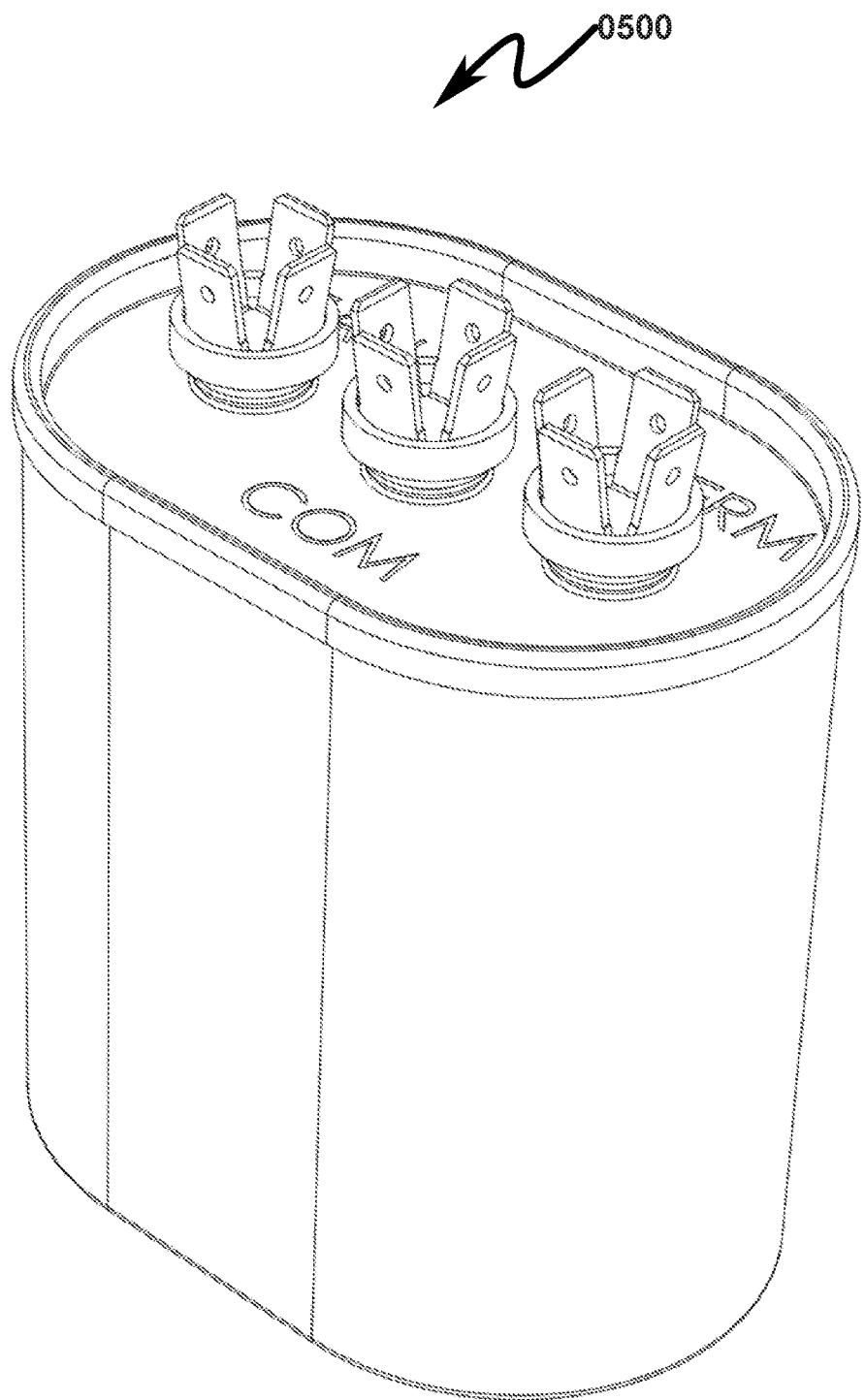
FIG. 5 illustrates a top right front perspective view of a prior art stadium-form FAN+COMPRESSOR capacitor.
Figure 7:
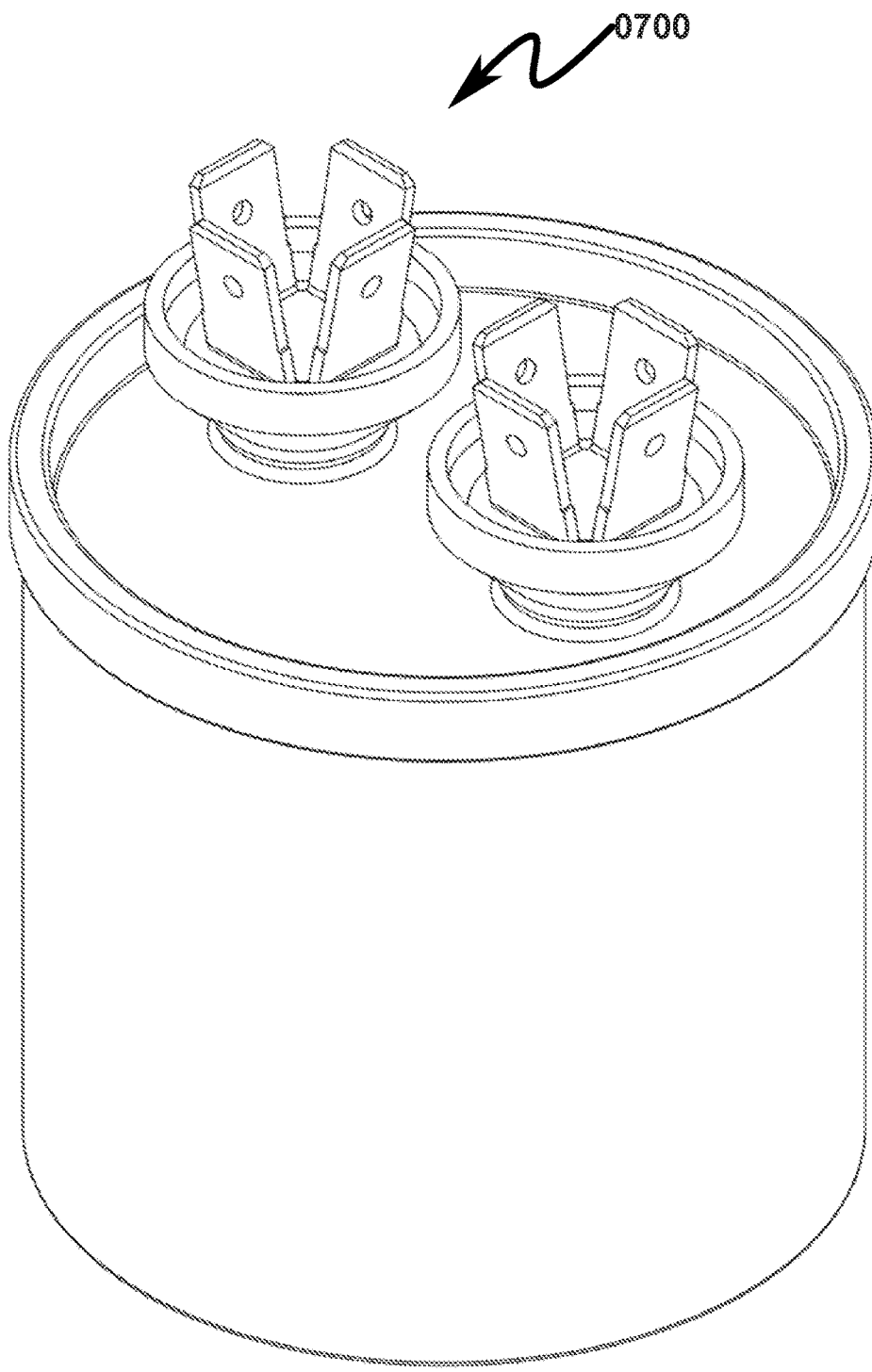
FIG. 7 illustrates a top right front perspective view of a prior art cylindrical-form BUN capacitor.
Figure 8:
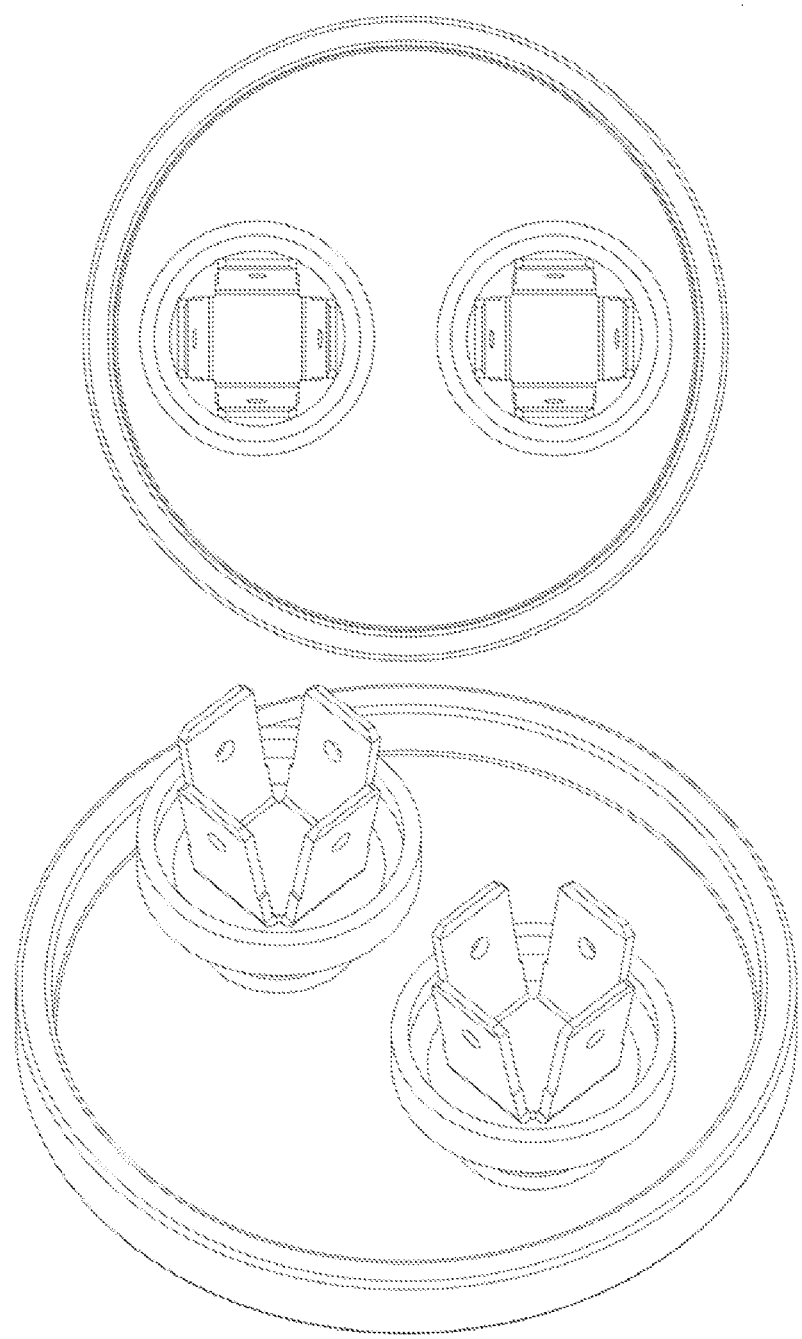
FIG. 8 illustrates top and top perspective detail views of a prior art cylindrical-form RUN capacitor.
Figure 9:
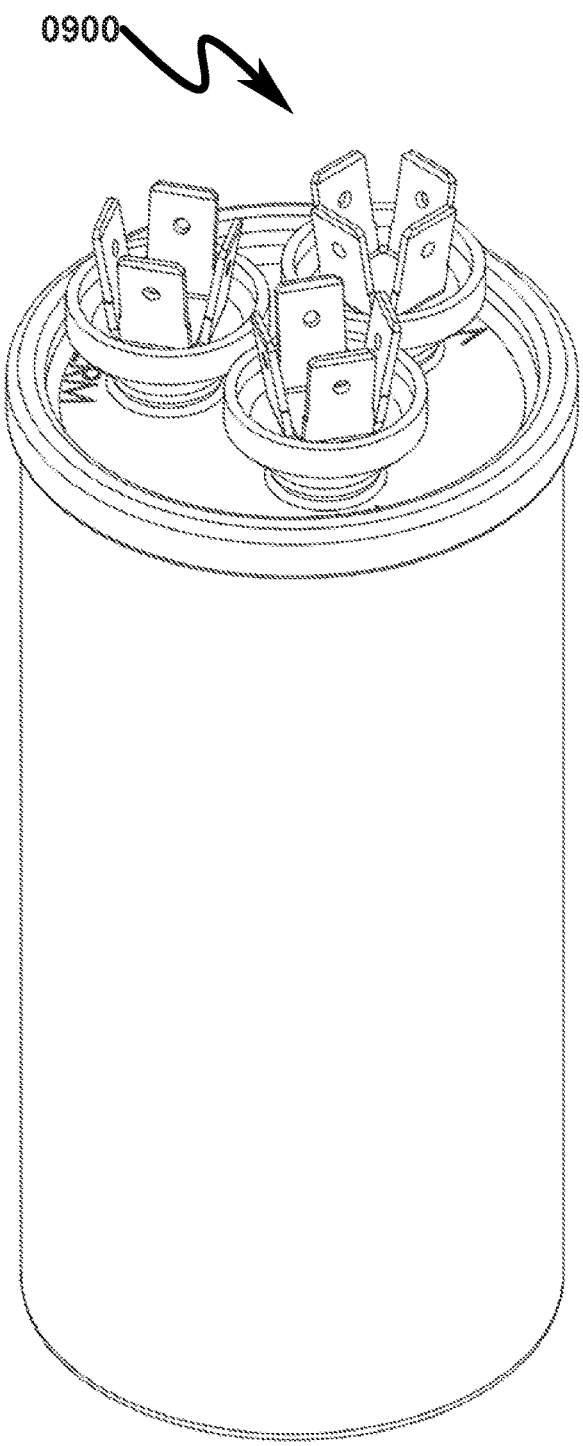
FIG. 9 illustrates a top right front perspective view of a prior art cylindrical-form RUN capacitor showing COM, FAN, and HERMETICALLY SEALED COMPRESSOR connections.
Figure 10:
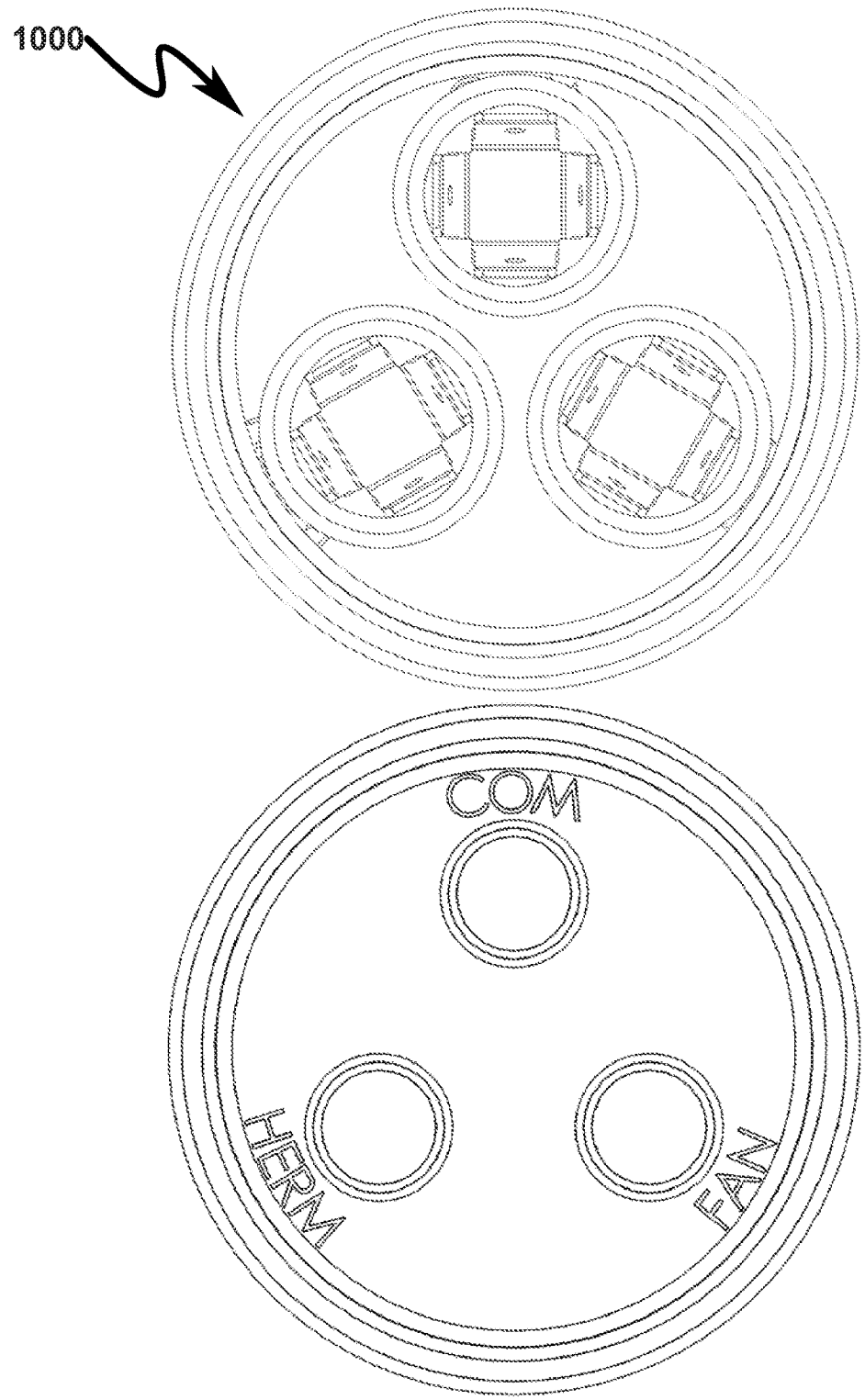
FIG. 10 illustrates top detail views of a prior art. cylindrical-form RUN capacitor showing COM, FAN, and HERMETICALLY SEALED COMPRESSOR connections.
Figure 11:
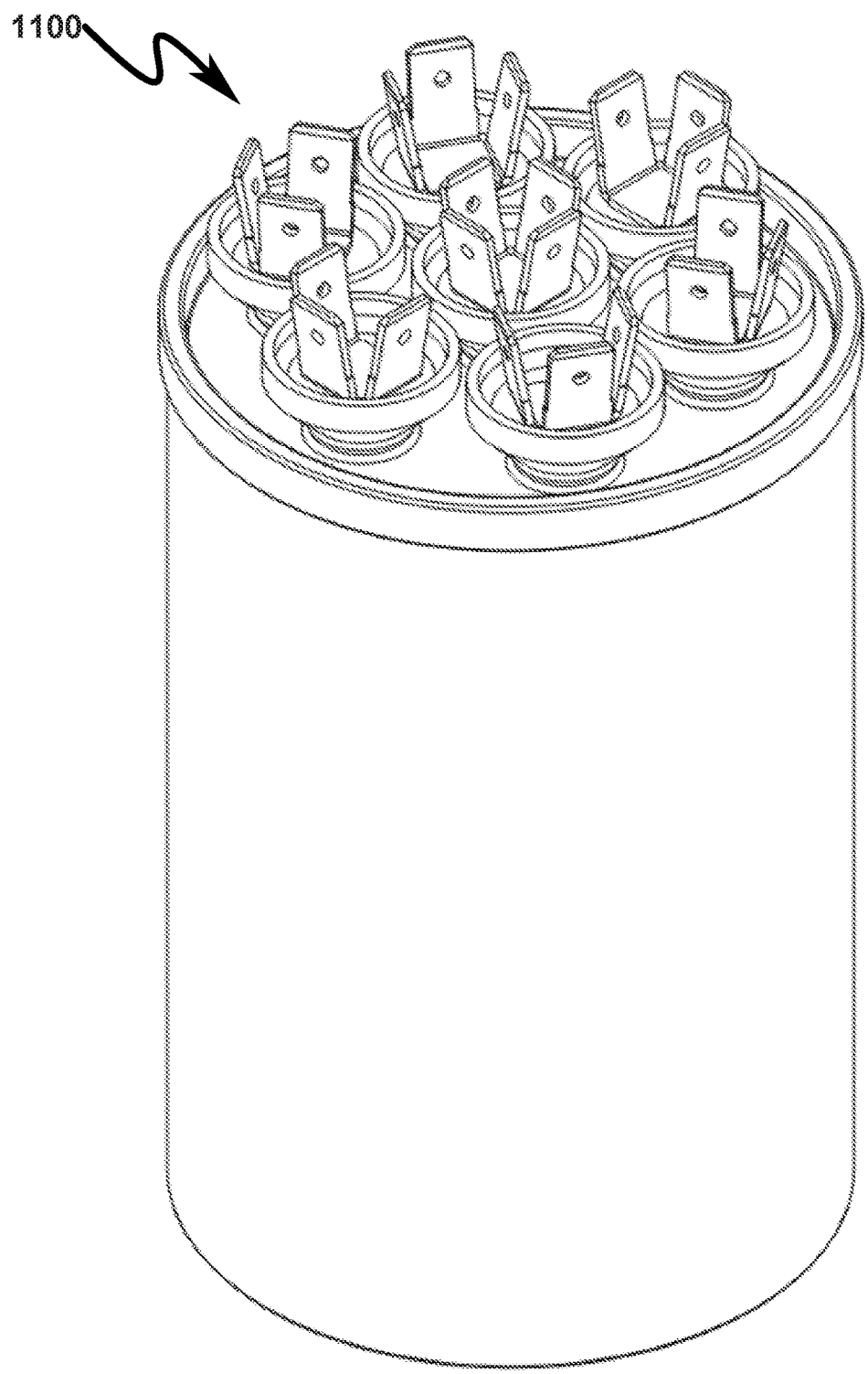
FIG. 11 illustrates a top right front perspective view of a prior art cylindrical-form multi-tap capacitor.

While this invention is susceptible of embodiment in many different forms, there is shown in the drawings and will herein be described in detailed preferred embodiment of the invention with the understanding that the present disclosure is to be considered as an exemplification of the principles of the invention and is not intended to limit the broad aspect of the invention to the embodiment illustrated.

The numerous innovative teachings of the present application will be described with particular reference to the presently preferred embodiment, wherein these innovative teachings are advantageously applied to the particular problems of a PROTECTED CAPACITOR SYSTEM AND METHOD. However, it should be understood that this embodiment is only one example of the many advantageous uses of the innovative teachings herein. In general, statements made in the specification of the present application do not necessarily limit any of the various claimed inventions. Moreover, some statements may apply to some inventive features but not to others.

Capacitor Exterior Surface Types

The present invention a wide variety of exterior surface profiles that may be used with the capacitor structures described herein. Specifically, and without limitation, the present invention anticipates that the exterior surface profiles of the capacitor enclosures described herein may be of cylindrical-form (in which the capacitor enclosure forms a cylindrical tube with one closed end and is used to contain an internal capacitor structure having solid cylindrical form) or of stadium-form, (in which the capacitor enclosure forms a geometric shape constructed of a rectangle with semicircles at a pair of opposite sides and is used to contain an internal capacitor structure having either a solid cylindrical form or a solid stadium form). The geometric stadium form is also alternatively referred to as a discorectangle form and obround form in the literature.

Shunt Diode Rectifier (SDR) Not Limitive

The present invention anticipates a wide variety of shunt diode rectifiers (SDRs) may be used to implement the present invention. In many preferred embodiments, this SDR structure comprises a semiconductor P-N junction diode and/or a Schottky diode rectifier.

TVSS Not Limitive

The present invention anticipates that a wide variety of Transient Voltage Surge Suppressor (TVS) technologies may be used to implement various embodiments of the present invention and makes no limitation on the particular type of TVSS that may be used to construct various invention embodiments.

In many preferred invention embodiments the TVS structure may comprise a metal oxide varistor (MOV), a diode for alternating current (DIAC), a silicon diode for alternating current (SIDAC), and/or combinations of these devices.

System Overview (1300)-(1600)

Exemplary System Application Context (1300)

Figure 13:
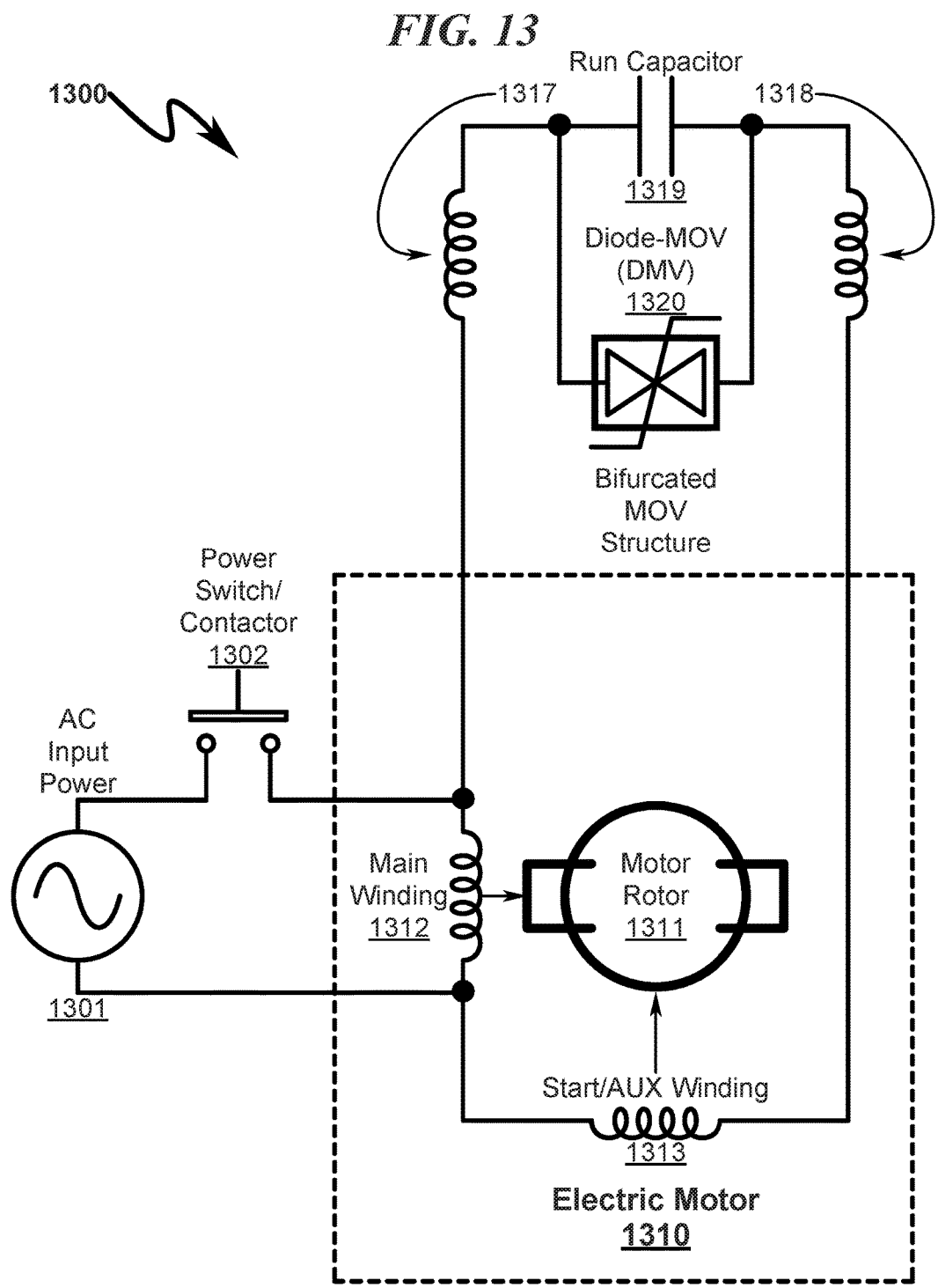
FIG. 13 illustrates a preferred exemplary invention system context in which a RUN capacitor is augmented with a diode-MOV (DMV) structure to produce a protected capacitor system.

The present invention may be best understood by inspection of the system overview depicted in FIG. 13 (1300) wherein the prior art motor electrical system depicted in FIG. 1 (0100) has been augmented with a protected capacitor system comprising HUH capacitor (1319) and a shunt protective diode-MOV (DMV) (1320). The diode-MOV (DMV) (1320) shunts the RUN capacitor (1319) and provides a path for transient overvoltages appearing across the RUN capacitor (1319) to be shunted through the diode-MOV (DMV) (1320). The diode-MOV (DMV) (1320) is located proximally to the terminals of the RUN capacitor (1319) thus minimizing any inductance associated with connective wiring. The minimization of stray inductance allows any resonant behavior associated with the RUN capacitor (1319) to be minimized and permits the diode-MOV (DMV) (1320) to be best positioned to eliminate transient overvoltages that may appear at the terminals of the RUN capacitor (1319).

Exemplary DMV Structures (1400)

Figure 14:
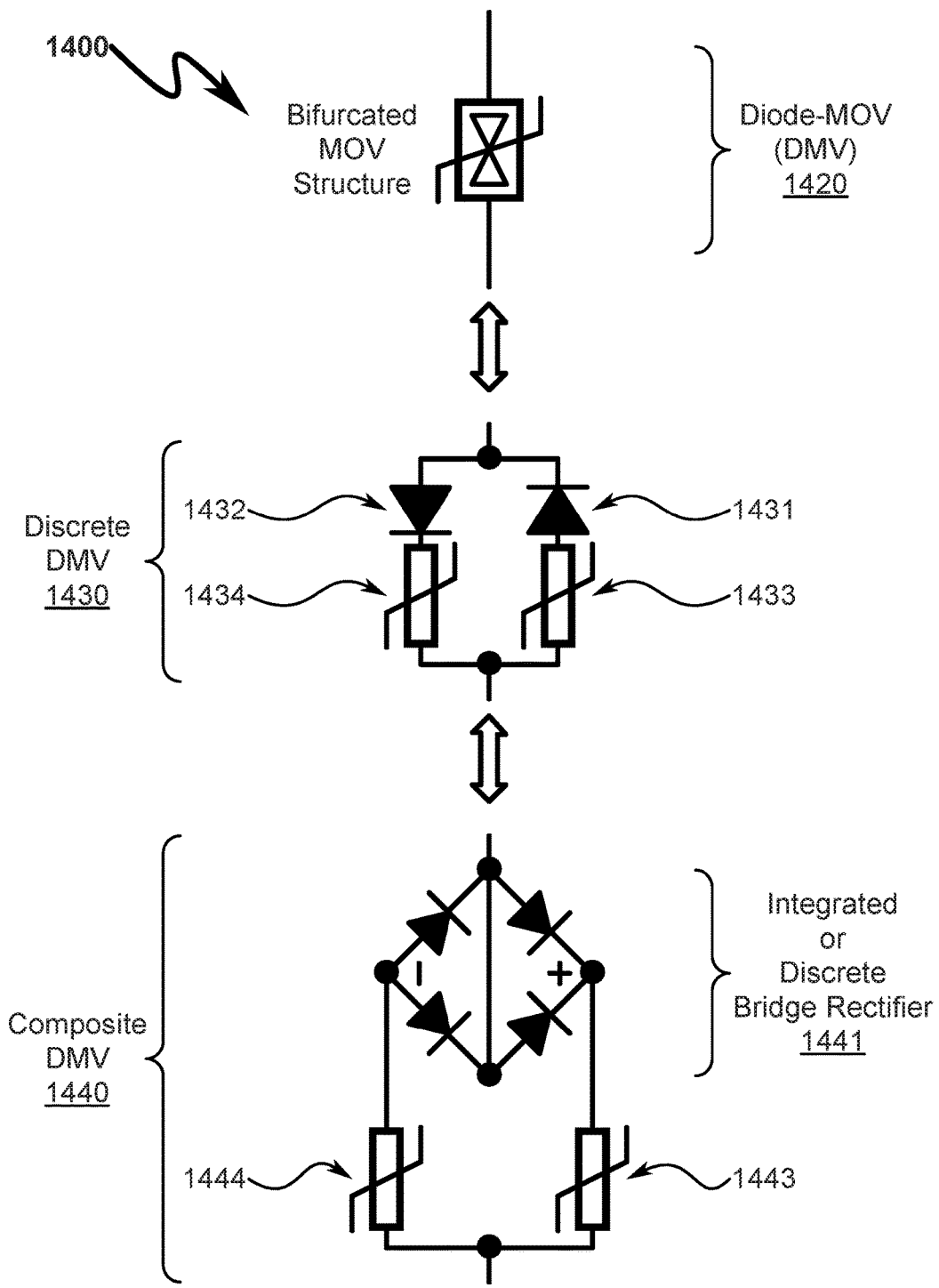
FIG. 14 illustrates several preferred exemplary embodiments of the diode-MOV (DMV) structure used to provide protection for a capacitor.

Details of typical implementations of the diode-MOV (DMV) (1320) structure are generally depicted in FIG. 14 (1400) wherein the diode-MOV (DMV) (1420) is first shown implemented using discrete components (1430) using two diodes (1431, 1432) (or multiple diodes connected in parallel) with series MOV devices (1433, 1434). In an alternative implementation, a composite diode-MOV (DMV) (1430) is also shown implemented using an integrated or discrete bridge rectifier (1441) using four diodes with series MOV devices (1443, 1444).

Piggyback Retrofit Application Context (1500)

Figure 15:
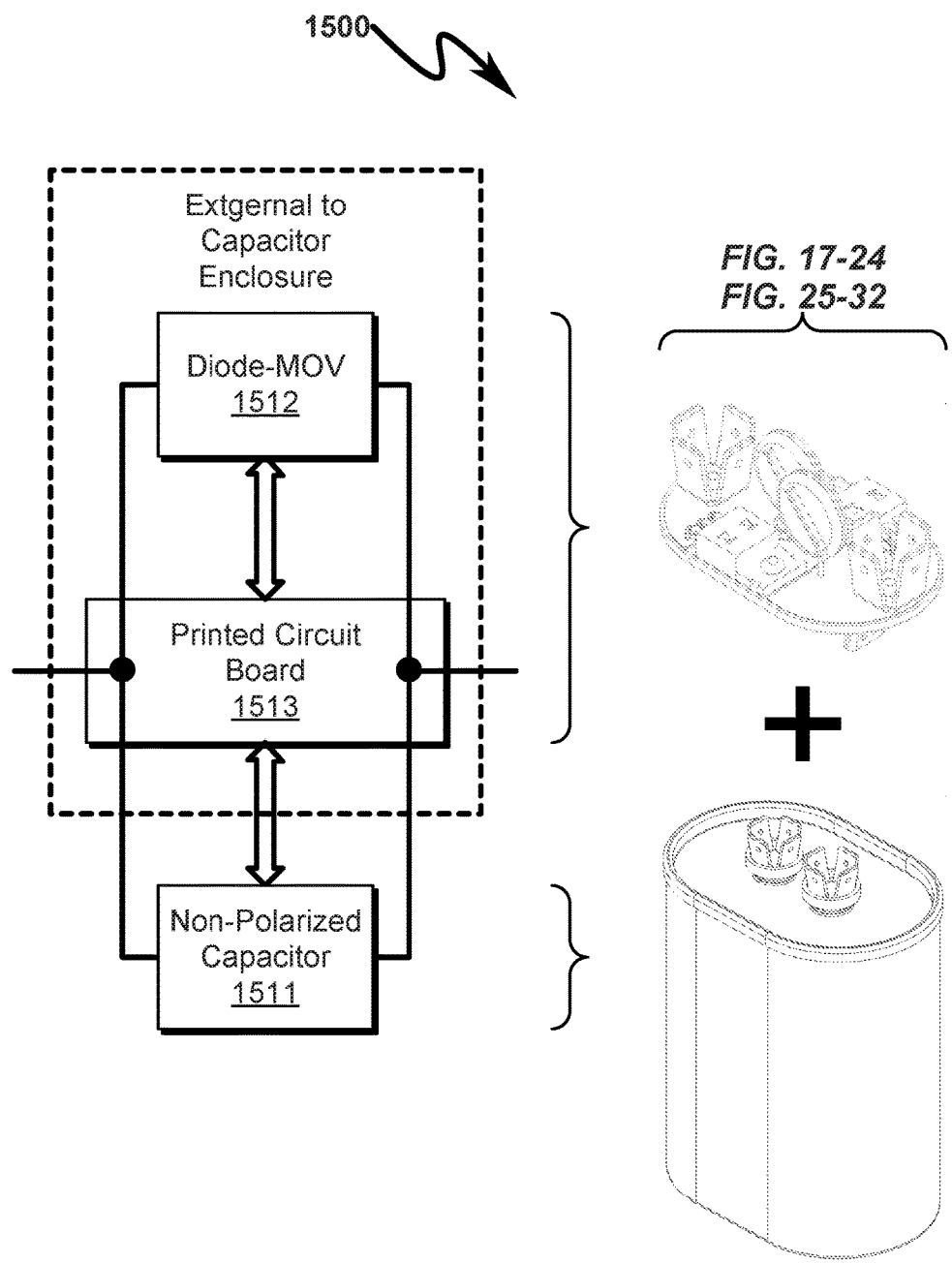
FIG. 15 illustrates a system block diagram depicting a retrofit protection application context where the present invention is applied to an existing non-polarized RUN capacitor.

The present invention may in some preferred contexts be implemented as a retrofit design in which an existing non-polarized capacitor is augmented with a DMV protective structure as generally depicted in FIG. 15 (1500). Here the non-polarized capacitor (1511) is attached to the DMV (1512) via the use of a printed circuit board (PCB) (1513) via connection terminals or the like.

Integrated Capacitor Application Context (1600)

Figure 16:
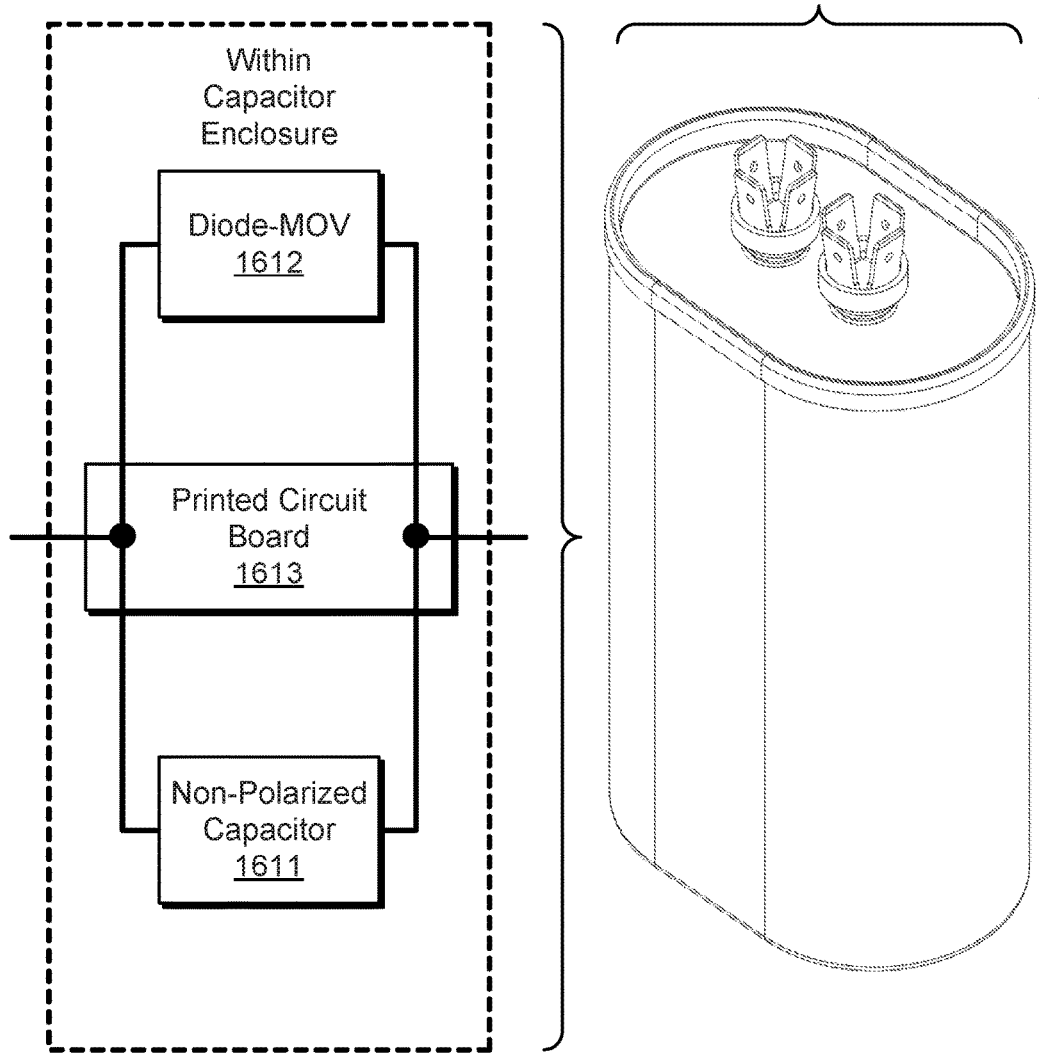
FIG. 16 illustrates a system block diagram depicting an integrated protection application context where the present invention is applied within the enclosure of a non-polarized RUN capacitor.

The present invention may in some preferred contexts be implemented as an integrated protected capacitor design in which non-polarized capacitor structure is augmented internally with a DMV protective structure as generally depicted in FIG. 16 (1600). Here the non-polarized capacitor (1611) is attached to the DMV (1612) via the use of a printed circuit board (PCB) (1613) internal to the capacitor enclosure. This may in some circumstances require that the physical size of the capacitor be increased to accommodate this additional circuitry.

Integrated DMV Structure

Any of the DMV structures detailed herein may be in some preferred invention embodiments be implemented using integrated two-terminal and/or three-terminal diode+MOV structures as detailed in U.S. Pat. Nos. 9,634,474; 9,093,832; and 9,093,831 which are herein incorporated by reference.

Retrofit System Description (1700)-(3200)

Stadium-Form Capacitor (1700)-(2400)

Figure 17:
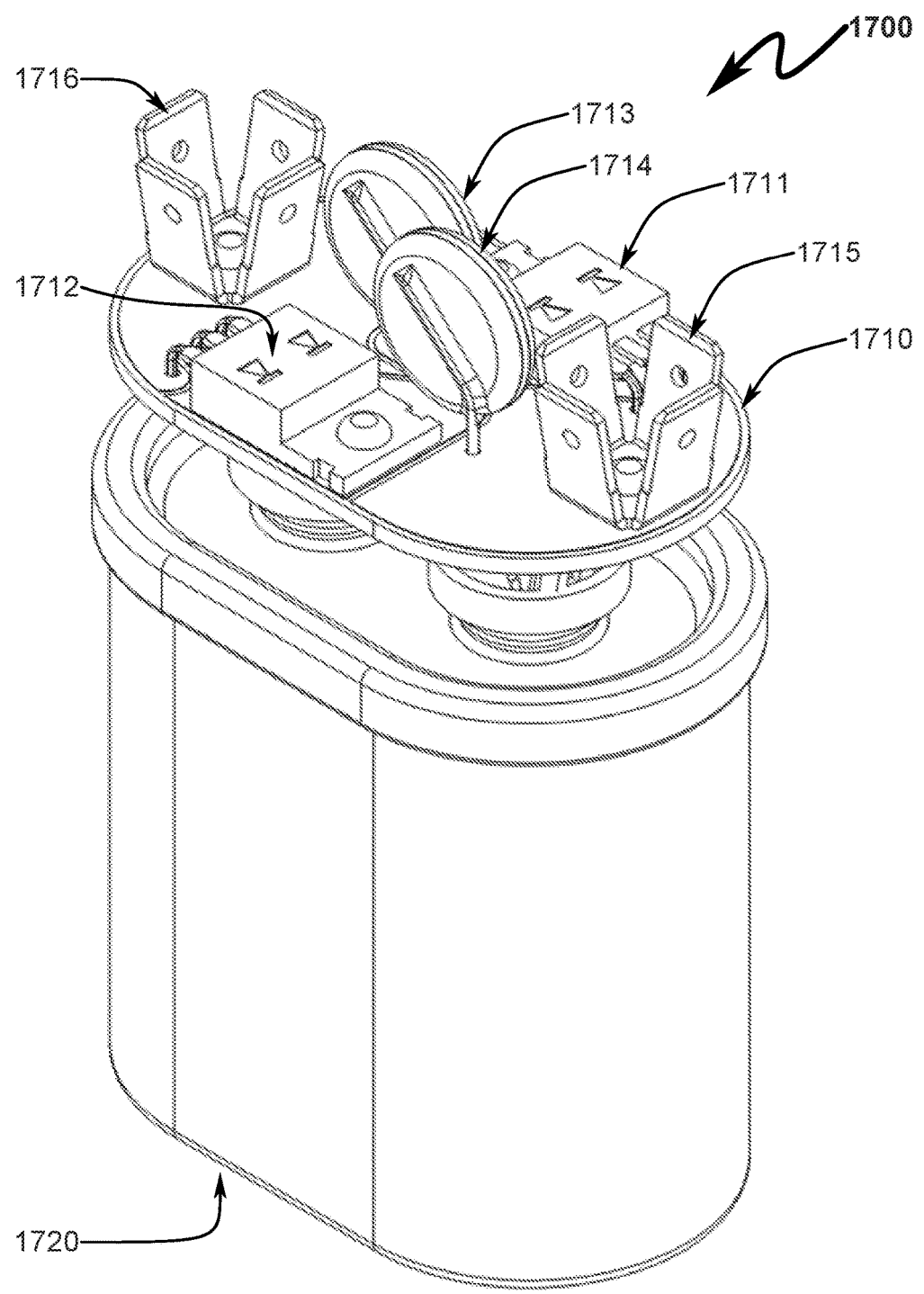
FIG. 17 illustrates a top right front perspective view of a preferred exemplary invention system embodiment implemented as a retrofit PCB in combination with a stadium-form non-polarized capacitor.
Figure 18:
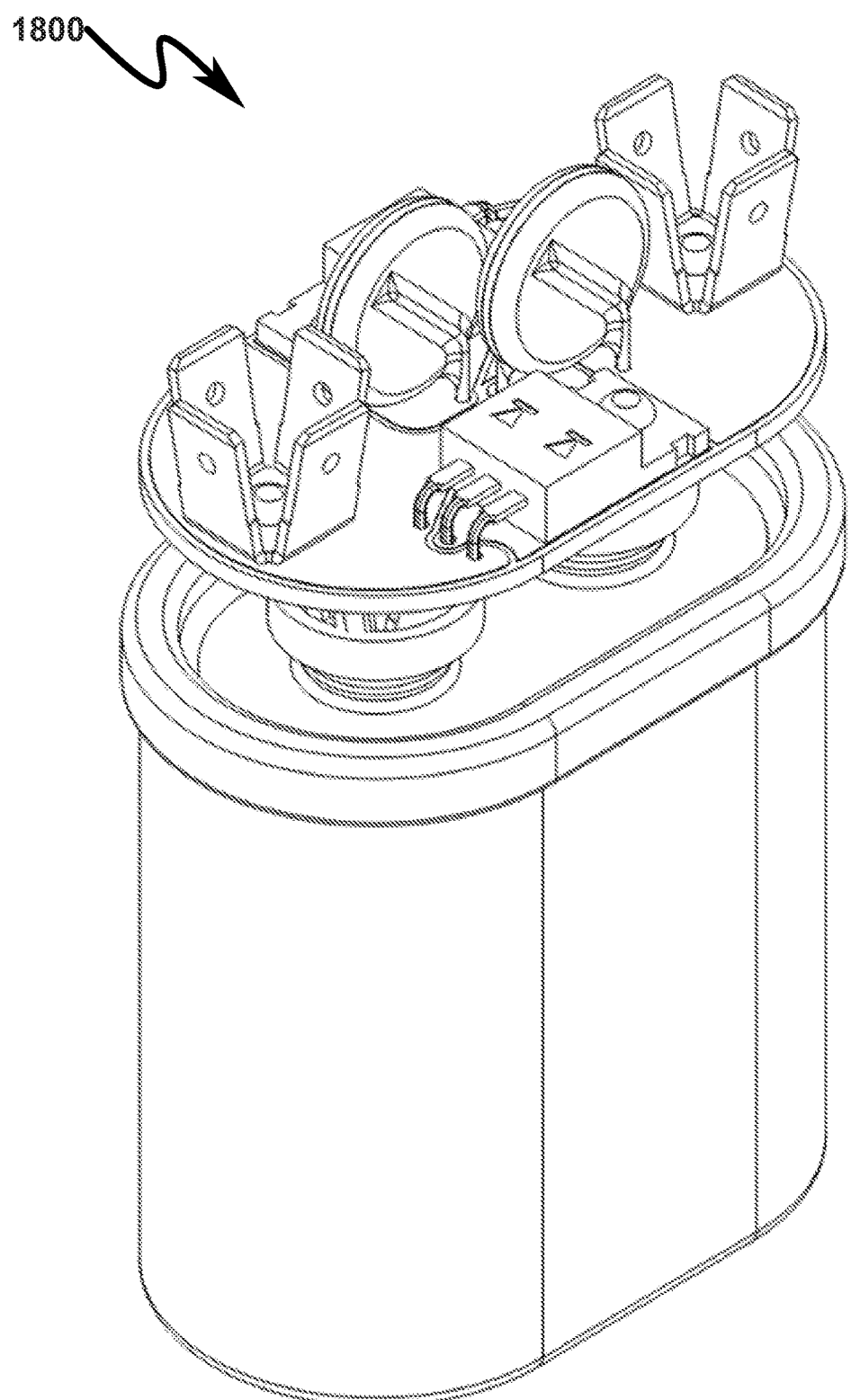
FIG. 18 illustrates a top right rear perspective view of a preferred exemplary invention system embodiment implemented as a retrofit PCB in combination with a stadium-form non-polarized capacitor.
Figure 19:
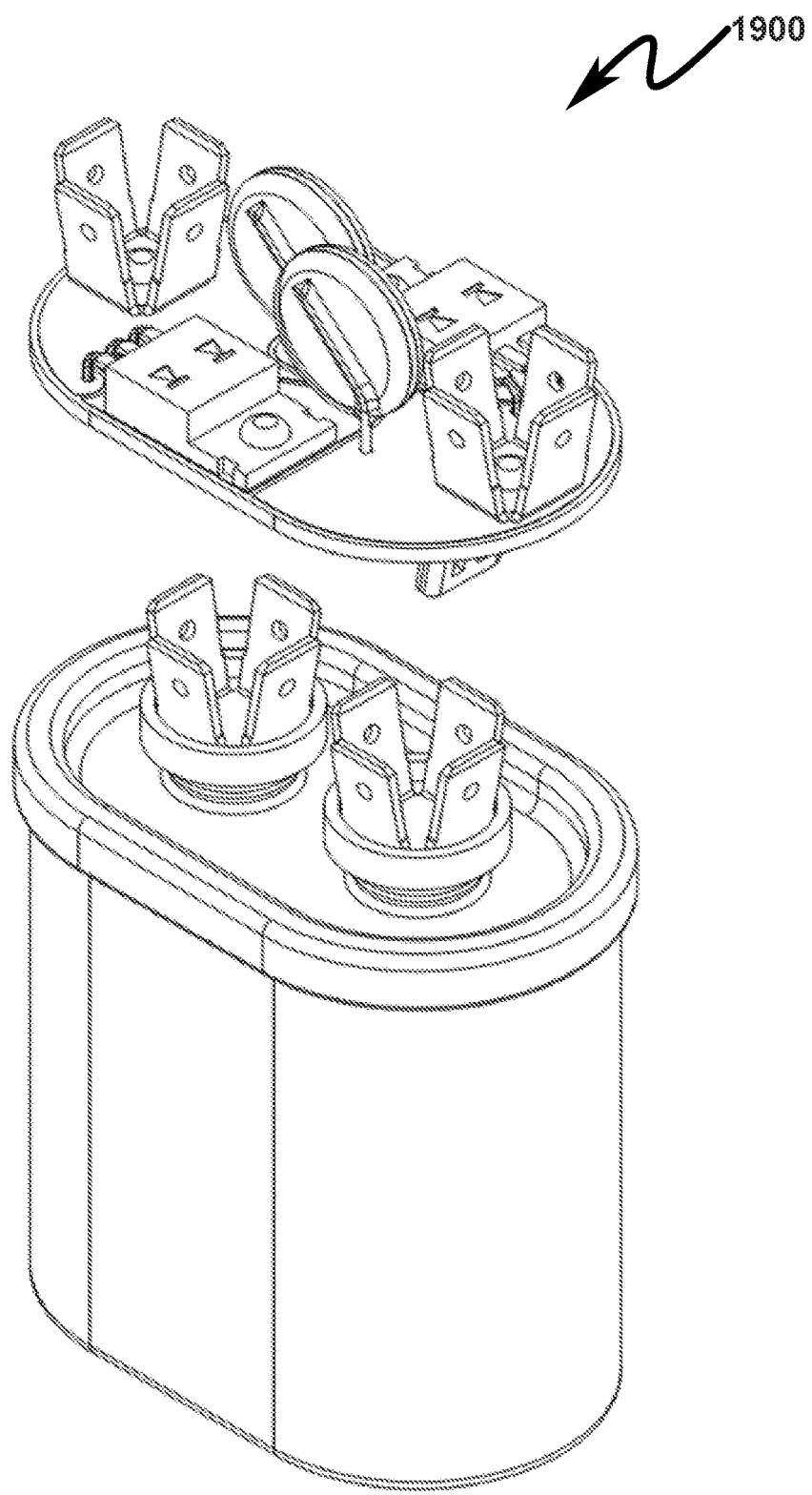
FIG. 19 illustrates a top right front perspective assembly view of a preferred exemplary invention system embodiment implemented as a retrofit RGB in combination with a stadium-form non-polarized capacitor.
Figure 20:
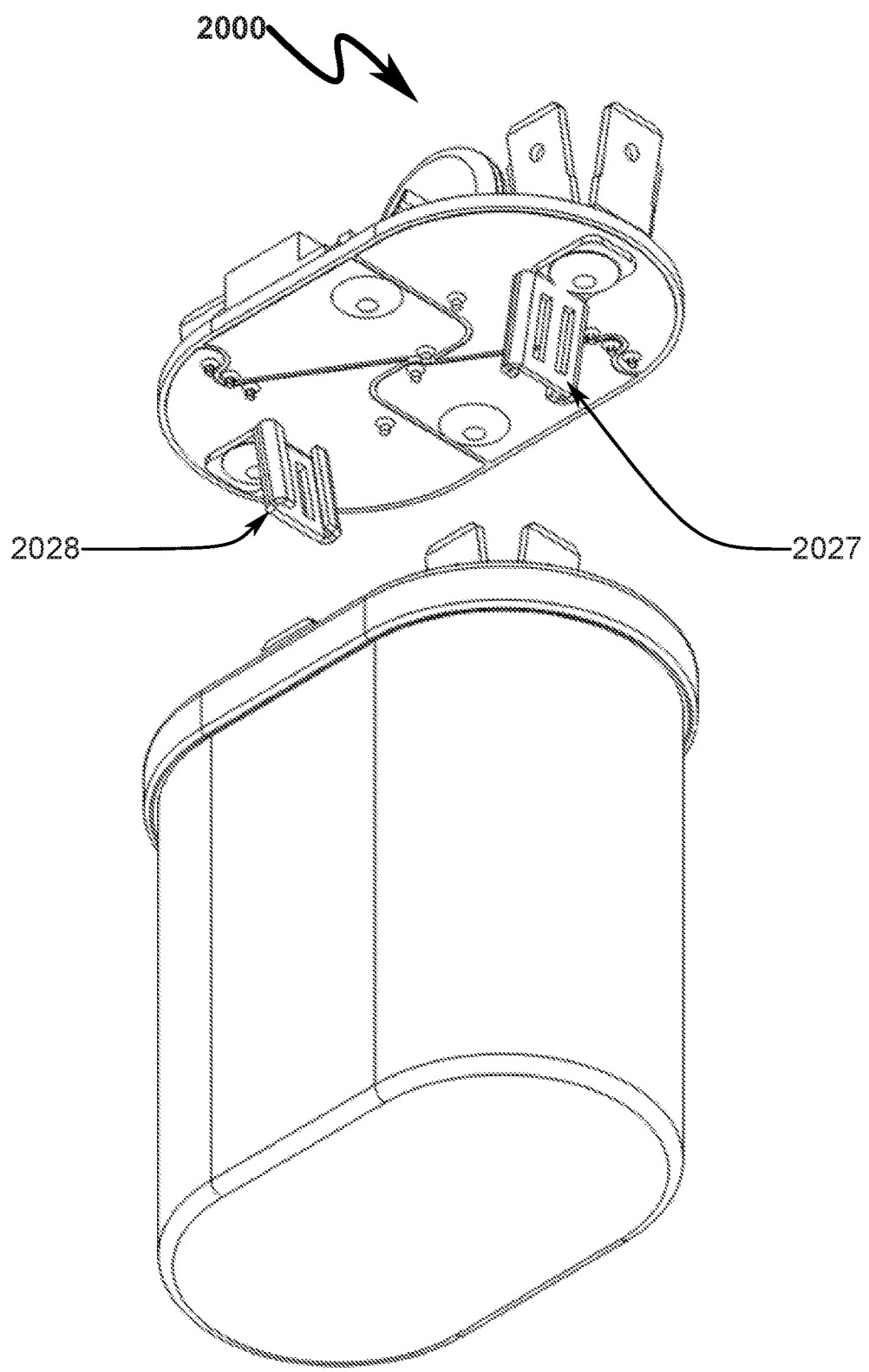
FIG. 20 illustrates a bottom right front perspective assembly view of a preferred exemplary invention system embodiment implemented as a retrofit PCB in combination with a stadium-form non-polarized capacitor.
Figure 21:
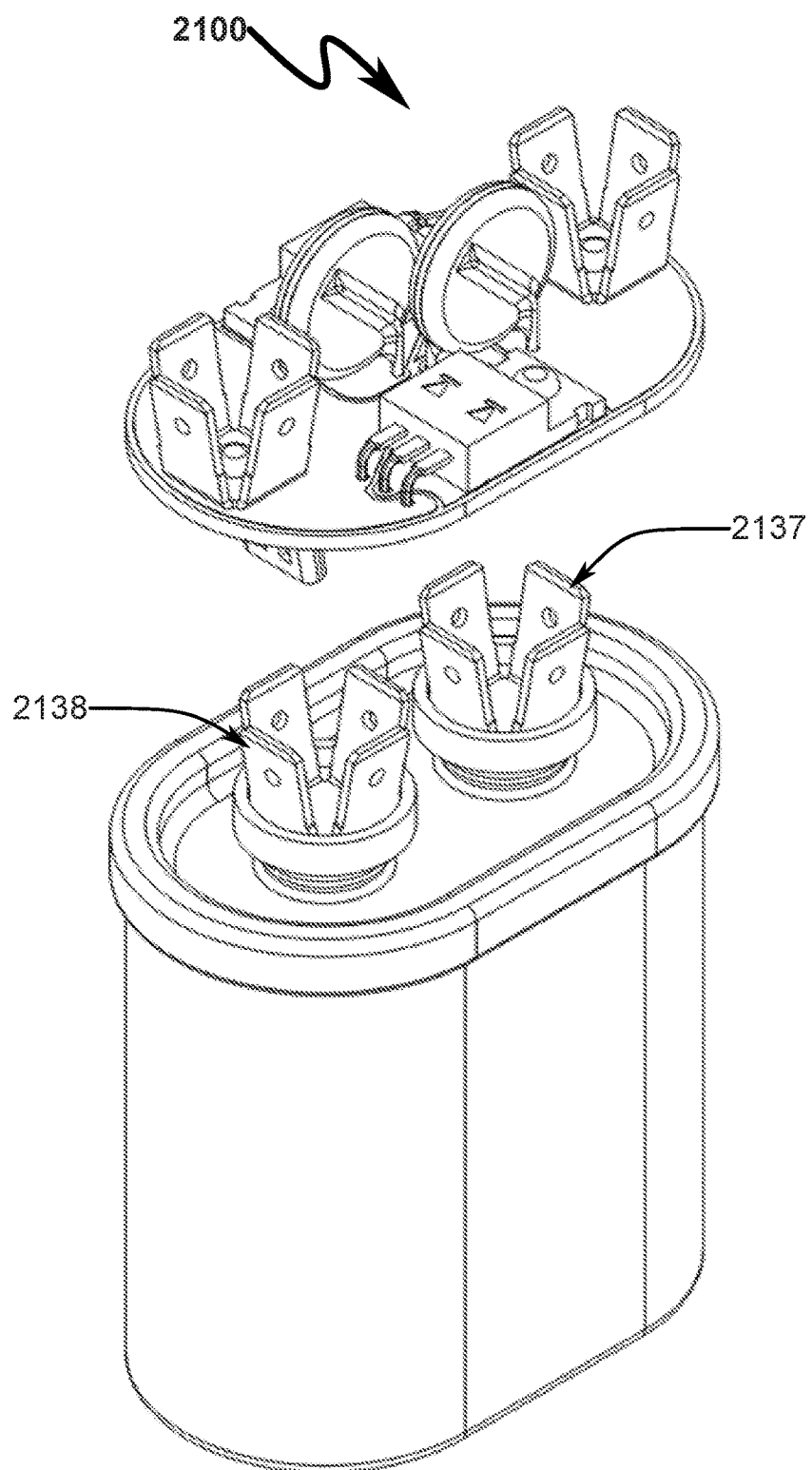
FIG. 21 illustrates a top right rear perspective assembly view of a preferred exemplary invention system embodiment implemented as a retrofit PCB in combination with a stadium-form non-polarized capacitor.
Figure 22:
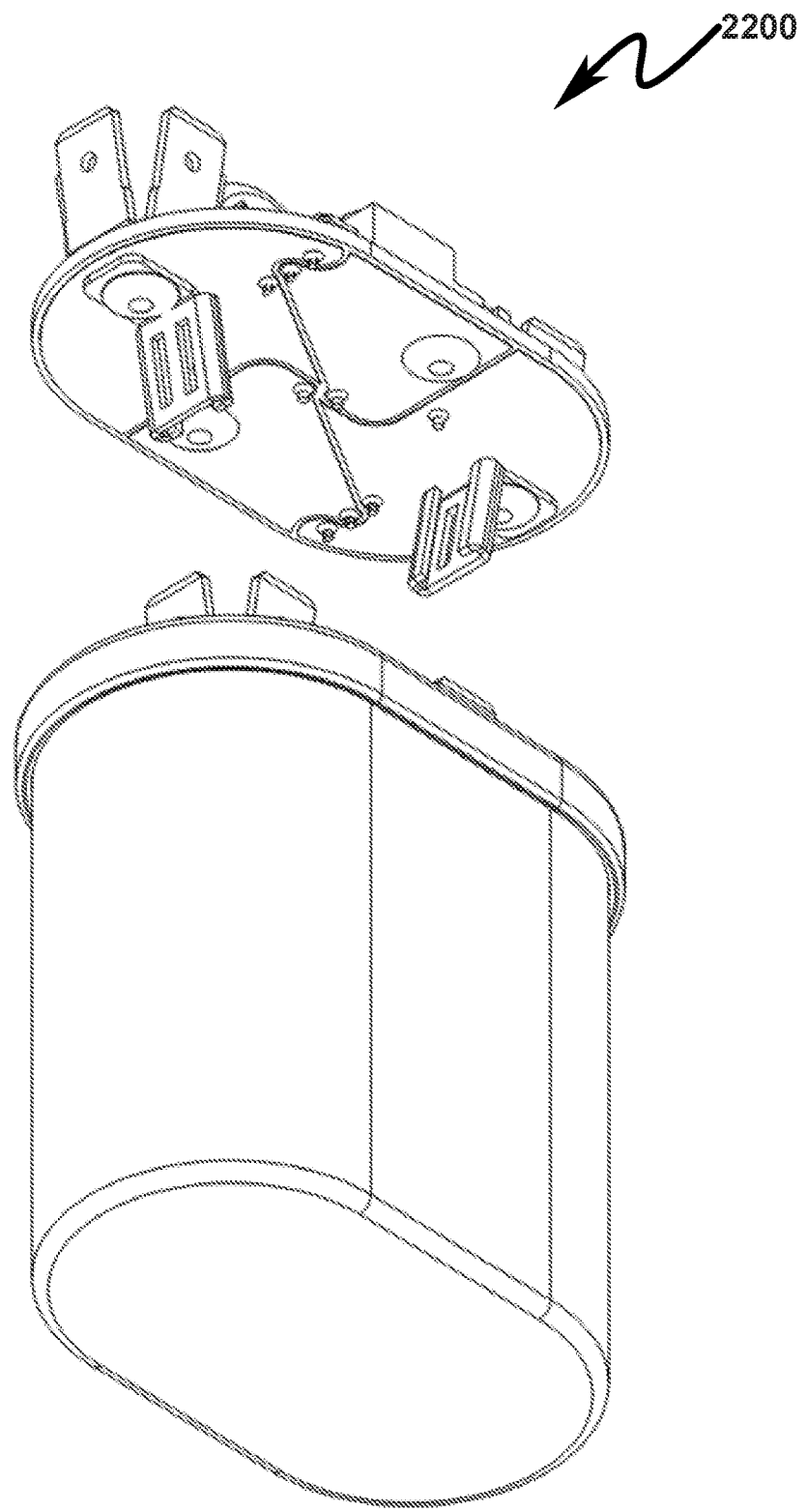
FIG. 22 illustrates a bottom right rear perspective assembly view of a preferred exemplary invention system embodiment implemented as a retrofit PCB in combination with a stadium-form non-polarized capacitor.
Figure 23:
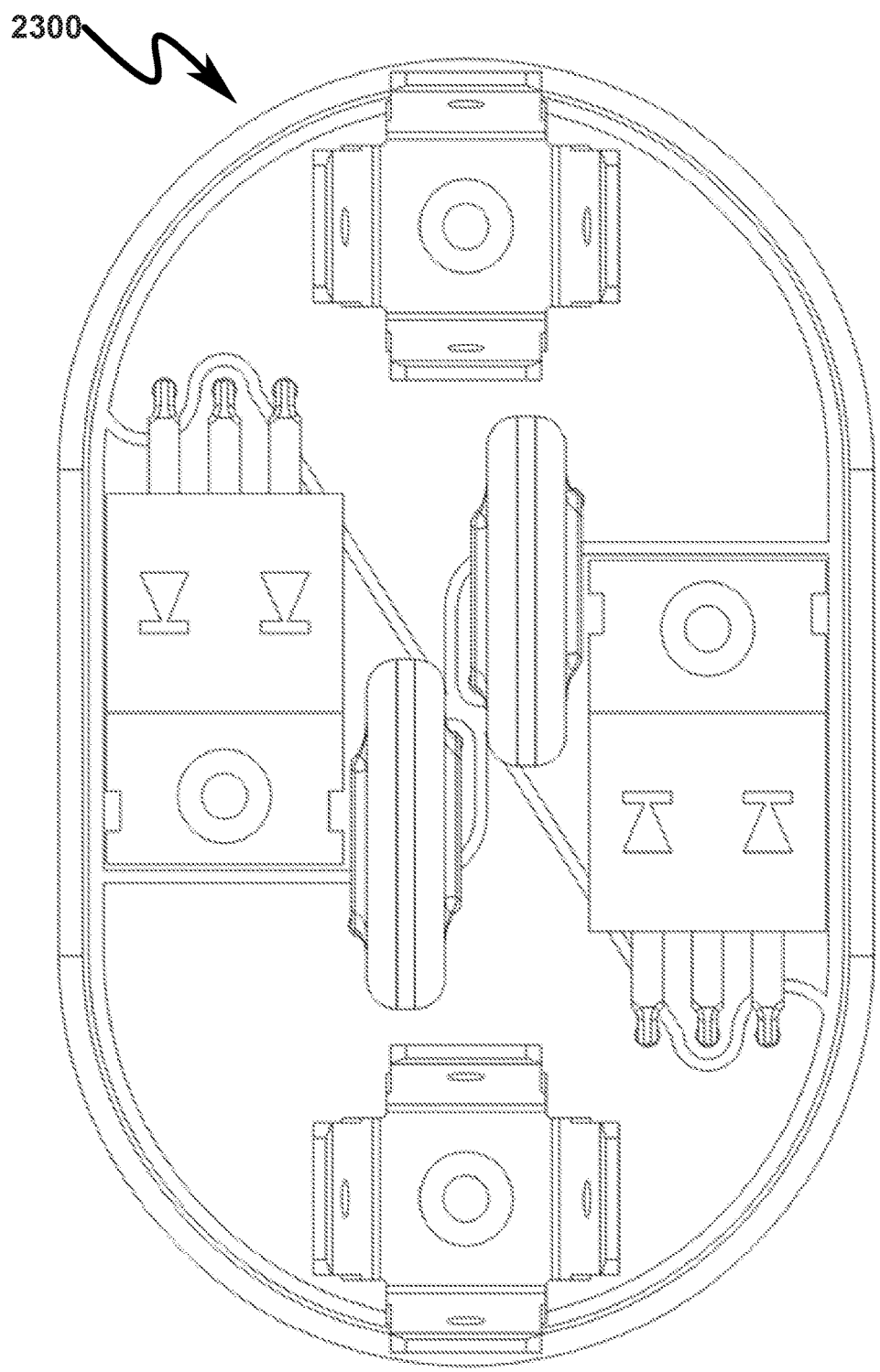
FIG. 23 illustrates a top view of a preferred exemplary invention system embodiment depicting an isolated view of a retrofit PCB that is used in combination with a stadium-form non-polarized capacitor.
Figure 24:
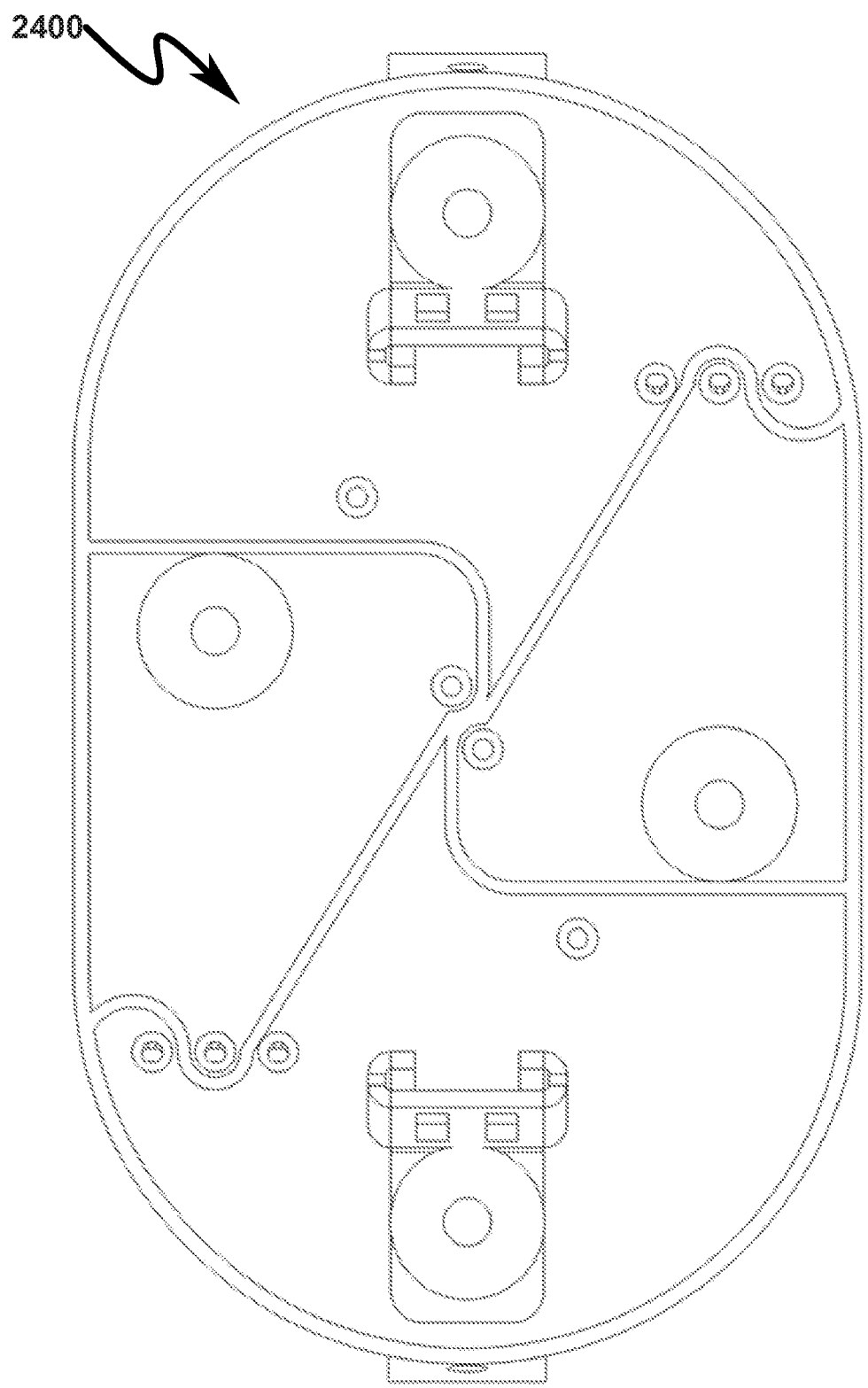
FIG. 24 illustrates a bottom view of a preferred exemplary invention system embodiment depicting an isolated view of a retrofit PCB that is used in combination with a stadium-form non-polarized capacitor.

As generally depicted in FIG. 17 (1700)-FIG. 24 (2400), the present invention may be embodied in some application contexts as a retrofit to existing stadium-form capacitors to provide a protected capacitor system. Here a printed circuit board (PCB) (1710) incorporating protective DMV circuitry is attached to an existing stadium-form capacitor (1720) so as to protect the stadium-form, capacitor (1720) from transient overvoltages. In this configuration paralleled dual diode rectifiers (1711, 1712) are provided in series with the TVSS devices (1713, 1714) to provide the protection for the stadium-form capacitor (1720). Circuitry routing for the system can be discerned from the bottom PCB layout provided in FIG. 24 (2400) which mimics the circuit layering on the top layer of the PCB depicted in FIG. 23 (2300). One skilled in the art will recognize that the anti-paralleled dual diode rectifiers (1711, 1712) may be equivalently replaced using discrete diode rectifiers and/or bridge rectifier components.

It should be noted that in this and other retrofit applications the PCB (1710) may be directly mated to the capacitor (1720) such that first and second PCB male input terminals (1715, 1716) are electrically connected to first and second PCB female output terminals (2025, 2026) that mate directly to corresponding spade lug terminals (2135, on the capacitor (1720). This allows field-retrofit operations in which an existing stadium-form capacitor (1720) may be retrofit with the PCB (1710) to form a protected capacitor system.

Cylindrical-Form Capacitor (2500)-(3200)

Figure 25:
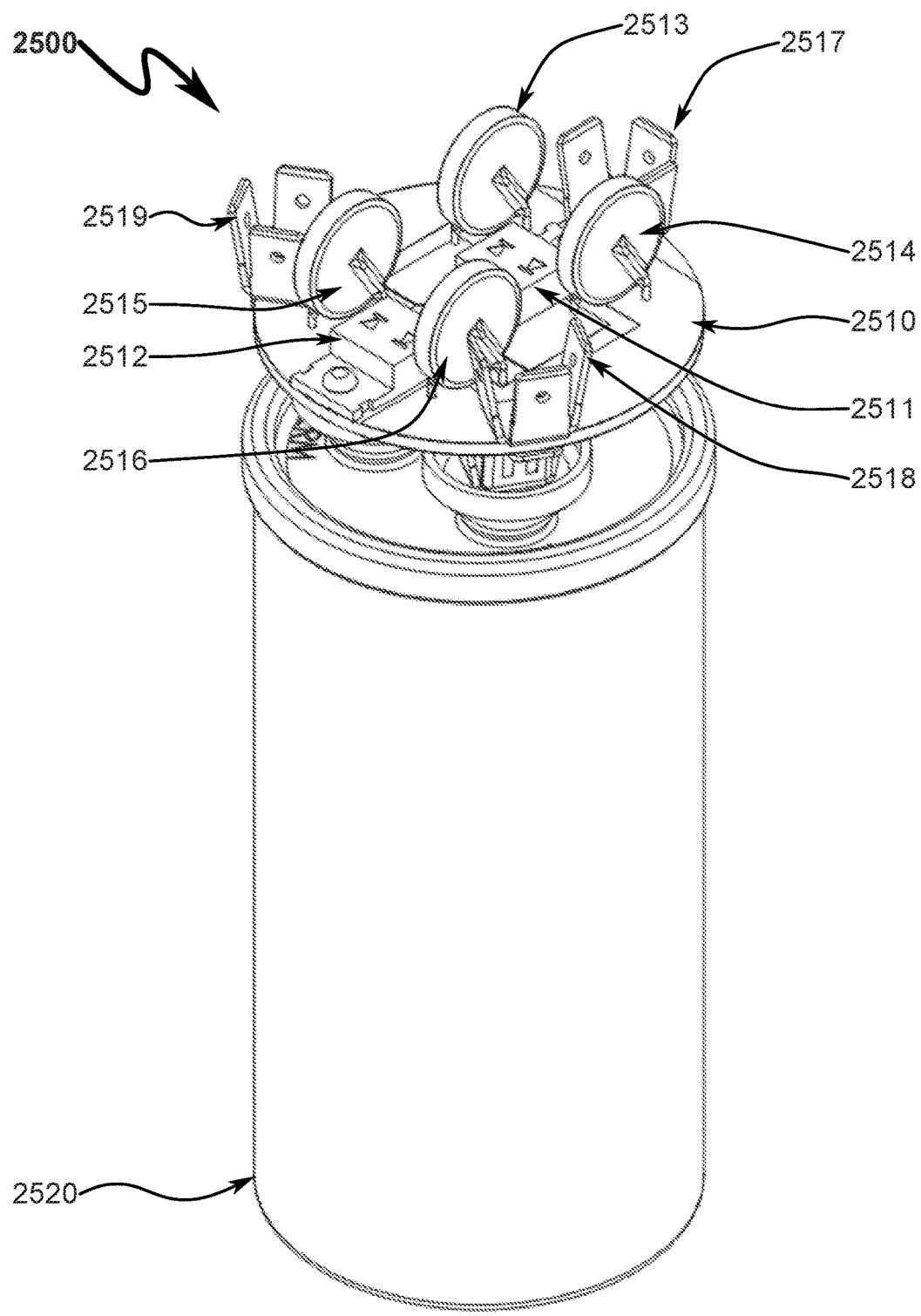
FIG. 25 illustrates a top right front perspective view of a preferred exemplary invention system embodiment implemented as a retrofit PCB in combination with a cylinarical-form non-polarized capacitor.
Figure 26:
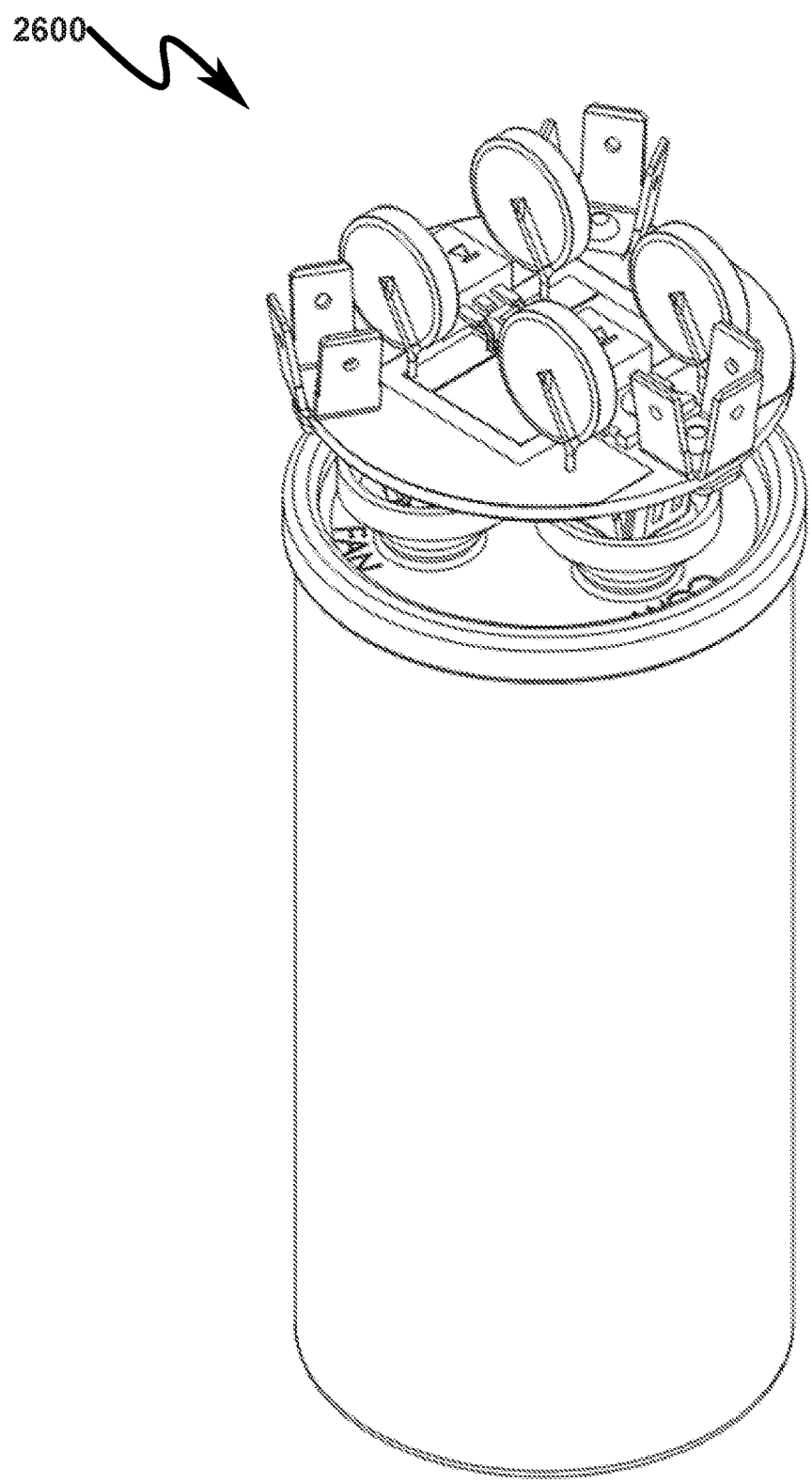
FIG. 26 illustrates a top right rear perspective view of a preferred exemplary invention system embodiment implemented as a retrofit PCB in combination with a cylindrical-form non-polarized capacitor.
Figure 27:
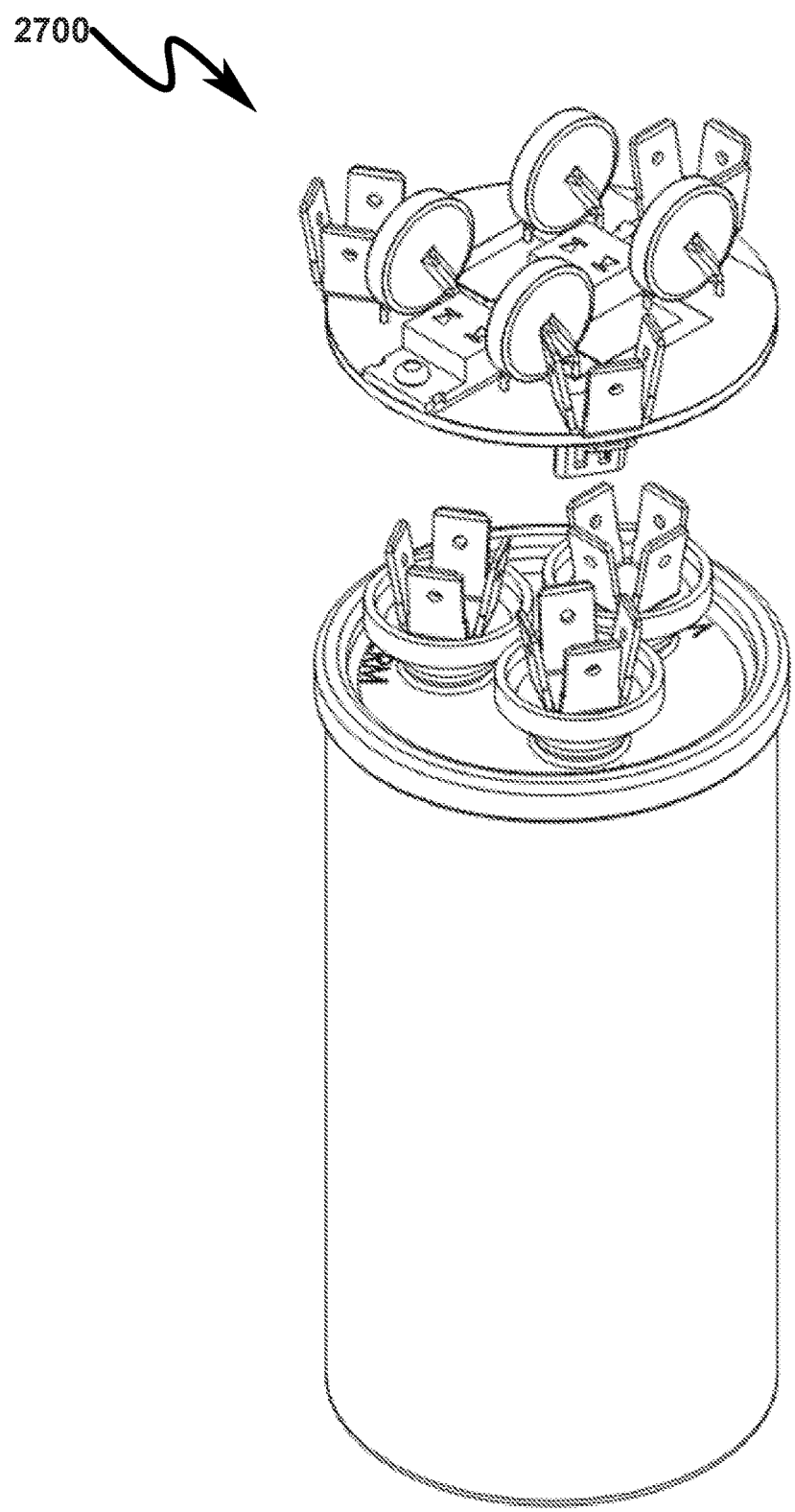
FIG. 27 illustrates a top right front perspective assembly view of a preferred exemplary invention system embodiment implemented as a retrofit PCB in combination with a cylindrical-form non-polarized capacitor.
Figure 28:
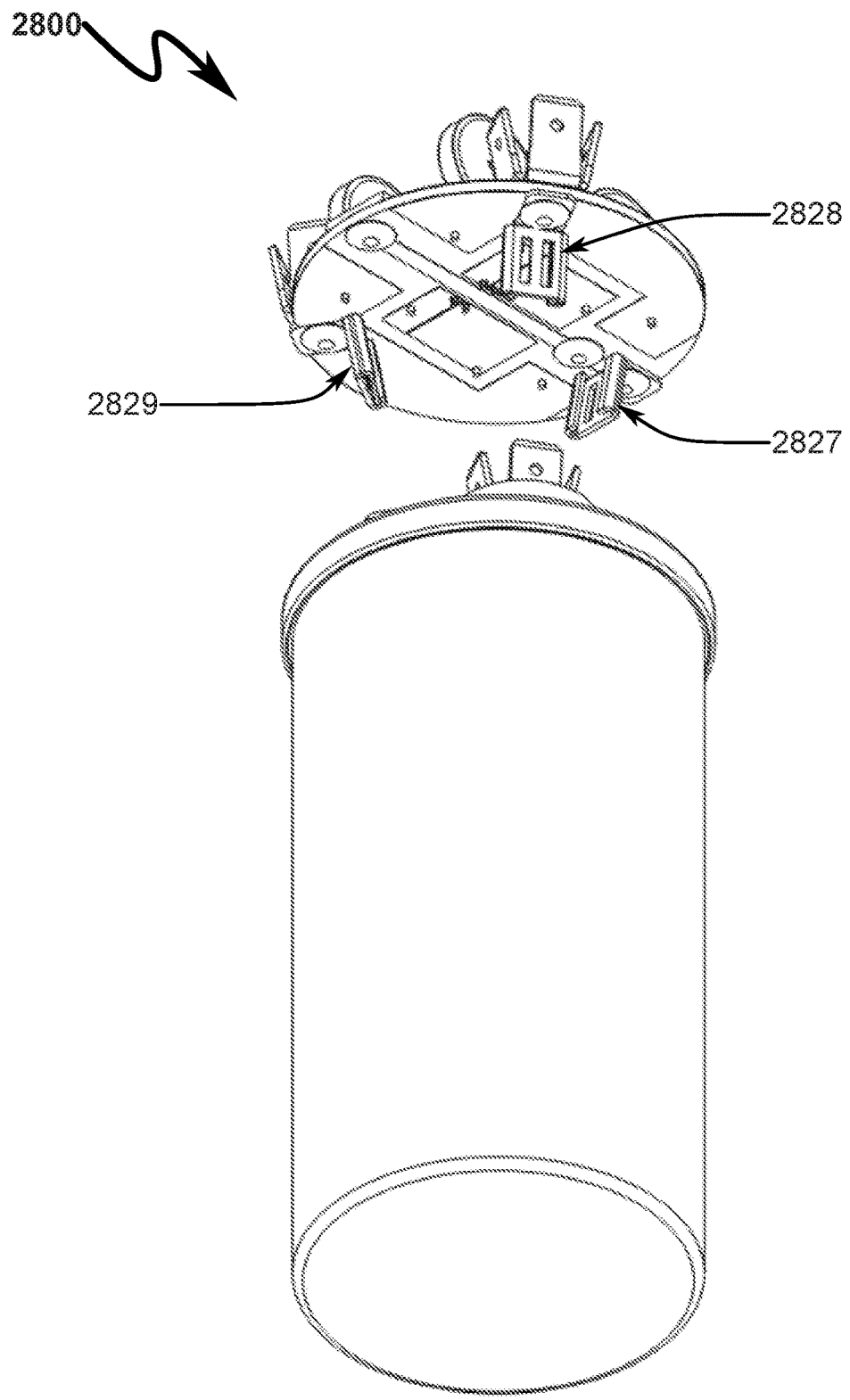
FIG. 28 illustrates a bottom right front perspective assembly view of a preferred exemplary invention system, embodiment implemented as a retrofit PCB in combination with a cylindrical-form non-polarized capacitor.
Figure 29:
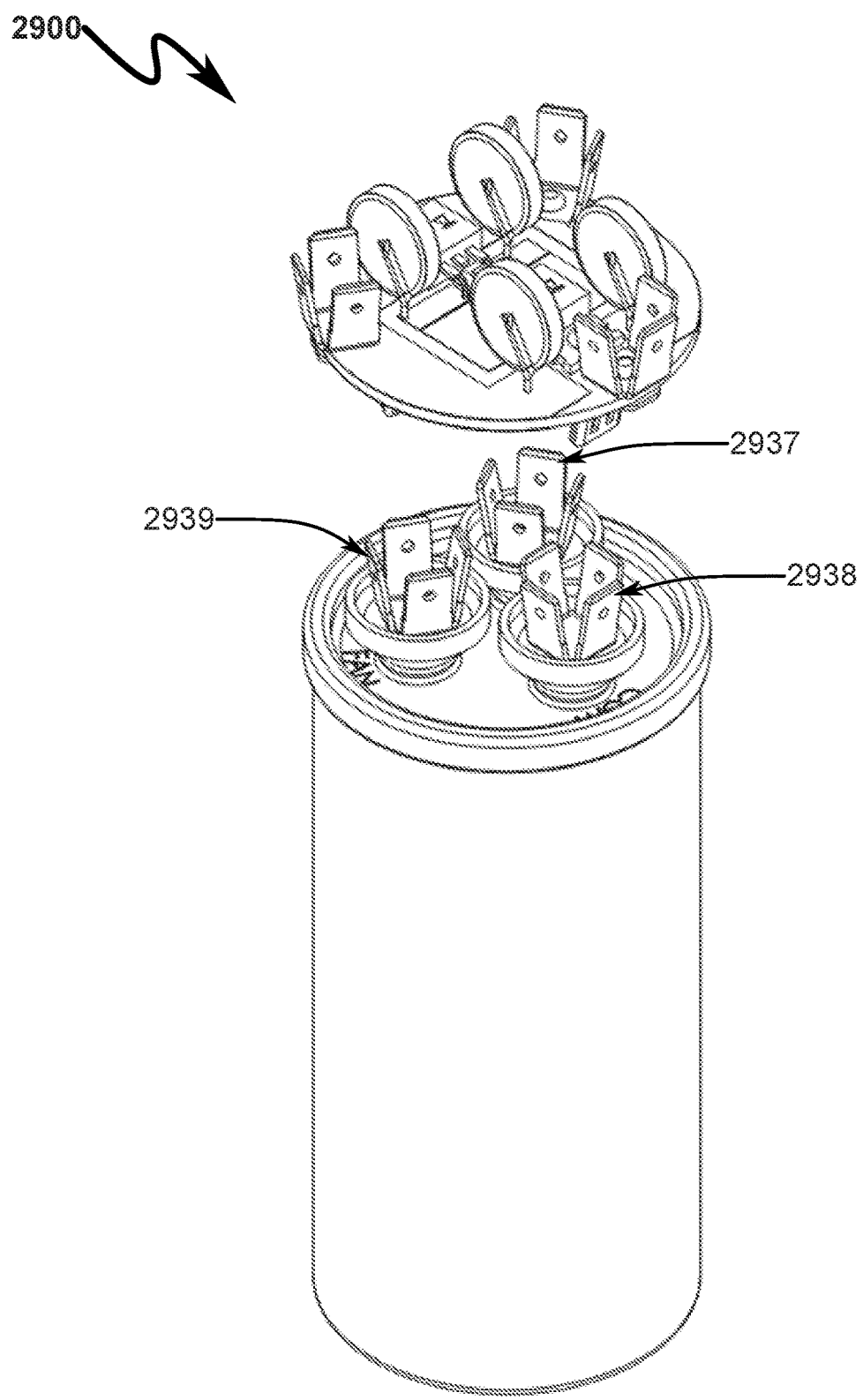
FIG. 29 illustrates a top right rear perspective assembly view of a preferred exemplary invention system embodiment implemented as a retrofit PCB in combination with a cylindrical-form non-polarized capacitor.
Figure 30:
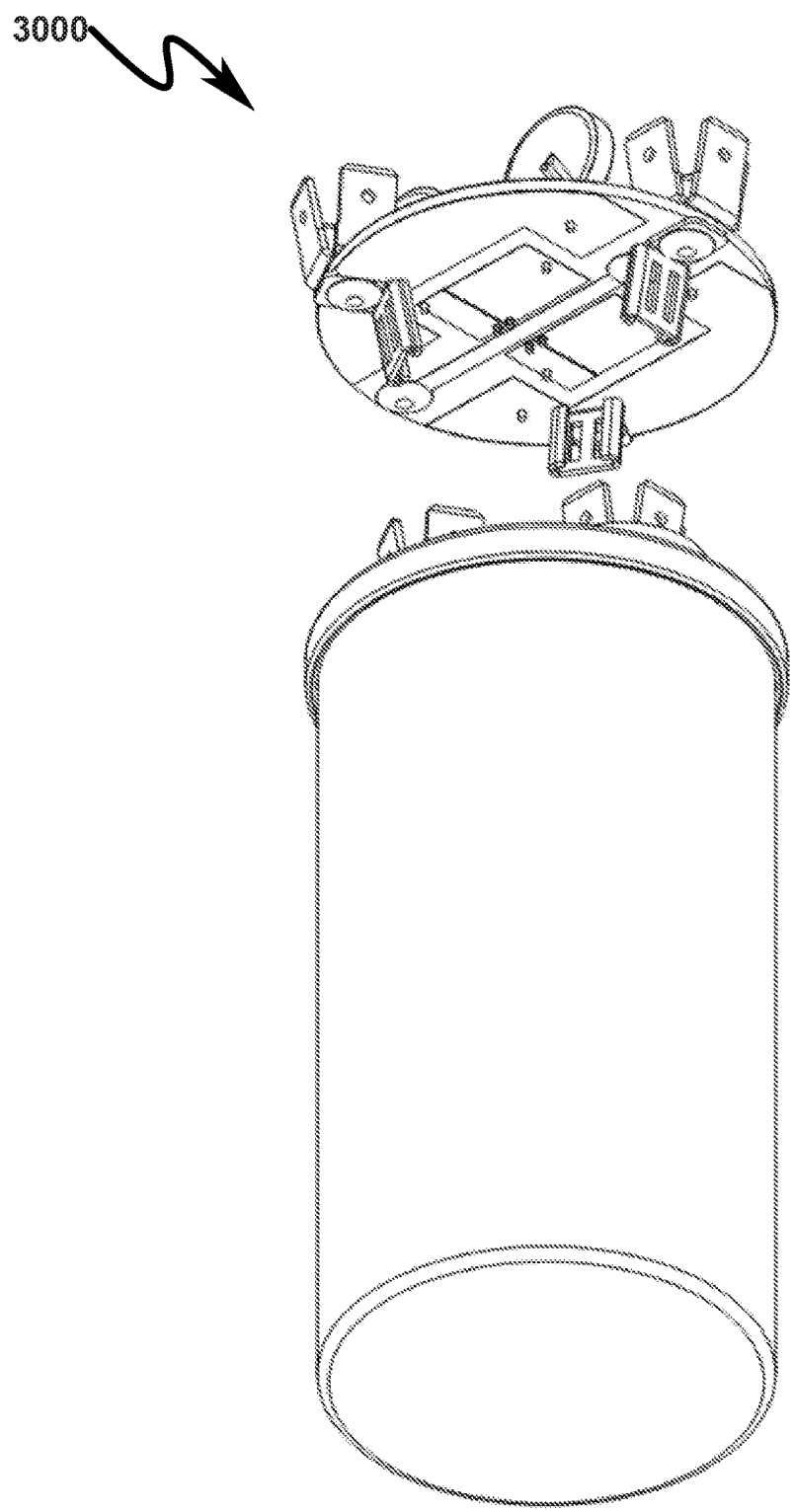
FIG. 30 illustrates a bottom right rear perspective assembly view of a preferred exemplary invention system, embodiment implemented as a retrofit PCB in combination with a cylindrical-form non-polarized capacitor.
Figure 31:
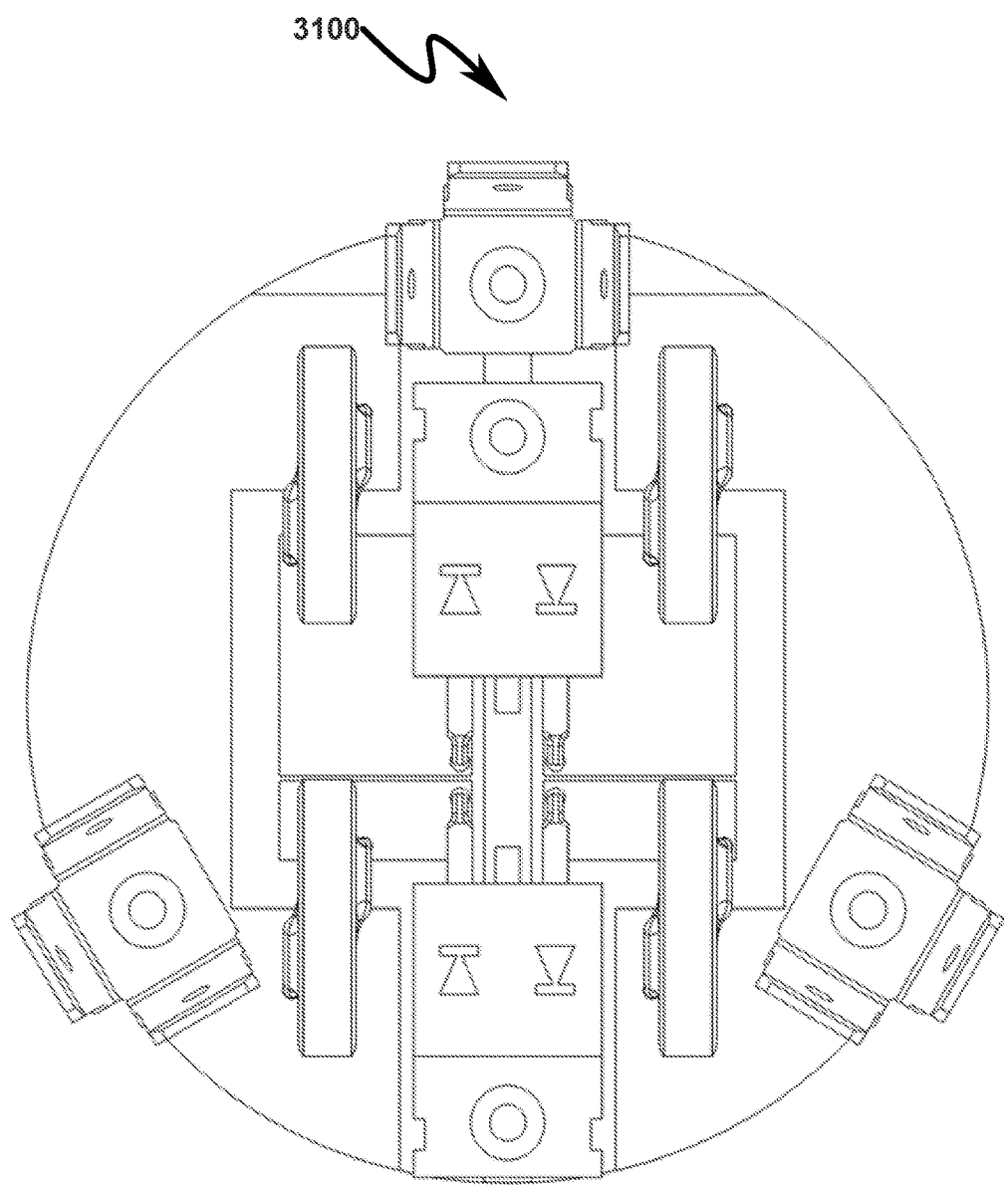
FIG. 31 illustrates a top view of a preferred exemplary invention system embodiment depicting an isolated view of a retrofit PCB that is used in combination with a cylindrical-form non-polarized capacitor.
Figure 32:
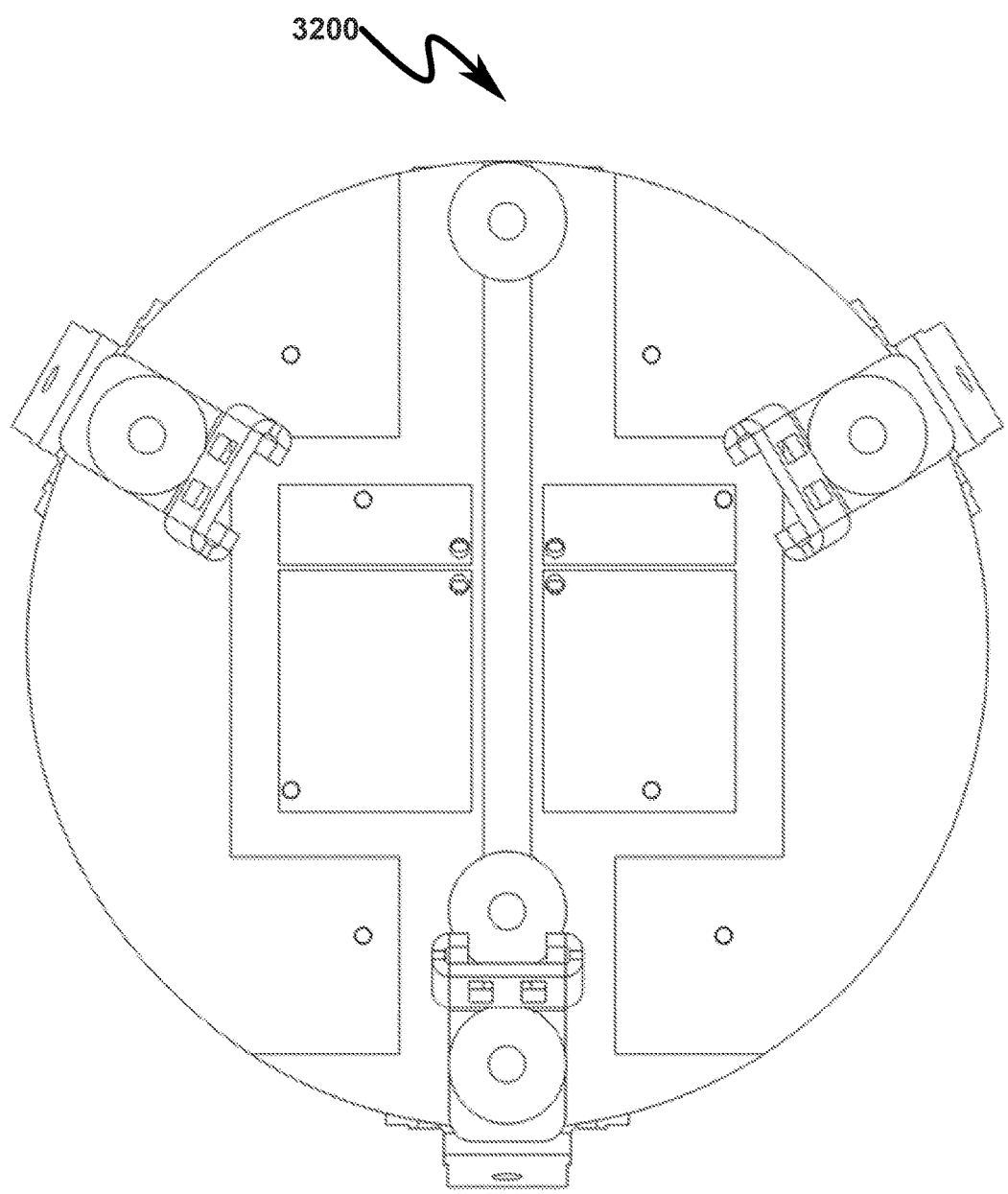
FIG. 32 illustrates a bottom view of a preferred exemplary invention system embodiment depicting an isolated view of a retrofit PCB that is used in combination with a cylindrical-form non-polarized capacitor.

As generally depicted in FIG. 25 (2500)-FIG. 32 (3200), the present invention may be embodied in some application contexts as a retrofit to existing cylindrical-form capacitors to provide a protected capacitor system. Here a printed circuit board (PCB) (2510) incorporating protective DMV circuitry is attached to an existing cylindrical-form capacitor (2520) so as to protect the cylindrical-form capacitor (2520) from transient overvoltages. In this configuration anti-paralleled dual diode rectifiers (2511, 2512) are provided in series with the TVSS devices (2513, 2514, 2515, 2516) to provide the protection for the cylindrical-form capacitor (2520). Circuitry routing for the system can be discerned from the bottom PCB layout provided in FIG. 32 (3200) which mimics the circuit layering on the top layer of the PCB depicted in FIG. 31 (3100). One skilled in the art will recognize that the anti-paralleled dual diode rectifiers (2511, 2512) may be equivalently replaced using discrete diode rectifiers and/or bridge rectifier components.

It should be noted that in this and other retrofit applications the PCB (2510) may be directly mated to the capacitor (2520) such that first, second, and third PCB male input terminals (2517, 2518, 2519) (corresponding to the COMMON (COM), FAN MOTOR (FAN), and HERMETICALLY SEALED COMPRESSOR (HERM) capacitor connections) are electrically connected to first and second PCB female output terminals (2827, 2828, 2829) that mate directly to corresponding spade lug terminals (2937, 2938, 2939) on the capacitor (2520). This allows field-retrofit operations in which an existing cylindrical-form capacitor (2520) may be retrofit, with the PCB (2510) to form a protected capacitor system.

Integrated System Description (3300)-(4800)

Integrated Cylindrical-Form Capacitor (3300)-(4000)

Figure 33:
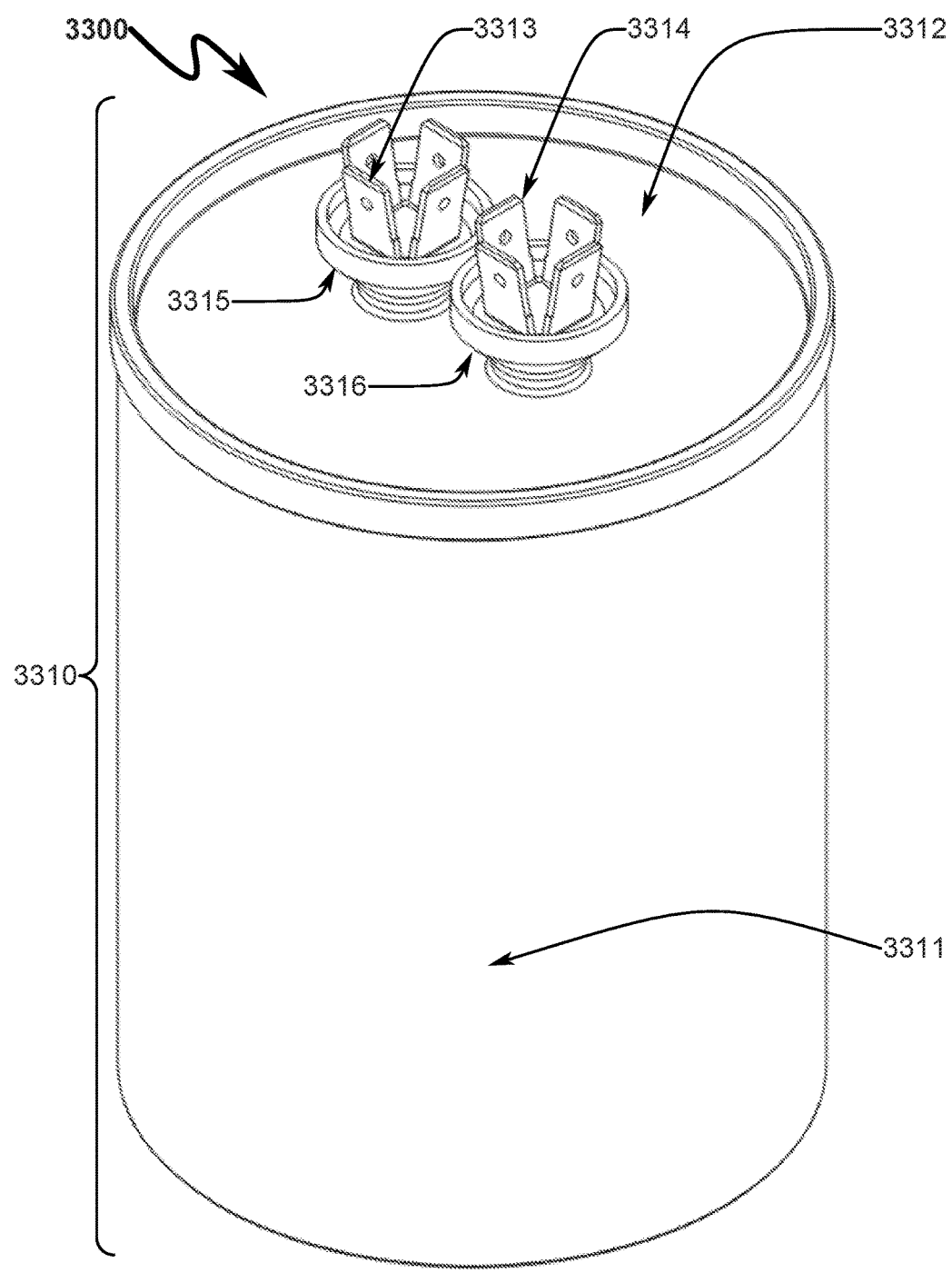
FIG. 33 illustrates a top right front perspective view of a preferred exemplary invention system embodiment implemented as an integrated cylindrical-form capacitor structure incorporating integral transient protection.
Figure 34:
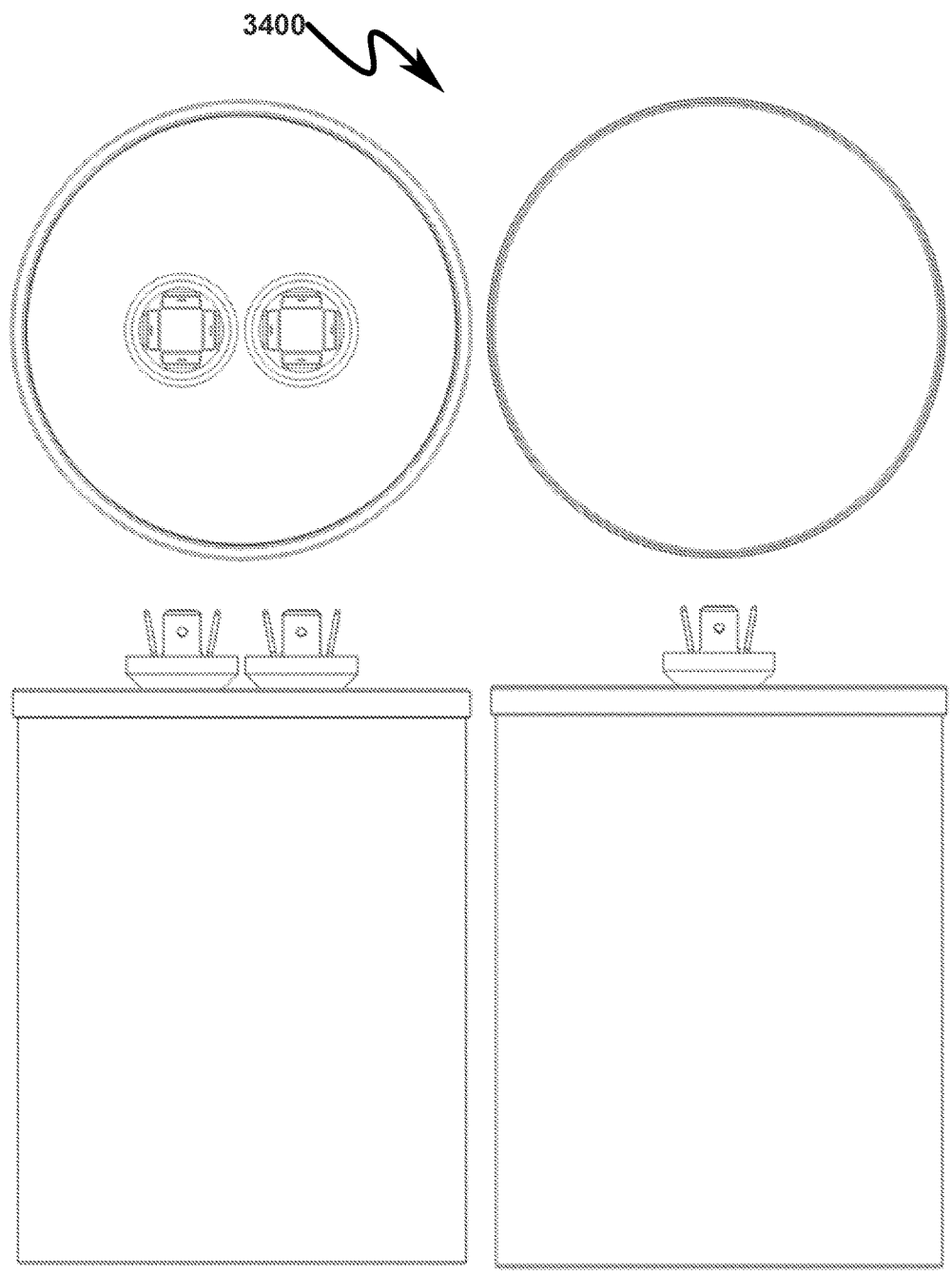
FIG. 34 illustrates a top view, bottom view, front side view, and right side view of a preferred exemplary invention system embodiment implemented as an integrated cylindrical-form capacitor structure incorporating integral transient protection.
Figure 35:
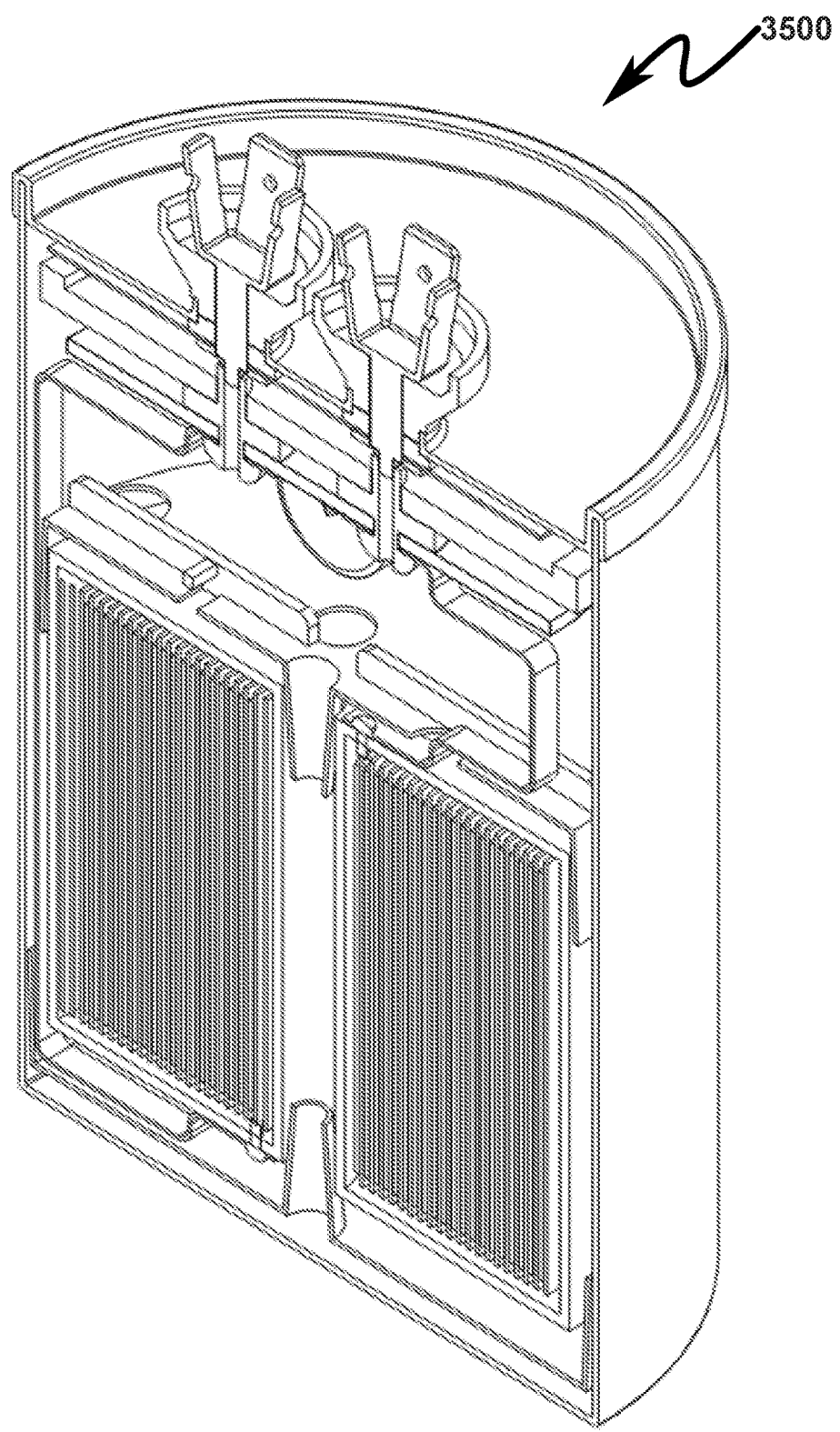
FIG. 35 illustrates a top right front perspective front section view of a preferred exemplary invention system embodiment implemented as an integrated cylindrical-form capacitor structure incorporating integral transient protection.
Figure 36:
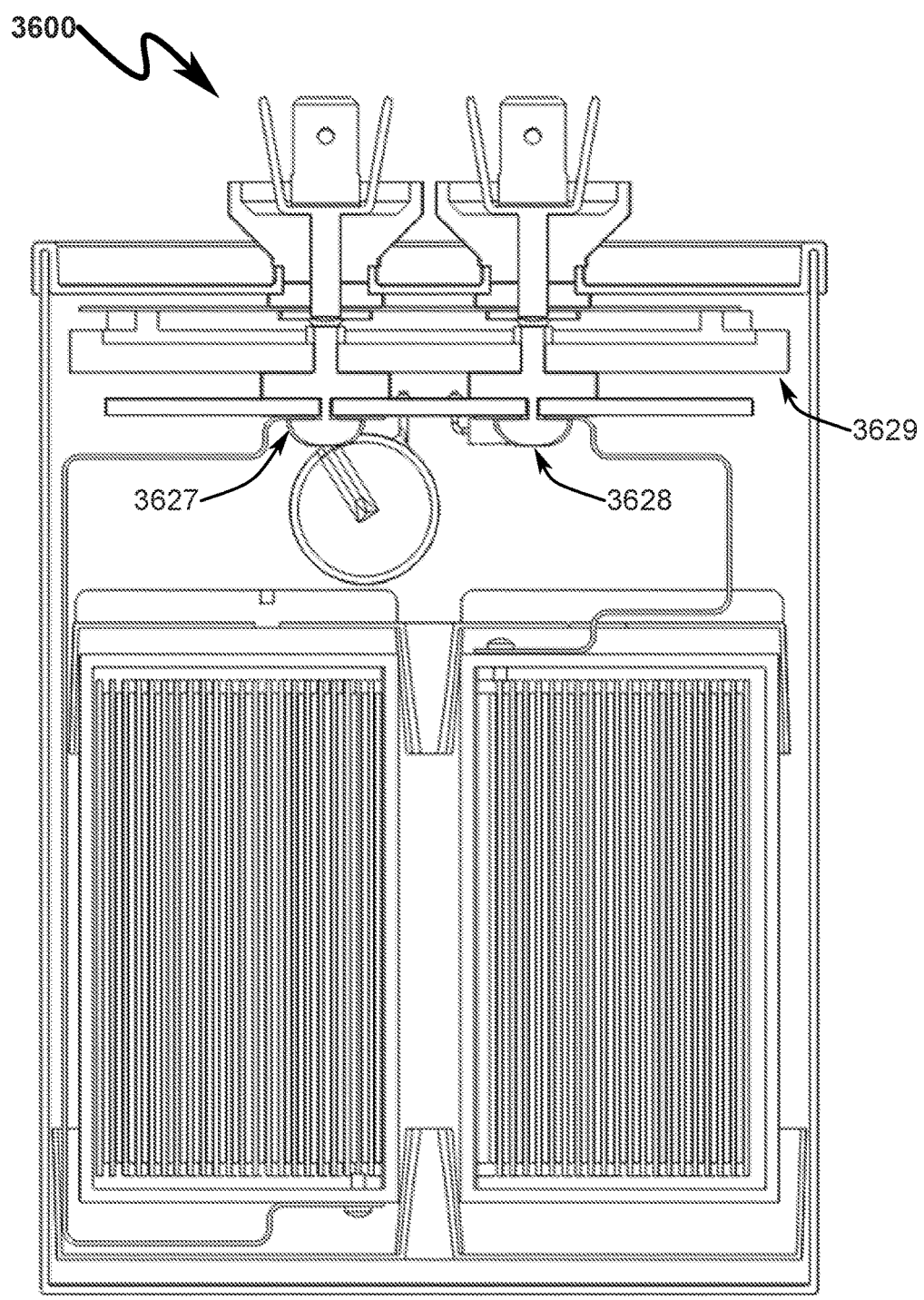
FIG. 36 illustrates a front section view of a preferred exemplary invention system embodiment implemented as an integrated cylindrical-form capacitor structure incorporating integral transient protection.
Figure 37:
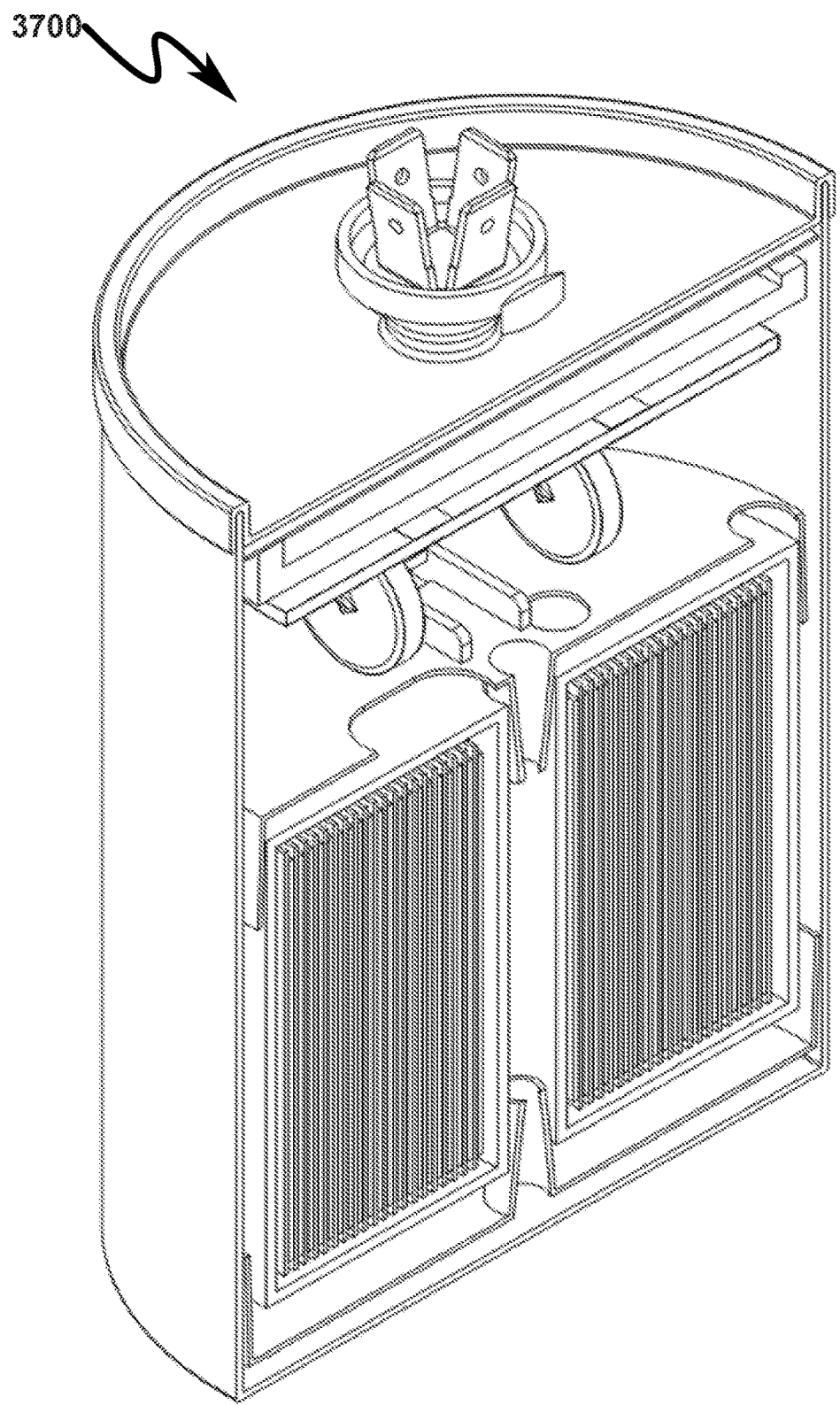
FIG. 37 illustrates a top right front perspective right section view of a preferred exemplary invention system embodiment implemented as an integrated cylindrical-form capacitor structure incorporating integral transient protection.
Figure 38:
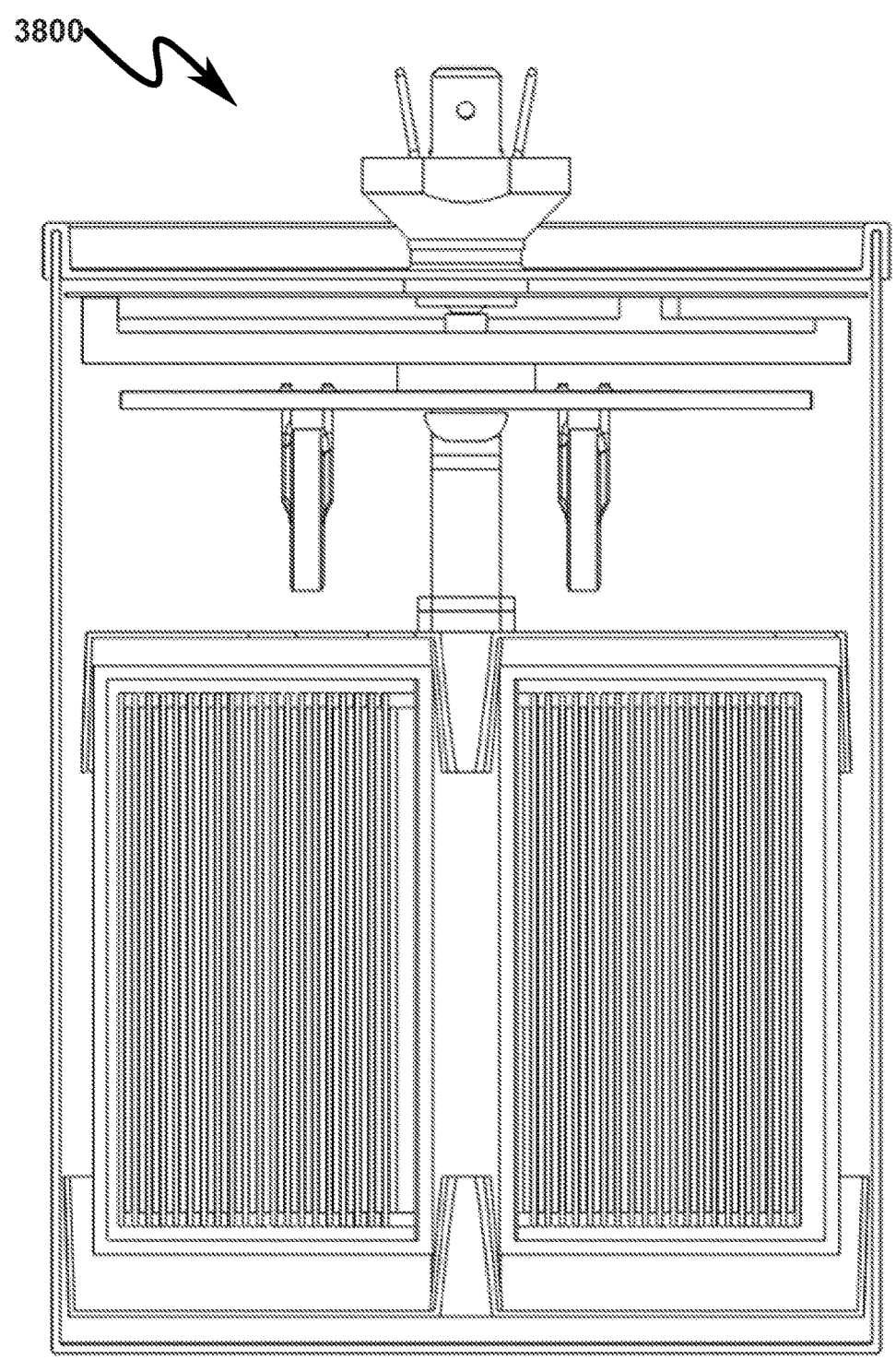
FIG. 38 illustrates a right section view of a preferred exemplary invention system embodiment implemented as an integrated cylindrical-form capacitor structure incorporating integral transient protection.

The teachings of the present invention may be applied to an integrated capacitor structure as well as retrofit applications. As generally depicted in FIG. 33 (3300)-FIG. 40 (4000), an integrated cylindrical capacitor structure may be constructed in which the overall capacitor system (3310) may comprise a capacitor enclosure (CPE) (3311) configured as a shell having an external open cavity end (OCE) and an internal open cavity void (OCV). The shell created by the OCV is configured to have sufficient volume to enclose a non-polarized capacitor (NPC) and printed circuit board (PCB) that contains protective circuitry for the NPC. The CPE (3311) is covered and sealed with a capacitor cover (CPC) (3312). The CPC (3312) supports and further comprises a first terminal connection (FTC) (3313) and a second terminal connection (STC) (3314) wherein the FTC and said STC are insulated (3315, 3316) from the CPC and extend through an outer surface of the CPC (3312).

Figure 40:
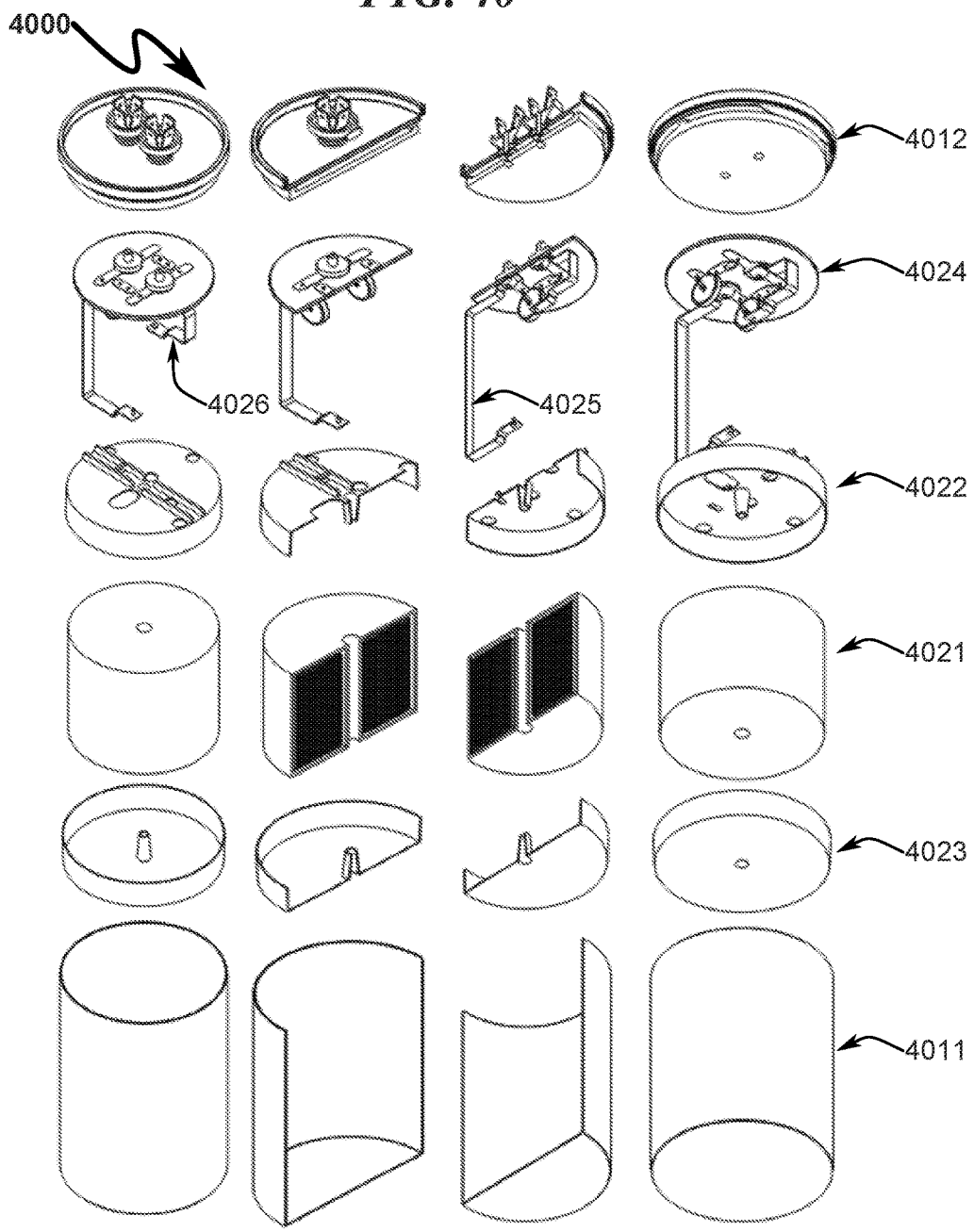
FIG. 40 illustrates a top right front perspective and bottom right front perspective assembly and section views of a preferred exemplary invention system embodiment implemented as an integrated cylindrical-form capacitor structure incorporating integral transient protection.

Assembly detail for this preferred exemplary embodiment is generally depicted in FIG. 40 (4000), where the capacitor enclosure (CPE) (4011) is depicted along with the capacitor cover (CPC) (4012) incorporating the FTC/STC. The NPC (4021) (section view of an exemplary roll-form non-polarized capacitor is provided in FIG. 39 (3900)) is separated from the capacitor enclosure (CPE) (4011) via the use of top (4022) and bottom (4023) insulating caps. The PCB assembly (4024) is depicted incorporating the diodes and TVS components assembled and is connected to the NPC (4021) via the use of internal wiring straps (4025, 4026). Rivets (3627, 3628) or other fastening means are utilized to attach the internal wiring straps (4025, 4026) to the PCB and make mechanical/electrical contact with the FTC/STC. One or more protective top insulators (3629) may be incorporated within the system, to provide additional arc flashover protection.

Exemplary Discrete Protective PCB (4100)-(4400)

Figure 41:
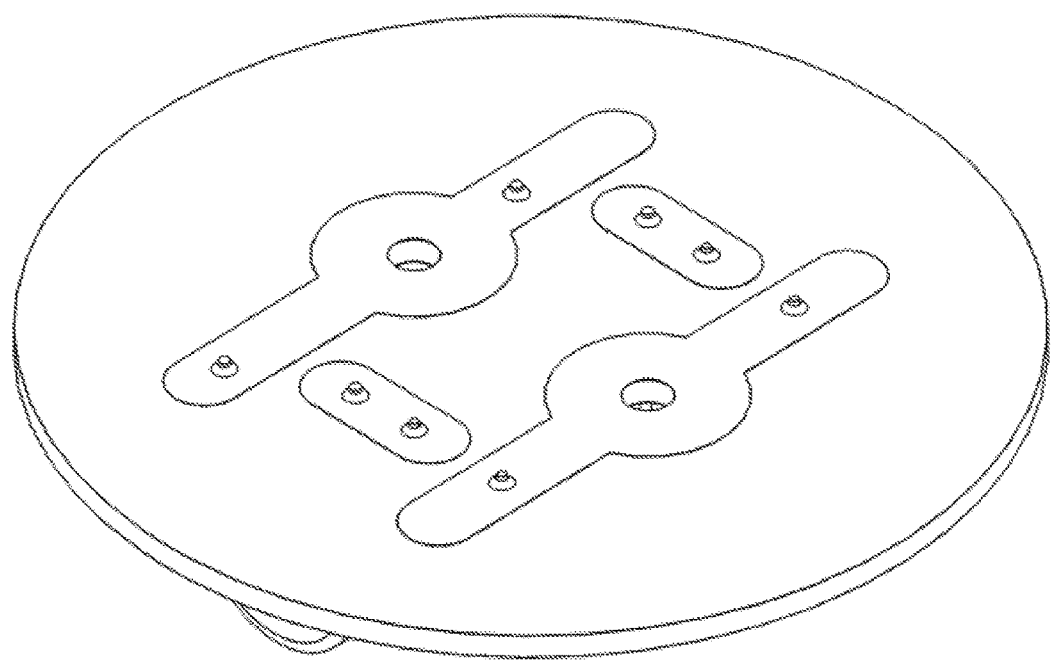
FIG. 41 illustrates a top right front perspective view of a preferred exemplary invention system embodiment implemented as an integrated protective structure on a printed circuit board (PCB) incorporating discrete diode and TVS protective components.
Figure 42:
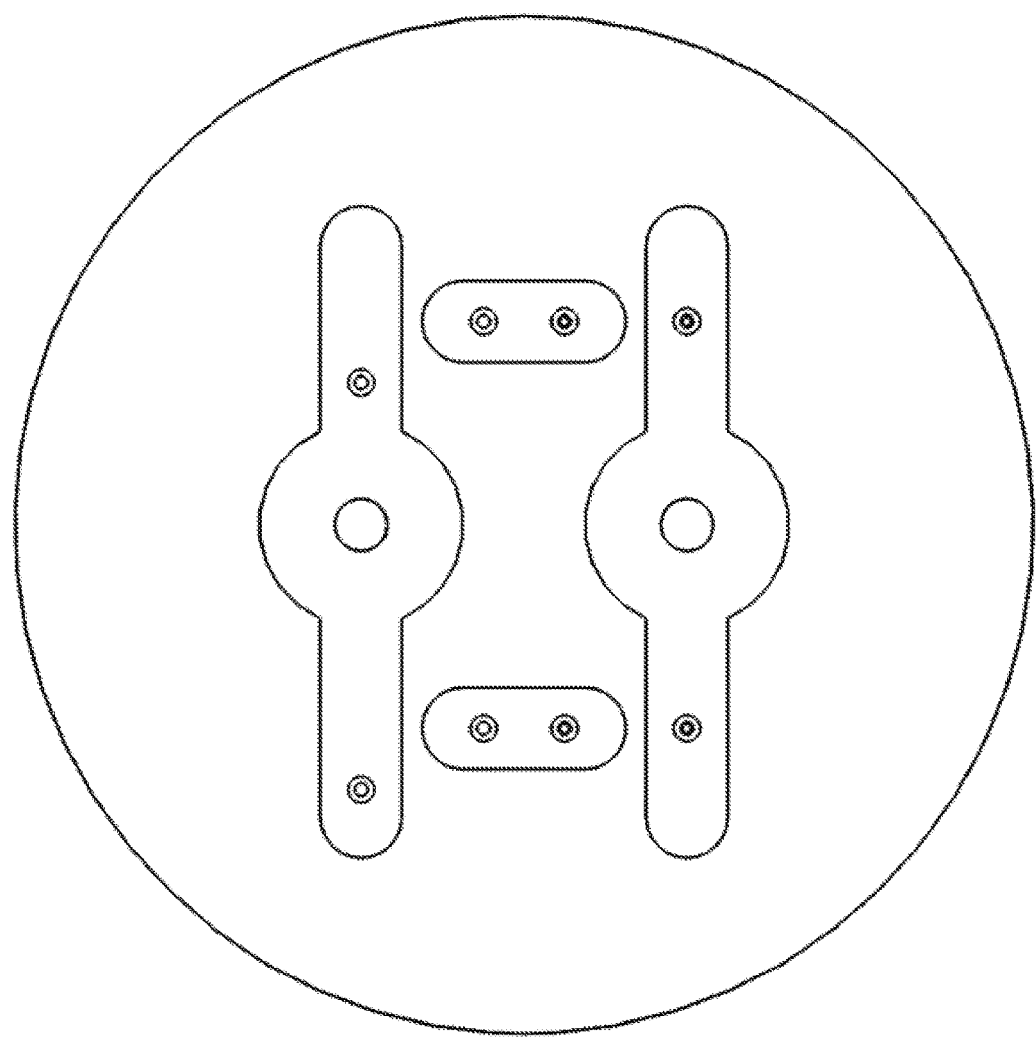
FIG. 42 illustrates a top view of a preferred exemplary invention system embodiment implemented as an integrated protective structure on a printed circuit board (PCB) incorporating discrete diode and TVS protective components.
Figure 43:
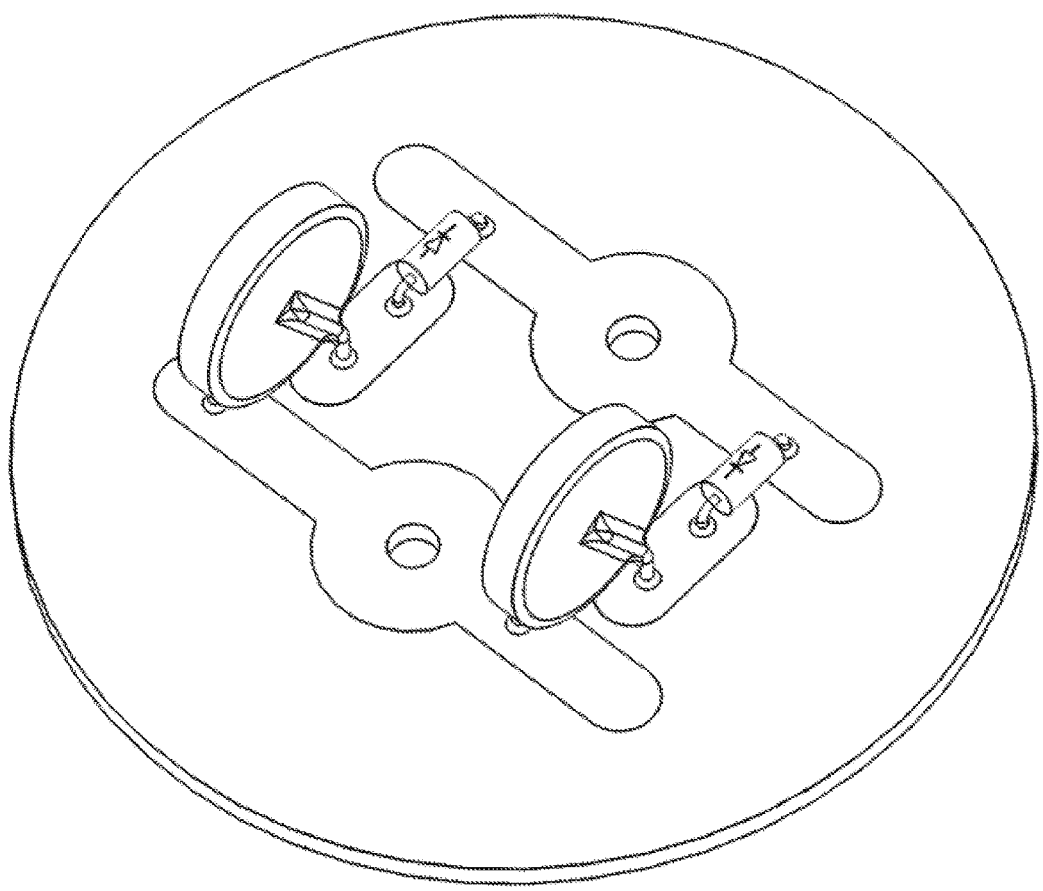
FIG. 43 illustrates a bottom right front perspective view of a preferred exemplary invention system embodiment implemented as an integrated protective structure on a printed circuit board (PCB) incorporating discrete diode and TVS protective components.
Figure 44:
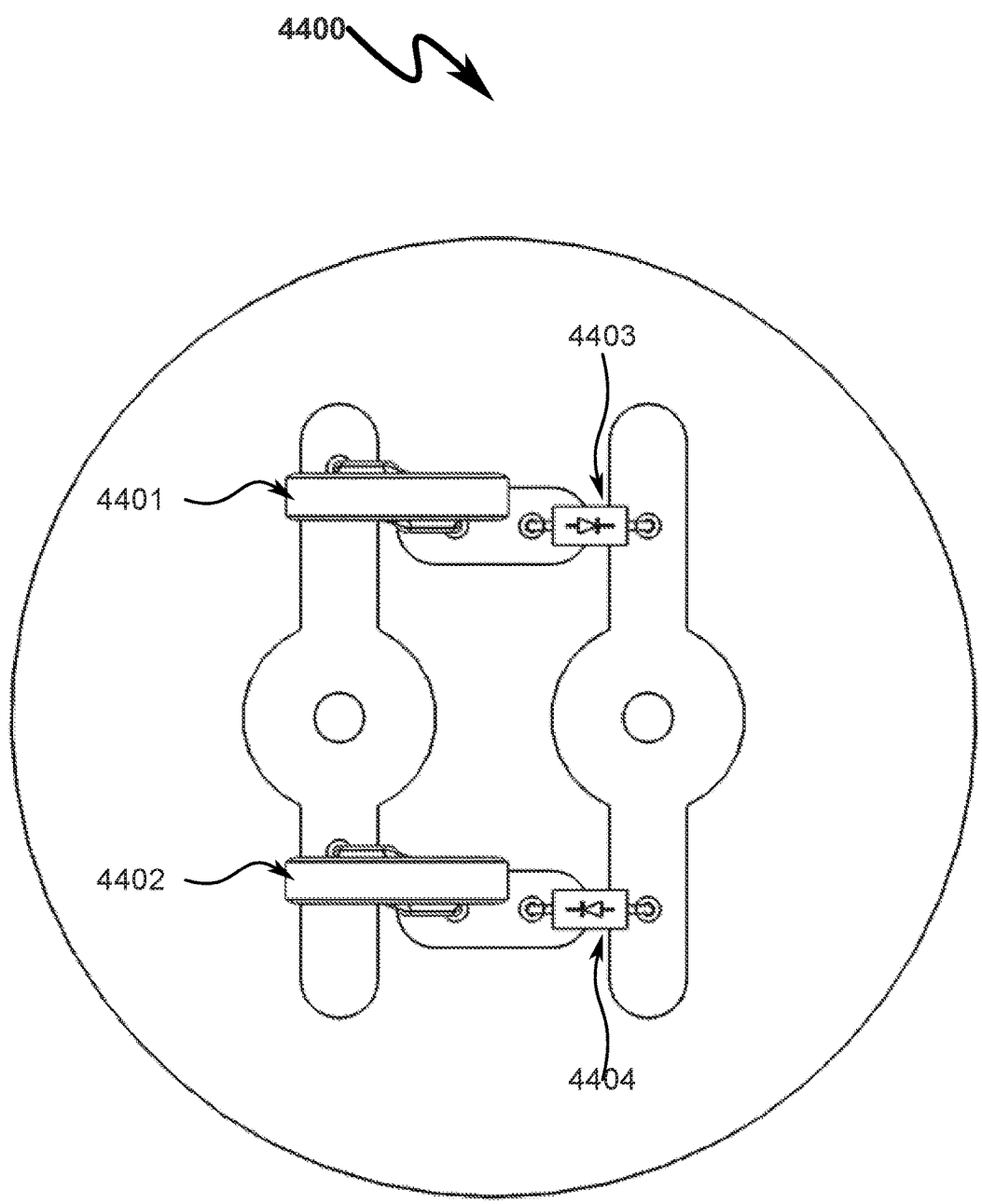
FIG. 44 illustrates a bottom view of a preferred exemplary invention system embodiment implemented as an integrated protective structure on a printed circuit board (PCB) incorporating discrete diode and TVS protective components.

While the integrated protective PCB assembly (4024) depicted in FIG. 33 (3300)-FIG. 40 (4000) may take many forms, one preferred discrete implementation is generally depicted in FIG. 41 (4100)-FIG. 44 (4400) wherein the protective structure comprises discrete TVS structures implemented as MOV devices (4401, 4402) in series with semiconductor P-N diode rectifiers (4403, 4404).

Exemplary Bridge Protective PCB (4500)-(4800)

Figure 45:
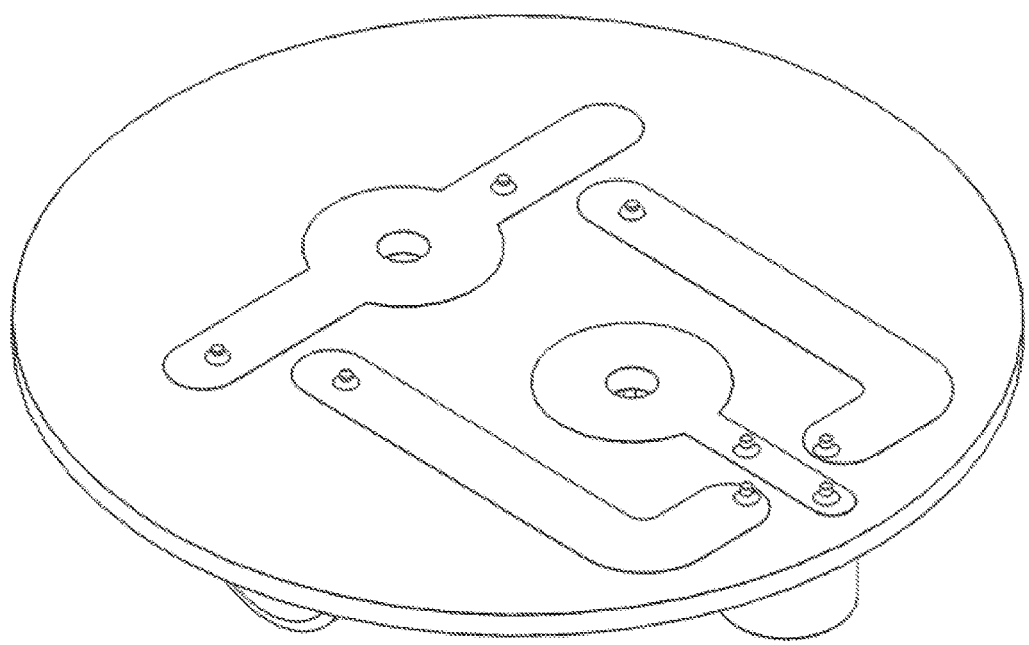
FIG. 45 illustrates a top right front perspective view of a preferred exemplary invention system embodiment implemented as an integrated protective structure on a printed circuit board (PCB) incorporating bridge rectifier diode and TVS protective components.
Figure 46:
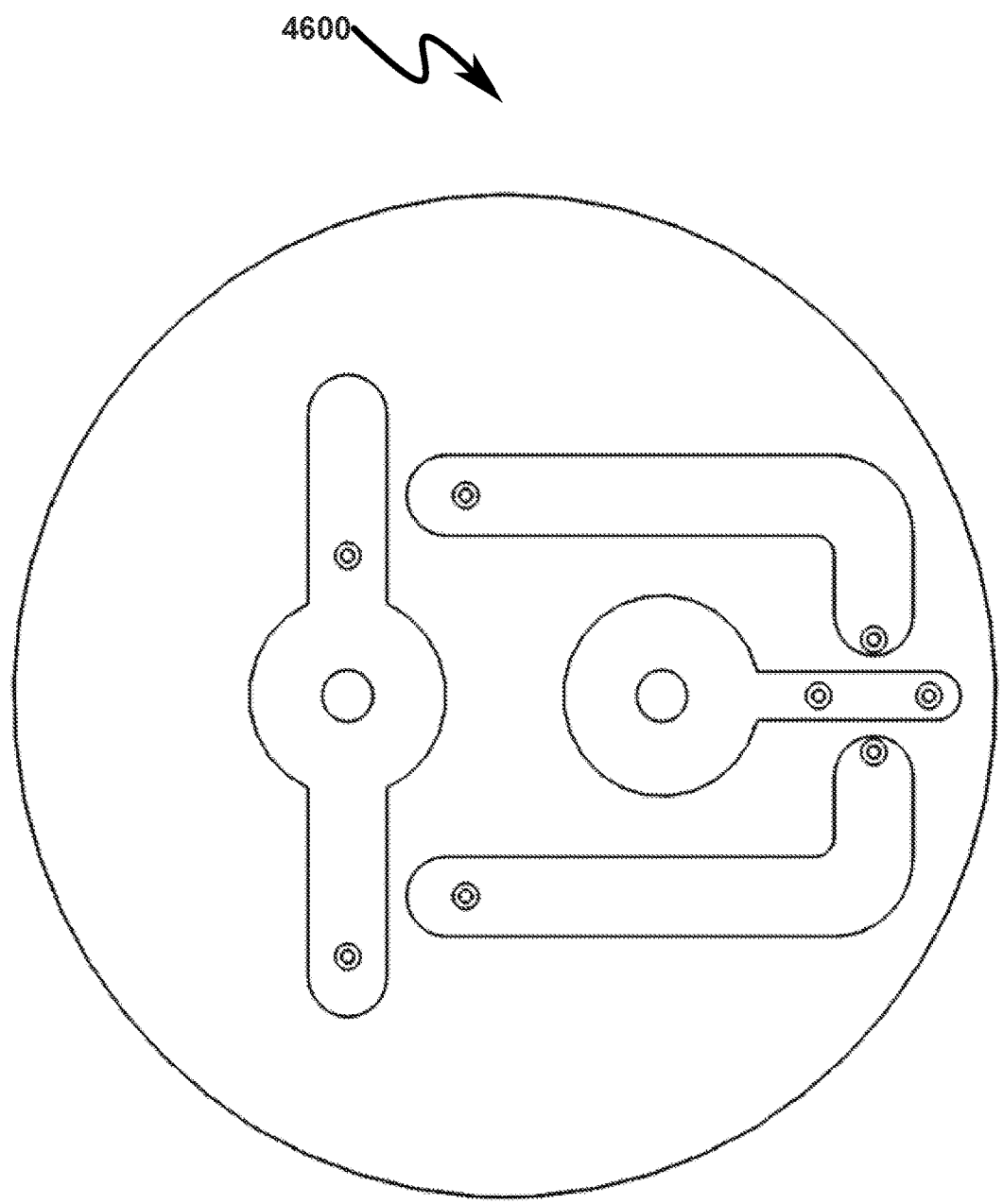
FIG. 46 illustrates a top view of a preferred exemplary invention system embodiment implemented as an integrated protective structure on a printed circuit board (PCB) incorporating bridge rectifier diode and TVS protective components.
Figure 47:
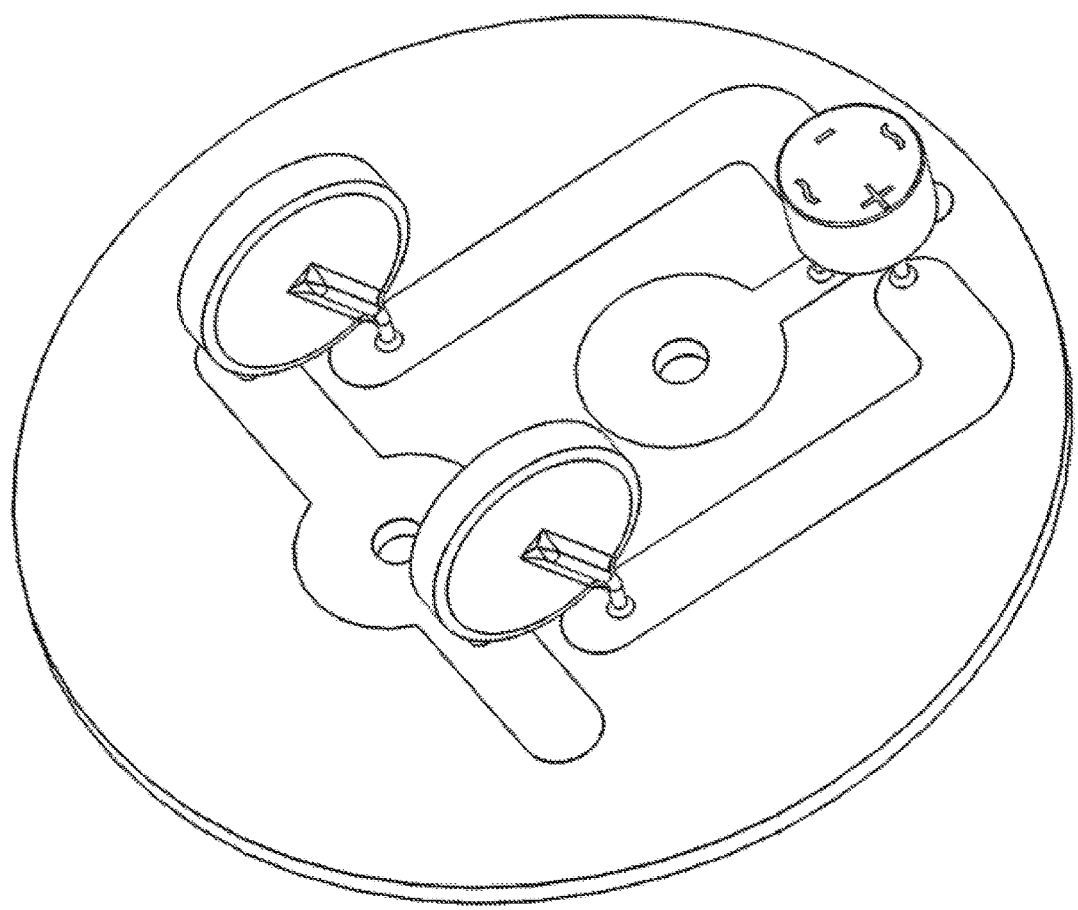
FIG. 47 illustrates a bottom right front perspective view of a preferred exemplary invention system embodiment implemented as an integrated protective structure on a printed circuit board (PCB) incorporating bridge rectifier diode and TVS protective components.
Figure 48:
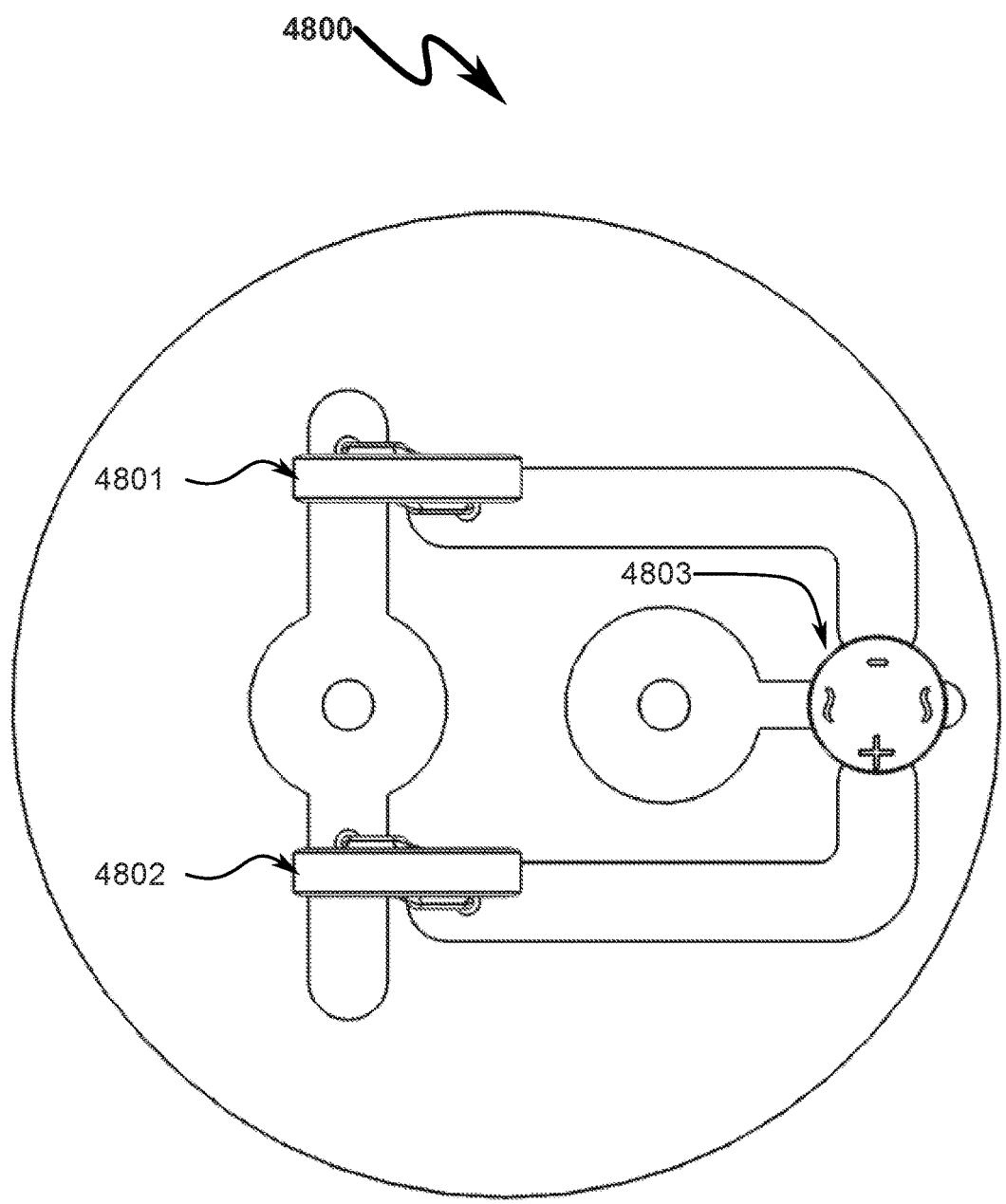
FIG. 48 illustrates a bottom view of a preferred exemplary invention system embodiment implemented as an integrated protective structure on a printed circuit board (PCB) incorporating bridge rectifier diode and TVS protective components.

While the integrated protective PCE assembly (4024) depicted in FIG. 33 (3300)-FIG. 40 (4000) may take many forms, one preferred bridge rectifier implementation is generally depicted in FIG. 45 (4500)-FIG. 48 (4800) wherein the protective structure comprises discrete TVS structures implemented as MOV devices (4801, 4802) in in conjunction with a bridge diode rectifier incorporating semiconductor P-N diodes (4803). This configuration may be more optimal in comparison to that depicted in FIG. 41 (4100)-FIG. 44 (4400) due to the reduced component count and cost reduction associated with the integrated bridge diode rectifier (4803).

Exemplary Integrated MOV+Diode Protective PCB (4900)-(5200)

Figure 49:
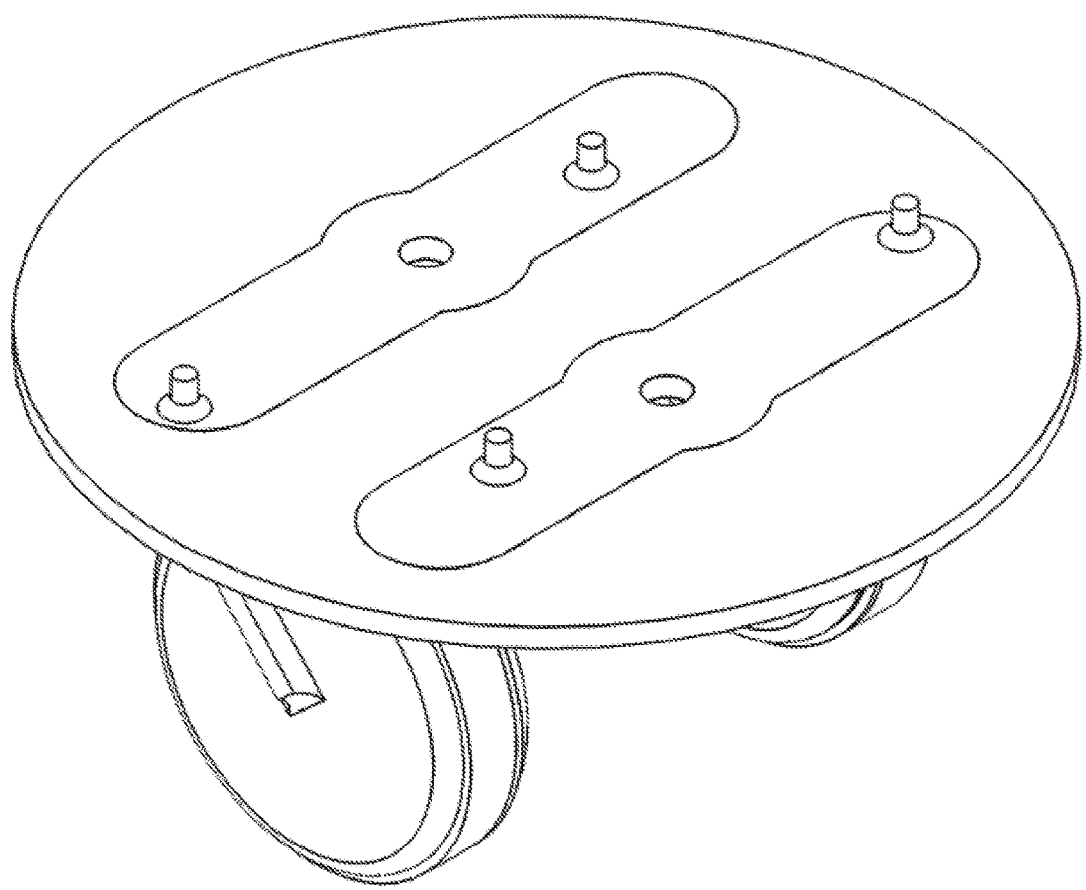
FIG. 49 illustrates a top right front perspective view of a preferred exemplary invention system embodiment implemented as an integrated protective structure on a printed circuit board (PCB) incorporating MOV+diode integrated protective devices.
Figure 50:
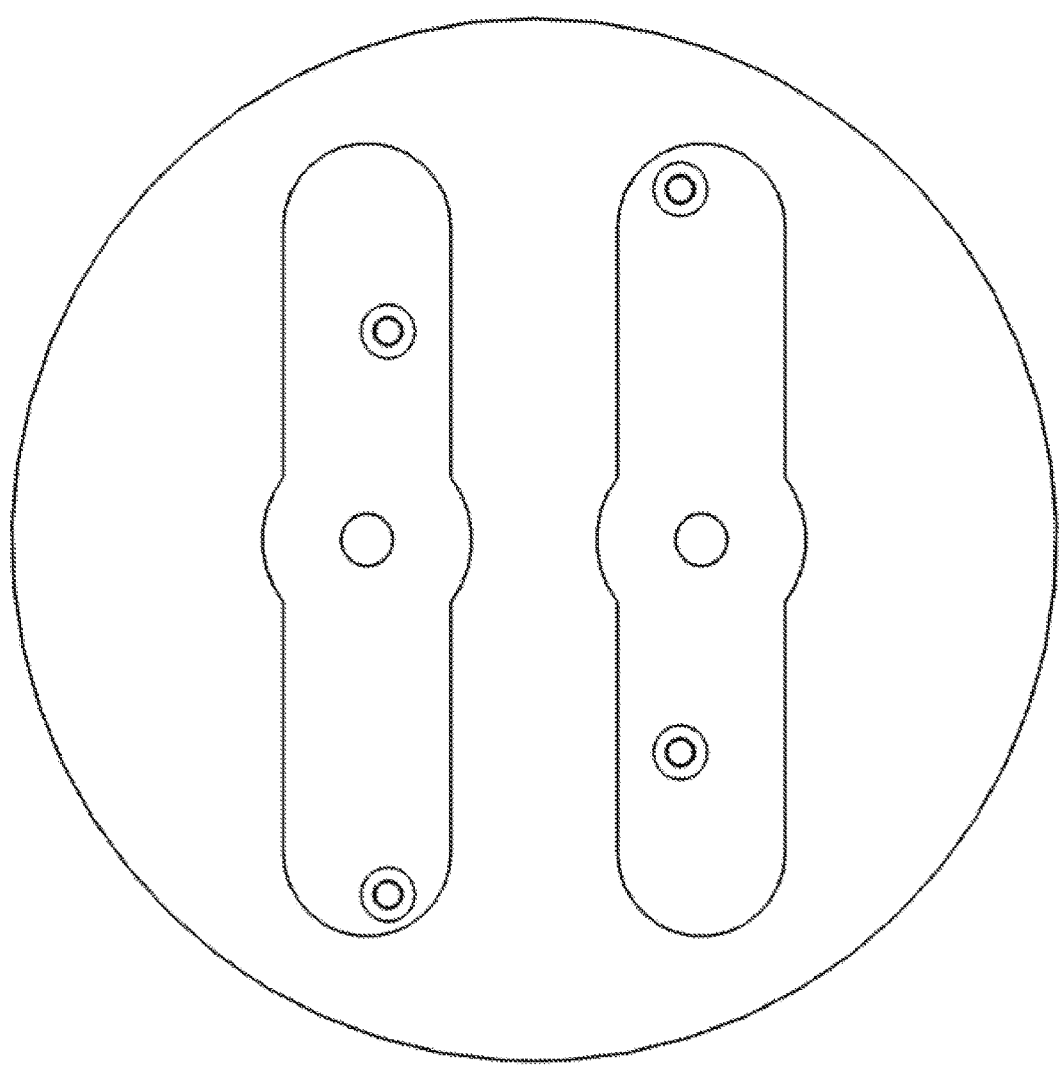
FIG. 50 illustrates a top view of a preferred exemplary invention system embodiment implemented as an integrated protective structure on a printed circuit board (PCB) incorporating MOV+diode integrated protective devices.
Figure 51:
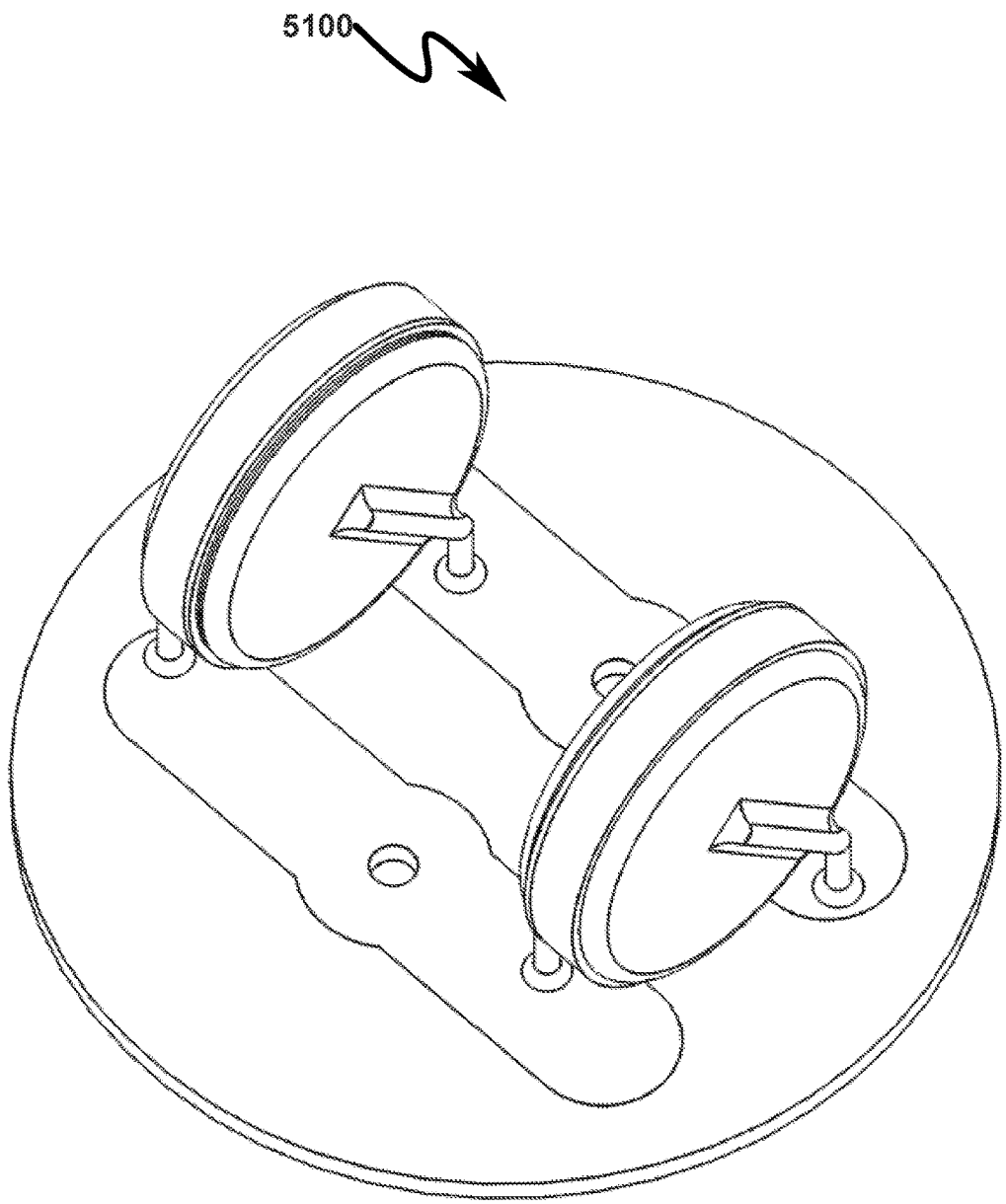
FIG. 51 illustrates a bottom right front perspective view of a preferred exemplary invention system embodiment implemented as an integrated protective structure on a printed circuit board (PCB) incorporating MOV+diode integrated protective devices.
Figure 52:
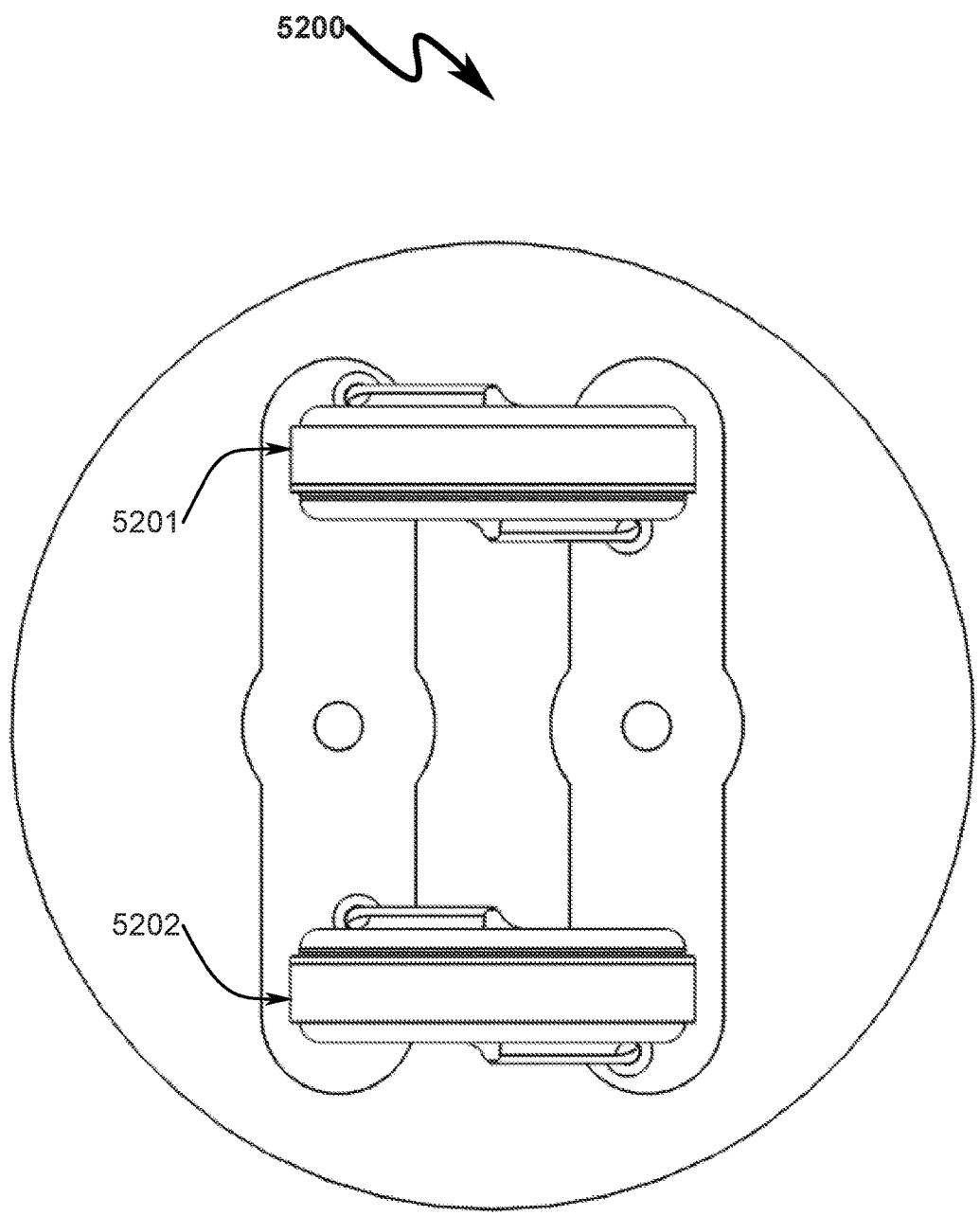
FIG. 52 illustrates a bottom view of a preferred exemplary invention system embodiment implemented as an integrated protective structure on a printed circuit board (PCB) incorporating MOV+diode integrated protective devices.
Figure 54:
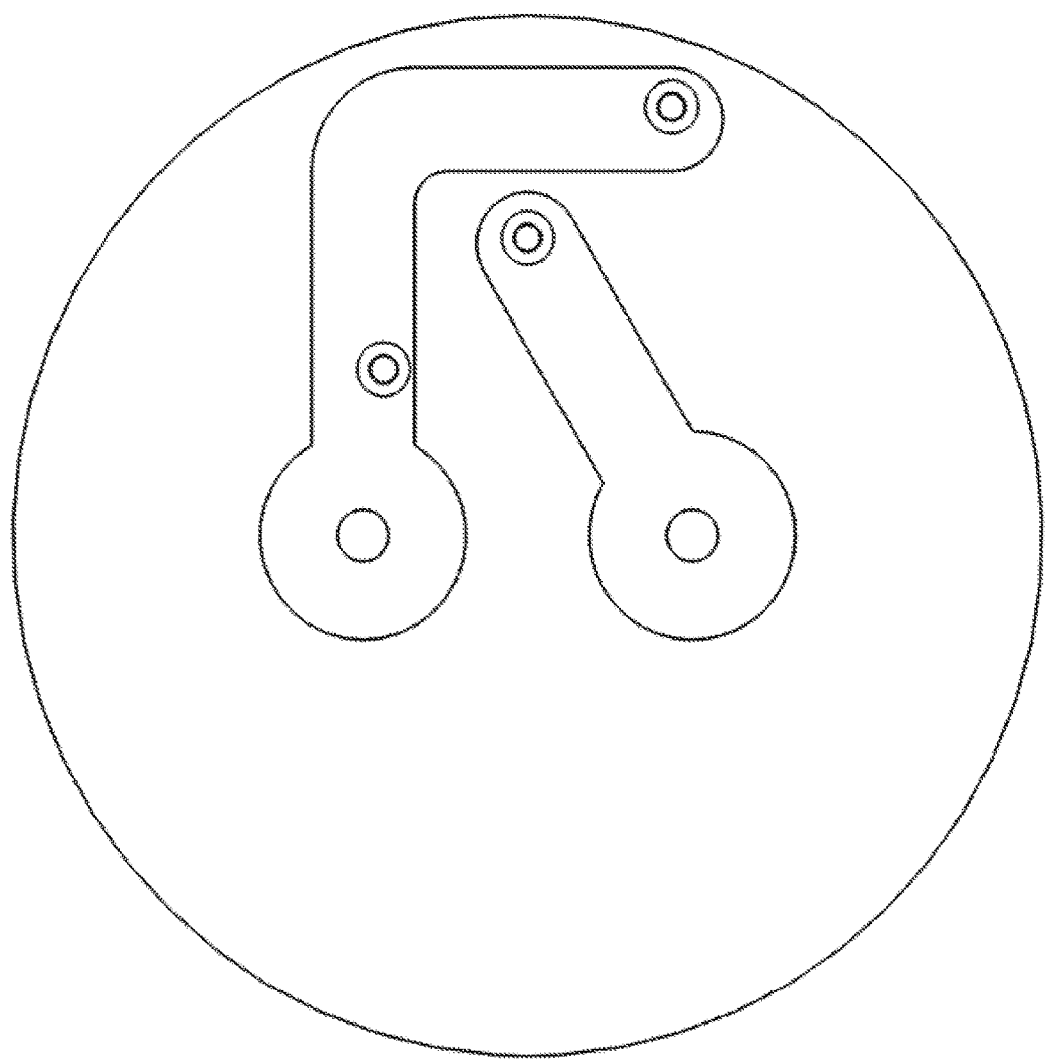
FIG. 54 illustrates a top view of a preferred exemplary invention system embodiment implemented as an integrated protective structure on a printed circuit board (PCB) incorporating an integrated MOV+PN+PN+MOV device.
Figure 55:
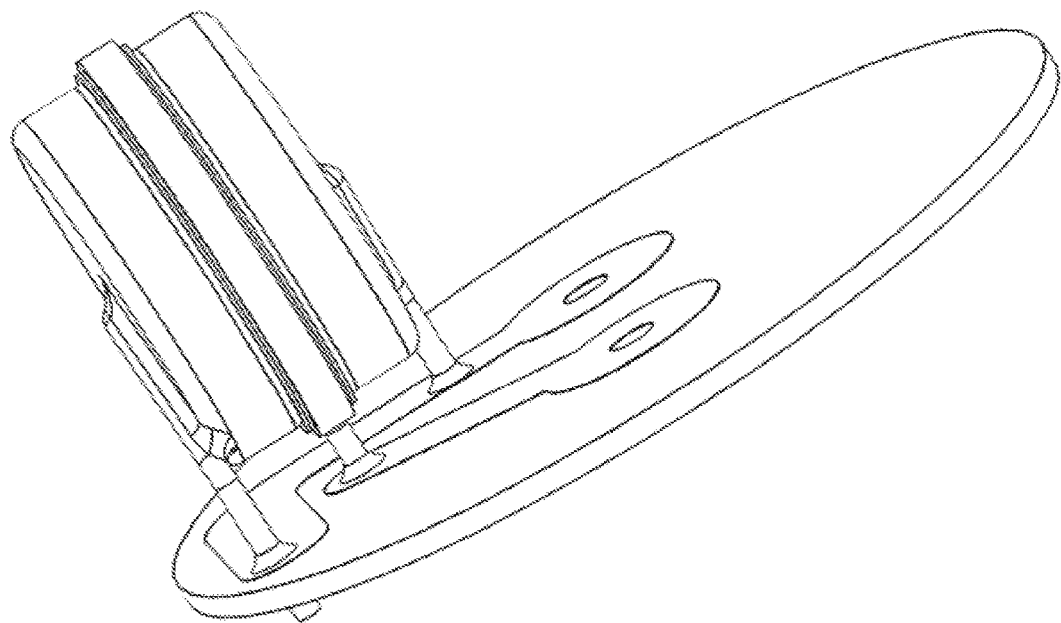
FIG. 55 illustrates a bottom right front perspective view of a preferred exemplary invention system embodiment implemented as an integrated protective structure on a printed circuit board (PCB) incorporating an integrated MOV+PN+PN+MOV device.

While the integrated protective PCB assembly (4024) depicted in FIG. 33 (3300)-FIG. 40 (4000) may take many forms, one preferred integrated MOV+diode implementation is generally depicted in FIG. 49 (4900)-FIG. 52 (5200) wherein the protective structure comprises integrated TVS structures implemented as MOV+diode (MOV+PN diode) devices (5201, 5202). This configuration may be more optimal in comparison to that depicted in FIG. 45 (4500)-FIG. 48 (4800) due to the reduced component count and cost reduction associated with the integrated MOV+diode devices (5201, 5202). These MOV+diode devices are described in more detail in the documents incorporated by reference in this patent application.

Exemplary Integrated MOV+PN+PN+MOV Protective PCB (5300)-(5600)

Figure 56:
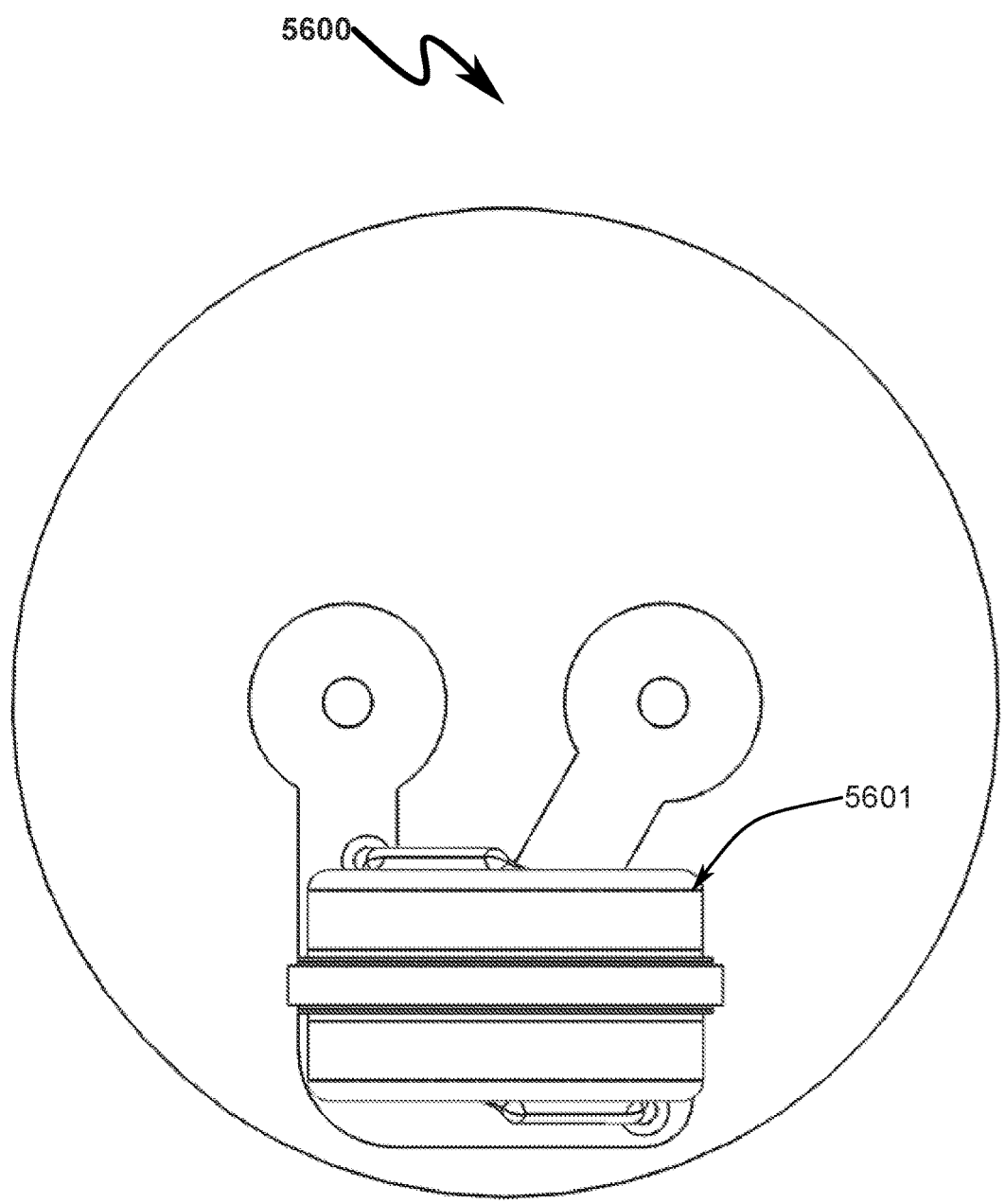
FIG. 56 illustrates a bottom view of a preferred exemplary invention system embodiment implemented as an integrated protective structure on a printed circuit board (PCB) incorporating an integrated MOV+PN+PN+MOV device.
Figure 59:
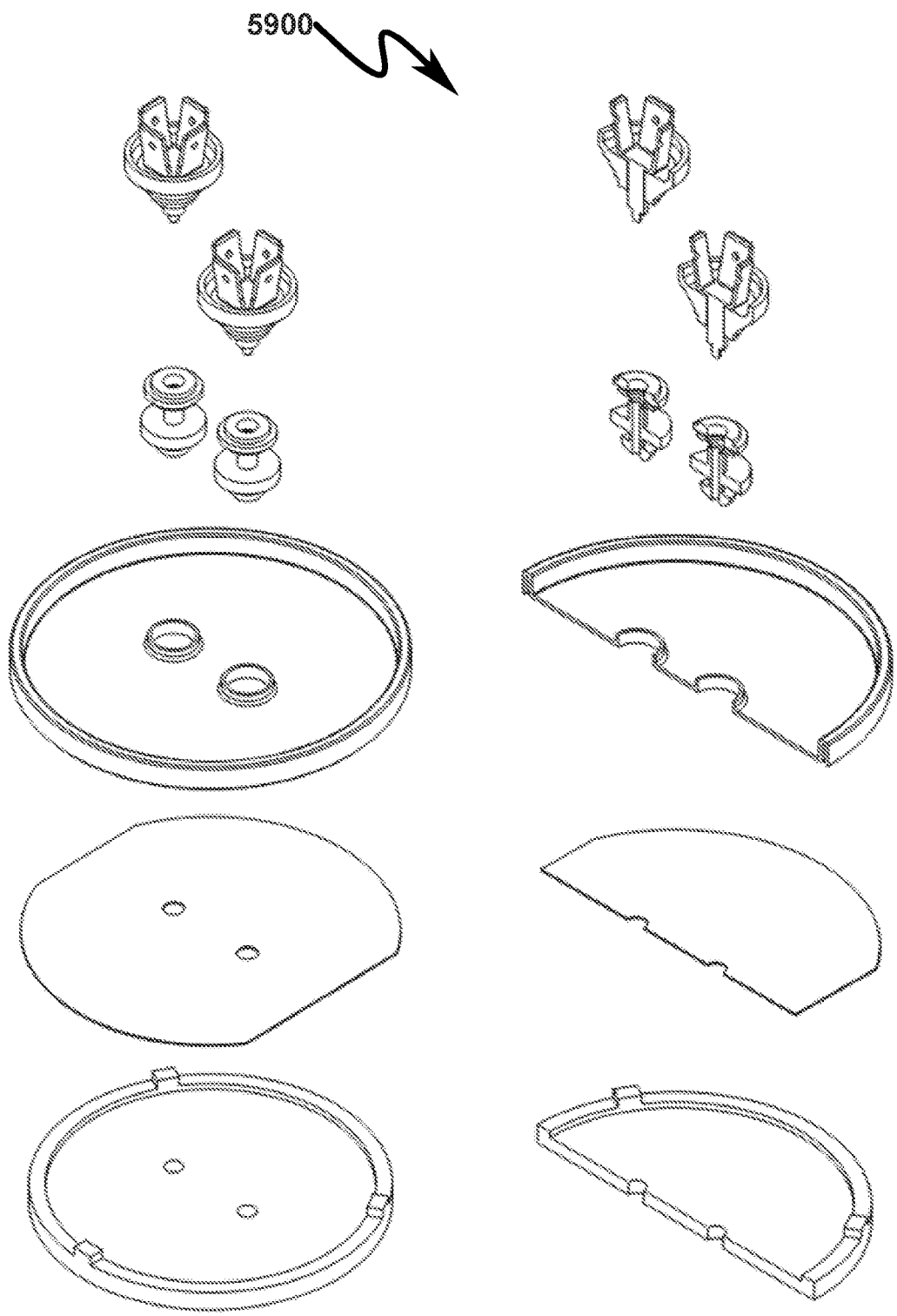
FIG. 59 illustrates a top right front perspective assembly view a of a preferred exemplary invention integrated capacitor system embodiment implemented detailing the capacitor cover, terminal posts, insulating spacers, and conductive connectors.

While the integrated protective PCB assembly (4024) depicted in FIG. 33 (3300)-FIG. 40 (4000) may take many forms, one preferred integrated MOV+PN+PN+MOV implementation is generally depicted in FIG. 53 (5300)-FIG. 56 (5600) wherein the protective structure comprises integrated TVS structures implemented as a single integrated MOV+PN+PN+MOV (MOV+PN diode+FN diode+MOV) device (5601). This configuration may be more optimal in comparison to that depicted in FIG. 45 (4500)-FIG. 48 (4800) due to the reduced component count, and cost reduction associated with the integrated MOV+PN+PN+MOV devices (5601). These MOV+PN+PN+MOV devices are described in more detail in the documents incorporated by reference in this patent application. In some application contexts the PCB may be omitted and wire terminals of the MOV+PN+PN+MOV device may be directly attached to the capacitor structure and/or external spade lug terminals of the overall capacitor cap/enclosure system.

Capacitor Cover Detail (5700)-(6000)

Figure 60:
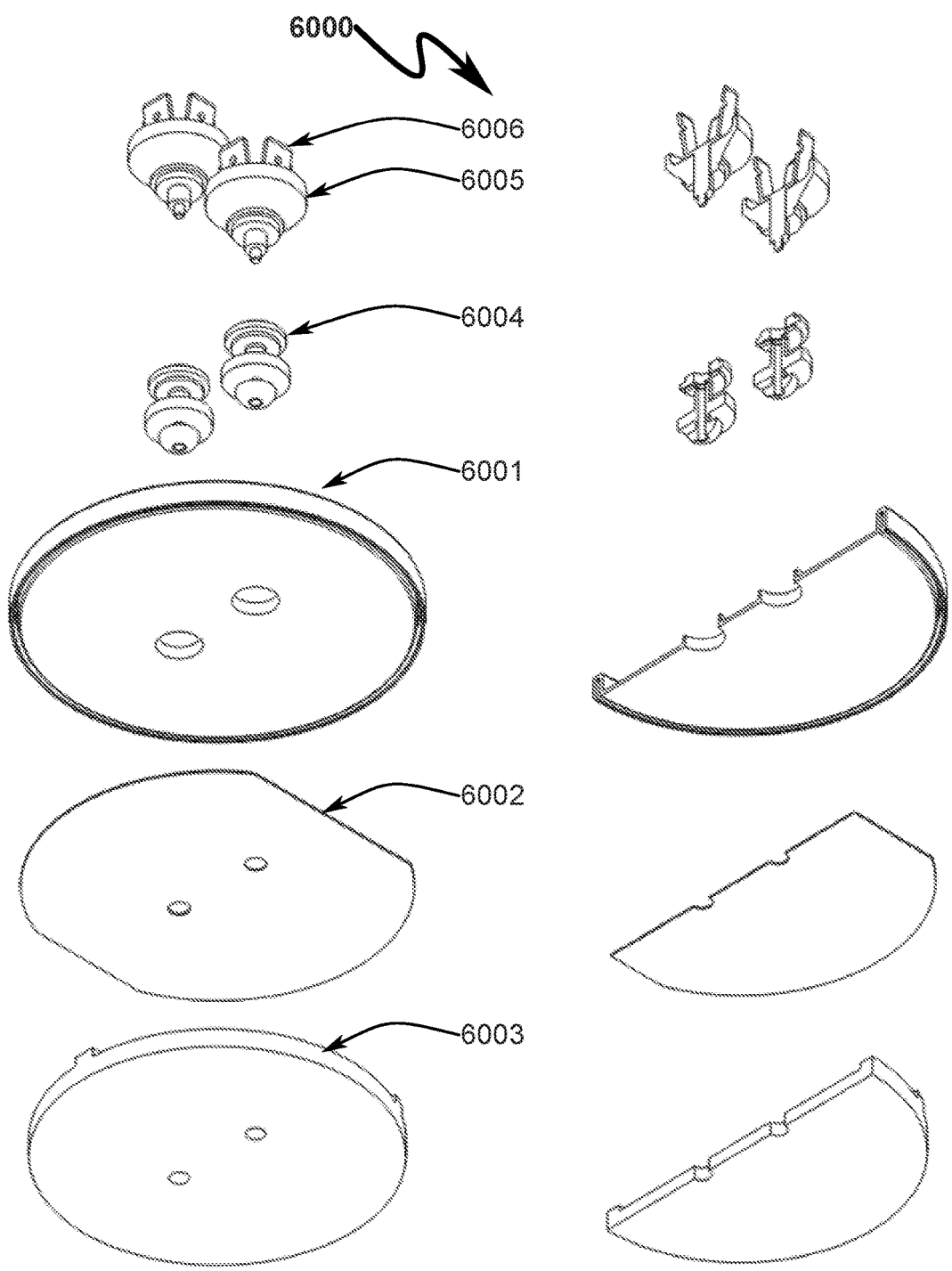
FIG. 60 illustrates a bottom right front perspective assembly view a of a preferred exemplary invention integrated capacitor system embodiment implemented detailing the capacitor cover, terminal posts, insulating spacers, and conductive connectors.

Additional detail of an exemplary capacitor cover structure including insulators and terminal connectors is provided in FIG. 57 (5700)-FIG. 60 (6000). The assembly view of FIG. 60 (8000) illustrates the capacitor cover (6001), top flashover insulator (6002), top cover insulator (6003), conductive capacitor contacts (6004) that connect wiring to the actual internal roll capacitor structure, contact insulators (6005), and spade lug connectors (6006). While this construction is exemplary, one skilled in the art will no doubt be able to utilize the invention teachings over a wide range of application contexts including both cylindrical-form and stadium-form capacitor enclosures.

Capacitor Top/Bottom Insulators (6100)-(6200)

Figure 61:
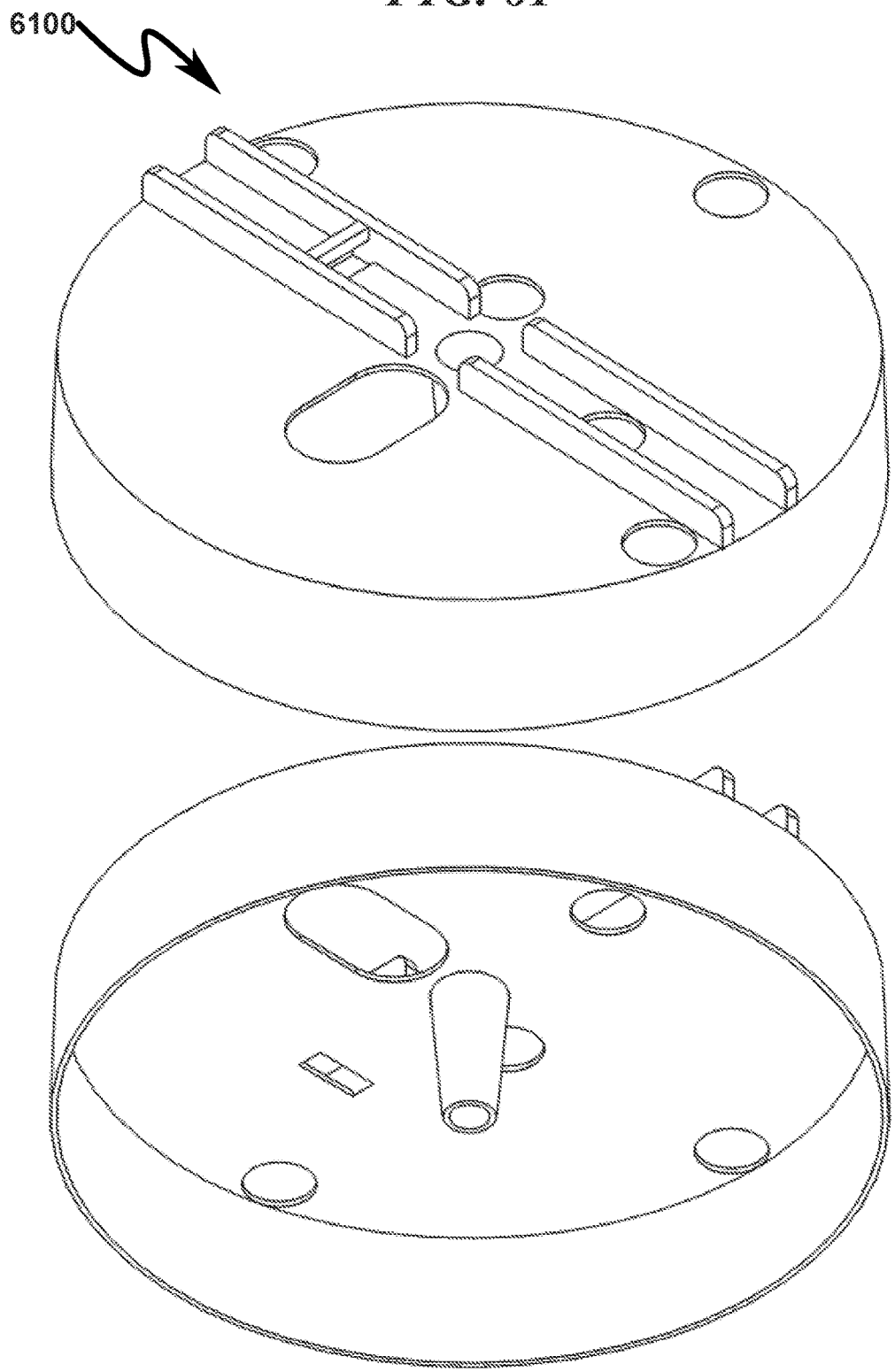
FIG. 61 illustrates a top right front perspective view and a bottom right front perspective view of a preferred exemplary invention integrated capacitor system embodiment implemented detailing the upper capacitor insulating cap spacer.
Figure 62:
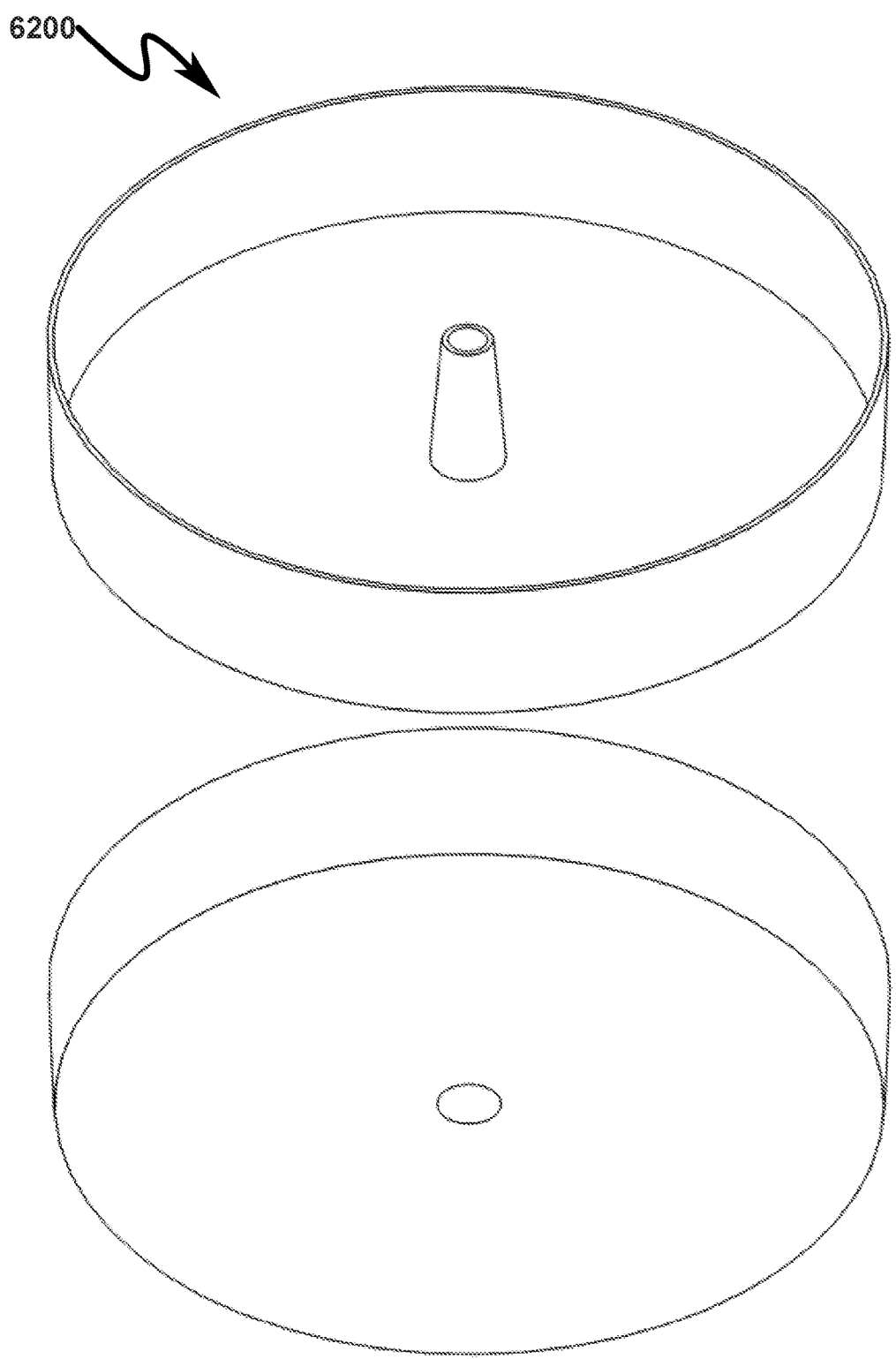
FIG. 62 illustrates a top right front perspective view and a bottom right front perspective view of a preferred exemplary invention integrated capacitor system embodiment implemented detailing the lower capacitor insulating cap spacer.

Additional detail of exemplary capacitor top and bottom cup insulators used within the integrated protected capacitor system are provided in FIG. 61 (6100)-FIG. 62 (6200). These structures as implemented and assembled in FIG. 40 (4000) ensure that the internal capacitor roll does not electrically contact the capacitor enclosure or capacitor cover.

Retrofit Protected Capacitor Method Overview (6300)

Figure 63:
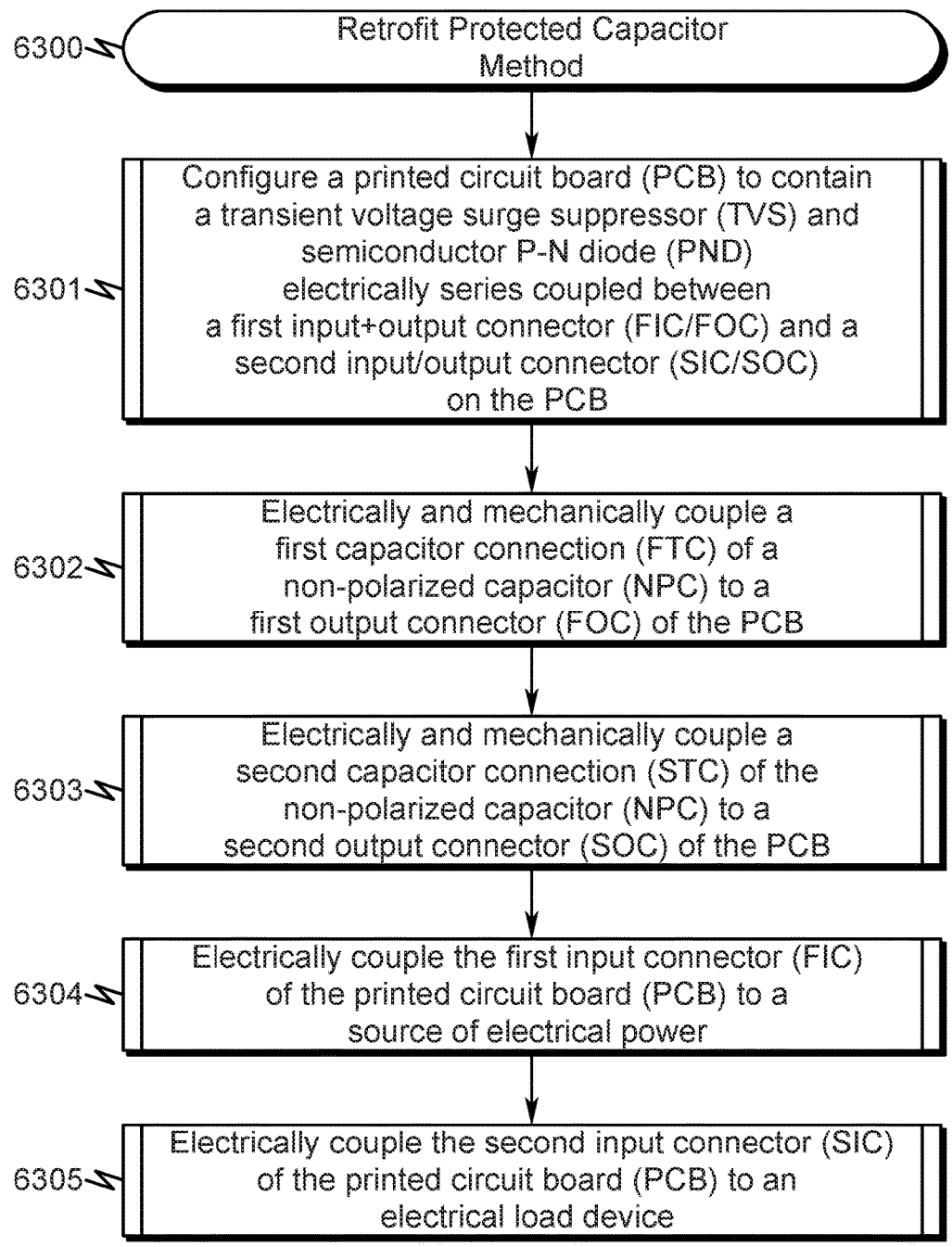
FIG. 63 illustrates a flowchart depicting a preferred exemplary invention method supporting retrofitting of existing capacitors to produce a protected capacitor system.

The present invention retrofit application method may be seen in an overview context as generally illustrated in the flowchart of FIG. 63 (6300), and can be generally described as protected capacitor method that comprises the following method steps:

(1) configuring a printed circuit board (PCB) to contain a transient voltage surge suppressor (TVS) and semiconductor P-N diode (PND) electrically series coupled between a first input connector (FIC)/first output connector (FOC) and a second input connector (SIC)/ second output connector (SOC) on the PCB (6301);

(2) electrically and mechanically coupling a first capacitor connection (FTC) of a non-polarized capacitor (NPC) to a first output connector (FOC) of the PCB (6302);

(3) electrically and mechanically coupling a second capacitor connection (STC) of the non-polarized capacitor (MFC) to a second output connector (SOC) of the PCB (6303);

(4) electrically coupling the first input connector (FIC) of the printed, circuit board (PCB) to a source of electrical power (6304); and (5) electrically coupling the second input connector (SIC) of the printed circuit board (PCB) to an electrical load device (6305).

One skilled in the art will recognize that these method steps may be augmented or rearranged without limiting the teachings of the present invention.

Integrated Protected Capacitor Method Overview (6400)

The present, invention integrated capacitor application method may be seen in an overview context as generally illustrated in the flowchart of FIG. 64 (6400), and can be generally described as protected capacitor method that comprises the following method steps:

(1) placing a non-polarized capacitor (NPC) and printed circuit board (PCB) comprising a transient voltage surge suppressor (TVS) and semiconductor P-N diode (PND) within a capacitor enclosure (CPE) shell comprising an open cavity end (OCE) and an open cavity void (OCV) (6401);

(2) electrically coupling a first terminal connection (FTC) of the capacitor cover (CPC) to a first input connector (FIC) of the PCB (6402);

(3) electrically coupling a second terminal connection (STC) of the capacitor cover (CPC) to a second input connector (SIC) of the PCB (6403);

(4) covering the open cavity end (OCE) of the capacitor enclosure (CPE) with a capacitor cover (CPC) and sealing the capacitor cover (CPC) to the capacitor enclosure (CPE) (6404);

(5) configuring the capacitor cover (CPC) to electrically couple a first terminal connection (FTC) of the capacitor cover (CPC) to a source of electrical power (6405); and (6) configuring the capacitor cover (CPC) to electrically couple a second terminal connection (STC) of the capacitor cover (CPC) to an electrical load device (6406).

One skilled in the art will recognize that these method steps may be augmented or rearranged without limiting the teachings of the present invention.

Preferred Embodiment System Summary

The present invention preferred exemplary system embodiment can be generalized as protected capacitor retrofit system comprising:

(a) non-polarized capacitor (NPC);
(b) printed circuit board (FOB);
(c) transient voltage surge suppressor (TVS); and
(d) semiconductor P-N diode (PND);
wherein:
the NPC comprises a capacitor enclosure (CPE) and a capacitor cover (CPC);

the NPC comprises a first capacitor connection (FTC) and a second capacitor connection (STC);
the TVS comprises a first TVS connection (FVC) and a second TVS connection (SVC);
the PND comprises a first PND connection (FPC) and a second PND connection (SPC);
the SVC is electrically coupled to the FPC via metal traces on the PCB;
the TVS and the PND form a surge suppression device (SSD) having a first SSD terminal (FDC) electrically coupled to the FVC and a second SSD terminal (SDC) electrically coupled to the SPC;
the PCB comprises a first input connector (FIC), a second input connector (SIC), a first output connector (FOC), and a second output connector (SOC);
the PCB comprises metal traces configured to electrically couple the FIC, the FOC, and the FDC;
the PCB comprises metal traces configured to electrically couple the SIC, the SOC, and the SDC;
the FTC is electrically coupled to the FOC; and
the STC is electrically coupled to the SOC.

This general system summary may be augmented by the various elements described herein to produce a wide variety of invention embodiments consistent with this overall design description, Preferred Embodiment Method Summary The present invention preferred exemplary method embodiment can be generalized as protected capacitor retrofit method wherein the method utilizes a protected capacitor system comprising:

(a) non-polarized capacitor (NPC);
(b) printed circuit board (PCB);
(c) transient voltage surge suppressor (TVS); and
(d) semiconductor P-N diode (PND);
wherein:
the NPC comprises a capacitor enclosure (CPE) and a capacitor cover (CPC);
the NPC comprises a first capacitor connection (FTC) and a second capacitor connection (STC);
the TVS comprises a first TVS connection (FVC) and a second TVS connection (SVC);
the PND comprises a first PND connection (FPC) and a second PND connection (SPC);
the SVC is electrically coupled to the FPC via metal traces on the PCB;
the TVS and the PND form a surge suppression device (SSD) having a first SSD terminal (FDC) electrically coupled to the FVC and a second SSD terminal (SDC) electrically coupled to the SPC;
the PCB comprises a first input connector (FIC), a second input connector (SIC), a first output connector (FOC), and a second output connector (SOC);
the PCB comprises metal traces configured to electrically couple the FIC, the FOC, and the FDC;
the PCB comprises metal traces configured to electrically couple the SIC, the SOC, and the SDC;
the FTC is electrically coupled to the FOC; and
the STC is electrically coupled to the SOC;
with the method of comprising the steps of:
(1) configuring the PCB to mechanically couple the FOC to the FTC;
(2) configuring the PCB to mechanically couple the SOC to the STC;
(3) configuring the PCB to electrically couple the FIC to a source of electrical power: and (4) configuring the PCB to electrically couple the SIC to an electrical load device.

One skilled in the art will recognize that these method steps may be augmented or rearranged without limiting the teachings of the present invention.

Alternate Preferred Embodiments Systems Summary

An alternate present invention preferred exemplary system embodiment can be generalized as an integrated protected capacitor system comprising:
(a) capacitor enclosure (CPE);
(b) capacitor cover (CPC);
(c) non-polarized capacitor (NPC);
(d) printed circuit board (PCB);
(e) transient voltage surge suppressor (TVS); and
(f) semiconductor P-N diode (PND);
wherein:
the CPE is configured as a shell having an open cavity end (OCE) and an open cavity void (OCV) configured to contain the NPC and the PCB;
the CPC is configured to cover and seal the OCE;
the NPC and the PCB are contained within the OCV;
the CPC comprises a first terminal connection (FTC) and a second terminal connection (STC);
the FTC and the STC are insulated from the CPC and extend through an outer surface of the CPC;
the NPC comprises a first capacitor connection (FCC) and a second capacitor connection (SCC);
the TVS comprises a first TVS connection (FVC) and a second TVS connection (SVC);
the PND comprises a first PND connection (FPC) and a second PND connection (SPC);
the SVC is electrically coupled to the FPC via metal traces on the PCB;
the TVS and the PND form a surge suppression device (SSD) having a first SSD terminal (FDC) electrically coupled to the FVC and a second SSD terminal (SDC) electrically coupled to the SPC;
the PCB comprises a first input connection (FIC), a second input connection (SIC), a first output connection (FOC), and a second output connection (SOC);
the PCB comprises metal traces configured to electrically couple the FTC, the FIC, the FOC, and the FDC;
the PCB comprises metal traces configured to electrically couple the STC, the SIC, the SOC, and the SDC;
the FCC is electrically coupled to the FOC; and
the SCC is electrically coupled to the SOC.

This general system summary may be augmented by the various elements described herein to produce a wide variety of invention embodiments consistent with this overall design description.

Alternate Preferred Embodiment Method Summary

An alternate present invention preferred exemplary method embodiment can be generalized as an integrated protected capacitor method wherein the method utilizes a protected capacitor system comprising:
(a) capacitor enclosure (CPE);
(b) capacitor cover (CPC);
(c) non-polarized capacitor (NPC);
(d) printed circuit board (PCB);
(e) transient voltage surge suppressor (TVS); and
(f) semiconductor P-N diode (PND);
wherein:
the CPE is configured as a shell having an open cavity end (OCE) and an open cavity void (OCV) configured to contain the NPC and the PCB;
the CPC is configured to cover and seal the OCE;
the NPC and the PCB are contained within the OCV;
the CPC comprises a first terminal connection (FTC) and a second terminal connection (STC);
the FTC and the STC are insulated from the CPC and extend through an outer surface of the CPC;
the NPC comprises a first capacitor connection (FCC) and a second capacitor connection (SCC);
the TVS comprises a first TVS connection (FVC) and a second TVS connection (SVC);
the PND comprises a first PND connection (FPC) and a second PND connection (SPC);
the SVC is electrically coupled to the FPC via metal traces on the PCB;
the TVS and the PND form a surge suppression device (SSD) having a first SSD terminal (FDC) electrically coupled to the FVC and a second SSD terminal (SDC) electrically coupled to the SPC;
the PCB comprises a first input connection (FIC), a second input connection (SIC), a first output connection (FOC), and a second output connection (SOC);
the PCB comprises metal traces configured to electrically couple the FTC, the FIC, the FOC, and the FDC;
the PCB comprises metal traces configured to electrically couple the STC, the SIC, the SOC, and the SDC;
the FCC is electrically coupled to the FOC; and
the SCC is electrically coupled to the SOC;
with the method comprising the steps of:
(1) placing the NPC, the PCB, and the SSD within the CPE;
(2) covering the OCE of the CPE with the CPC and sealing the CPC to the CPE;
(3) configuring the CPC to electrically couple the FTC to a source of electrical power; and
(4) configuring the CPC to electrically couple the STC to an electrical load device.

One skilled in the art will recognize that these method steps may be augmented or rearranged without limiting the teachings of the present invention, System/Method Variations It will be evident to those skilled in the art that there has been described herein an improved method and apparatus for connecting to, and supplying power for, a device or appliance that is protected by certain surge suppression circuits. Although the invention hereof has been described by way of preferred embodiments, it is evident that other adaptations and modifications can be employed without departing from the spirit and scope thereof.

The present invention anticipates a wide variety of variations in the basic theme of construction. The examples presented previously do not represent the entire scope of possible usages. They are meant to cite a few of the almost limitless possibilities. The basic system and method described above may be augmented with a variety of ancillary embodiments, including but not limited to:

An embodiment wherein the FTC comprises a male spade lug connector and the STC comprises a male spade lug connector.

An embodiment wherein the FIC comprises a male spade lug connector, the SIC comprises a male spade leg connector, the FOC comprises a female spade lug connector, and the SOC comprises a female spade lug connector.

An embodiment wherein the SSD further comprises parallel connection to a second metal oxide varistor (SMV) and a second semiconductor P-N diode (SPN) that are connected in series wherein the parallel connection of the series connected SMV and the SPN such that the SPN is in an opposite polarity orientation to the orientation of the series connection of the PHD and the TVS within the SSD.

An embodiment wherein the PND comprises a Schottky diode rectifier.

An embodiment wherein the NPC has a working voltage in the range of 370 volts to 440 volts, An embodiment wherein the NPC comprises a dual capacitance structure having COMMON (C), FAN (F), and HERMETICALLY SEALED COMPRESSOR (HERM) connections.

An embodiment wherein the NPC has a capacitance in the range of 1 microfarad to 100 microfarads.

An embodiment wherein the NPC comprises an enclosure selected from a group consisting of: a cylindrical-shaped exterior surface; and a stadium-shaped exterior surface.

An embodiment wherein the TVS is selected from a group consisting of: metal oxide varistor (MOV); diode for alternating current (DIAC); and silicon diode for alternating current (SIDAC).

One skilled in the art will recognize that other embodiments are possible based on combinations of elements taught within the above invention description.

CONCLUSION

A protected capacitor system/method implementing enhanced transient over-voltage suppression has been disclosed. The system/method incorporates one or more surge suppression devices (SSDs) proximally located and in parallel with a capacitor structure to produce an overall protected capacitor structure having enhanced reliability and simultaneous ability to resist transient overvoltage conditions. The SSDs are formed from series combinations of transient voltage surge suppressors (TVSs) (metal oxide varistor (MOV), diode for alternating current (DIAC), and/or silicon diode for alternating current (SIDAC)) and corresponding shunt diode rectifiers (SDRs) and placed in parallel across a capacitor structure to locally suppress voltage transients across the capacitor structure in excess of the voltage rating of the capacitor structure. The parallel shunting TVS/SDR pairs may be integrated into a printed circuit board (PCB) assembly that is externally attached to the capacitor structure or encapsulated in an enclosure incorporating the capacitor structure.

What is claimed is:

1. A protected capacitor system comprising:
   (a) capacitor enclosure (CPE);
   (b) capacitor cover (CPC);
   (c) non-polarized capacitor (NPC);
   (d) printed circuit board (PCB);
   (e) transient voltage surge suppressor (TVS); and
   (f) semiconductor P-N diode (PND);
   wherein:
     said CPE is configured as a shell having an open cavity end (OCE) and an open cavity void (OCV) configured to contain said NPC and said PCB;
     said CPC is configured to cover and seal said OCE;
     said NPC and said PCB are contained within said OCV;
     said CPC comprises a first terminal connection (FTC) and a second terminal connection (STC);
     said FTC and said STC are insulated from said CPC and extend through an outer surface of said CPC;
     said NPC comprises a first capacitor connection (FCC) and a second capacitor connection (SCC);
     said TVS comprises a first TVS connection (FVC) and a second TVS connection (SVC);
     said PND comprises a first PND connection (FPC) and a second PND connection (SPC);
     said SVC is electrically coupled to said FPC via metal traces on said PCB;
     said TVS and said PND form a surge suppression device (SSD) having a first SSD terminal (FDC) electrically coupled to said FVC and a second SSD terminal (SDC) electrically coupled to said SPC;
     said PCB comprises a first input connection (FIC), a second input connection (SIC), a first output connection (FOC), and a second output connection (SOC);
     said PCB comprises metal traces configured to electrically couple said FTC, said FIC, said FOC, and said FDC;
     said PCB comprises metal traces configured to electrically couple said STC, said SIC, said SOC, and said SDC;
     said FCC is electrically coupled to said FOC; and
     said SCC is electrically coupled to said SOC.

2. The protected capacitor system of claim 1 wherein said FTC comprises a male spade lug connector and said STC comprises a male spade lug connector.

3. The protected capacitor system of claim 1 wherein said FIC comprises a male spade lug connector, said SIC comprises a male spade lug connector, said FOC comprises a female spade lug connector, and said SOC comprises a female spade lug connector.

4. The protected capacitor system of claim 1 wherein said SSD further comprises parallel connection to a second metal oxide varistor (SMV) and a second semiconductor P-N diode (SPN) that are connected in series wherein said parallel connection of said series connected SIVIV and said SPN such that said SPN is in an opposite polarity orientation to the orientation of said series connection of said PND and said TVS within said SSD.

5. The protected capacitor system of claim 1 wherein said PND comprises a Schottky diode rectifier.

6. The protected capacitor system of claim 1 wherein said NPC has a working voltage in the range of 370 volts to 440 volts.

7. The protected capacitor system of claim 1 wherein said NPC comprises a dual capacitance structure having COMMON (C), FAN (F), and HERMETICALLY SEALED COMPRESSOR (HERM) connections.

8. The protected capacitor system of claim 1 wherein said NPC has a capacitance in the range of 1 microfarad to 100 microfarads.

9. The protected capacitor system of claim 1 wherein said CPE comprises an enclosure selected from a group consisting of: a cylindrical-shaped exterior surface; and a stadium-shaped exterior surface.

10. The protected capacitor system of claim 1 wherein said TVS is selected from a group consisting of: metal oxide varistor (MOV); diode for alternating current (Dl AC); and silicon diode for alternating current (SIDAC).

11. A protected capacitor method wherein said method utilizes protected capacitor system comprising:

(a) capacitor enclosure (CPE);
(b) capacitor cover (CPC);
(c) non-polarized capacitor (NPC);
(d) printed circuit board (PCB);
(e) transient voltage surge suppressor (TVS); and
(f) semiconductor P-N diode (PND);
wherein:
   said CPE is configured as a shell having an open cavity end (OCE) and an open cavity void (DCV) configured to contain said NPC and said PCB;
   said CPC is configured to cover and seal said OCE;
   said NPC and said PCB are contained within said OCV;
   said CPC comprises a first terminal connection (FTC) and a second terminal connection (STC);
   said FTC and said STC are insulated from said CPC and extend through an outer surface of said CPC;
   said NPC comprises a first capacitor convection (FCC) and a second capacitor connection (SCC);
   said TVS comprises a first TVS connection (FVC) and a second TVS connection (SVC);
   said PND comprises a first PND connection (FPC) and a second PND connection (SPC);
   said SVC is electrically coupled to said FPC via metal traces on said PCB;
   said TVS and said PND form a surge suppression device (SSD) having a first SSD terminal (FDC) electrically coupled to said FVC and a second SSD terminal (SDC) electrically coupled to said SPC;
   said PCB comprises a first input connection (FIC), a second input connection (SIC), a first output connection (FOC), and a second output connection (SOC);
   said PCB comprises metal traces configured to electrically couple said FTC, said FIC, said FOC, and said FDC;
   said PCB comprises metal traces configured to electrically couple said STC, said SIC, said SOC, and said SDC;
   said FCC is electrically coupled to said FOC; and
   said SCC is electrically coupled to said SOC;
with said method comprising the steps of:
   (1) placing said NPC, said PCB, and said SSD within said CPE;
   (2) covering said OCE of said CPE with said CPC and sealing said CPC to said CPE;
   (3) configuring said CPC to electrically couple said FTC to a source of electrical power; and
   (4) configuring said CPC to electrically couple said STC to an electrical load device.

12. The protected capacitor method of claim 11 wherein said FTC comprises a male spade lug connector and said STC comprises a male spade lug connector.

13. The protected capacitor method of claim 11 wherein said FIC comprises a male spade lug connector, said SIC comprises a male spade lug connector, said FOC comprises a female spade lug connector, and said SOC comprises a female spade lug connector.

14. The protected capacitor method of claim 11 wherein said SSD further comprises parallel connection to a second metal oxide varistor (SMV) and a second semiconductor P-N diode (SPN) that are connected in series wherein said parallel connection of said series connected SMV and said SEN such that said SPN is in an opposite polarity orientation to the orientation of said series connection of said PND and said TVS within said SSD.

15. The protected capacitor method of claim 11 wherein said PND comprises a Schottky diode rectifier.

16. The protected capacitor method of claim 11 wherein said NPC has a working voltage in the range of 370 volts to 440 volts.

17. The protected capacitor method of claim 11 wherein said NPC comprises a dual capacitance structure having COMMON (C), FAN (F), and HERMETICALLY SEALED COMPRESSOR (HERM) connections.

18. The protected capacitor method of claim 11 wherein said NPC has a capacitance in the range of 1 microfarad to 100 microfarads.

19. The protected capacitor method of claim 11 wherein said CPE comprises an enclosure selected from a group consisting of a cylindrical-shaped exterior surface; and a stadium-shaped exterior surface.

20. The protected capacitor method of claim 11 wherein said TVS is selected from a group consisting of: metal oxide varistor (MOV); diode for alternating current (DIAC); and silicon diode for alternating current (SIDAC).

* * * * *